United States Patent
Fujimori

(10) Patent No.: US 7,435,527 B2
(45) Date of Patent: Oct. 14, 2008

(54) POSITIVE RESIST COMPOSITION

(75) Inventor: Toru Fujimori, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/867,634

(22) Filed: Jun. 16, 2004

(65) Prior Publication Data

US 2004/0253538 A1  Dec. 16, 2004

(30) Foreign Application Priority Data

Jun. 16, 2003  (JP) ............................ P.2003-171063

(51) Int. Cl.
G03F 7/00 (2006.01)
G03F 7/004 (2006.01)

(52) U.S. Cl. .................. 430/270.1; 430/281.1

(58) Field of Classification Search .............. 430/270.1, 430/281.1
See application file for complete search history.

(56) References Cited

U.S. PATENT DOCUMENTS

| | | | |
|---|---|---|---|
| 4,491,628 A | | 1/1985 | Ito et al. |
| 5,609,982 A * | | 3/1997 | Sato et al. ............... 430/192 |
| 5,639,587 A * | | 6/1997 | Sato et al. ............... 430/190 |
| 5,849,461 A * | | 12/1998 | Hatakeyama et al. .... 430/281.1 |
| 5,939,234 A * | | 8/1999 | Yamanaka et al. ....... 430/270.1 |
| 5,981,140 A * | | 11/1999 | Sato et al. ............... 430/270.1 |
| 6,022,665 A * | | 2/2000 | Watanabe et al. ........ 430/270.1 |
| 6,511,785 B1 * | | 1/2003 | Takemura et al. ........ 430/270.1 |
| 6,593,056 B2 * | | 7/2003 | Takeda et al. ............. 430/170 |
| 6,777,158 B2 * | | 8/2004 | Maemori et al. ......... 430/270.1 |
| 6,818,380 B2 * | | 11/2004 | Maemori et al. ......... 430/270.1 |
| 7,214,465 B2 * | | 5/2007 | Nakao et al. ............. 430/170 |
| 2001/0035394 A1 * | | 11/2001 | Takeda et al. ............... 216/41 |
| 2002/0045133 A1 * | | 4/2002 | Maemori et al. ........... 430/311 |
| 2002/0058202 A1 * | | 5/2002 | Maemori et al. ......... 430/270.1 |
| 2002/0106580 A1 * | | 8/2002 | Nitta et al. .............. 430/270.1 |
| 2004/0067615 A1 * | | 4/2004 | Maemori et al. ........... 438/200 |
| 2004/0166433 A1 * | | 8/2004 | Dammel et al. ............ 430/176 |
| 2004/0166434 A1 * | | 8/2004 | Dammel et al. ......... 430/270.1 |
| 2005/0037291 A1 * | | 2/2005 | Nitta et al. ............... 430/330 |
| 2005/0170276 A1 * | | 8/2005 | Nitta et al. ............. 430/270.1 |

FOREIGN PATENT DOCUMENTS

| | | | |
|---|---|---|---|
| JP | 2-161436 A | | 6/1990 |
| JP | 5-232406 A | | 9/1993 |
| JP | 2002091001 A | * | 3/2002 |

OTHER PUBLICATIONS

English language machine translation of JP 2002-091001.*

* cited by examiner

Primary Examiner—Amanda C. Walke
(74) Attorney, Agent, or Firm—Sughrue Mion, PLLC

(57) ABSTRACT

A positive resist composition comprising (A) a compound that generates an acid upon irradiation of an actinic ray or radiation, (B) a resin that is insoluble or hardly soluble in an alkali developing solution but becomes soluble in the alkali developing solution by the action of an acid, and (C) a compound having at least one group that is decomposed with an acid to generate a carboxylic acid and at least three groups selected from hydroxy group and substituted hydroxy group.

8 Claims, No Drawings

POSITIVE RESIST COMPOSITION

FIELD OF THE INVENTION

The present invention relates to a positive resist composition for use in the production process of semiconductor devices, for example, IC, in the production of circuit substrates for liquid crystals or thermal heads, or in other photofabrication processes. More specifically, the invention pertains to a positive resist composition suitable for use a far ultraviolet ray of not more than 250 nm or an electron beam, as a light source for exposure.

BACKGROUND OF THE INVENTION

In Patent Document 1 (U.S. Pat. No. 4,491,628), a chemically amplified resist composition, which contains an acid generator and a polymer protected with an acid-decomposable group, and in which an acid is generated in the irradiated area upon irradiation with radiation, for example, a far ultraviolet ray, and solubility in a developing solution between the irradiated area and unirradiated area is differentiated by a reaction using the acid as a catalyst, whereby a pattern is formed on a substrate, is described.

In Patent Document 2 (JP-A-2-161436 (the term "JP-A" as used herein means an "unexamined published Japanese patent application")), a resist composition containing a PHS resin protected with an alkoxyalkoxy (acetal) group, a triazine photo-acid generator and an amine is described.

Also, in Patent Document 3 (JP-A-5-232706), a resist composition containing a PHS resin protected with an acid-decomposable group, a photo-acid generator and a nitrogen-containing basic compound is described.

However, conventional resist compositions have problems in line edge roughness and development residue (scum) and thus, improvements thereof have been requested.

The term "line edge roughness" as used herein means a phenomenon wherein an edge between a line pattern of resist and a surface of substrate irregularly fluctuates in the direction vertical to the line due to the characteristics of resist. When the pattern is observed from just above, the edge is uneven (approximately from ± several nm to several dozen nm). Since the unevenness is transferred to the substrate in an etching step, the unevenness causes a defect in electric properties thereby resulting in yield reduction.

Patent Document 1: U.S. Pat. No. 4,491,628
Patent Document 2: JP-A-2-161436
Patent Document 3: JP-A-5-232706

SUMMARY OF THE INVENTION

An object of the present invention is to provide a positive resist composition, which is excellent in the line edge roughness and has less formation of the scum.

Other objects of the invention will become apparent from the following description.

The above objects of the invention can be achieved by the positive resist composition having the following constitution.

(1) A positive resist composition comprising (A) a compound that generates an acid upon irradiation of an actinic ray or radiation, (B) a resin that is insoluble or hardly soluble in an alkali developing solution but becomes soluble in the alkali developing solution by the action of an acid, and (C) a compound having at least one group that is decomposed with an acid to generate a carboxylic acid and at least three groups selected from hydroxy group and substituted hydroxy group.

The present invention includes the following preferred embodiments.

(2) The positive resist composition as described in (1) above, wherein the resin (B) is a resin that is insoluble or hardly soluble in an alkali developing solution but becomes soluble in the alkali developing solution by the action of an acid and has at least one phenolic hydroxy group structure.

(3) The positive resist composition as described in (1) above, wherein the resin (B) is a resin that is insoluble or hardly soluble in an alkali developing solution but becomes soluble in the alkali developing solution by the action of an acid and has a monocyclic or polycyclic alicyclic hydrocarbon structure.

(4) The positive resist composition as described in (1) above, wherein the resin (B) is a resin that is insoluble or hardly soluble in an alkali developing solution but becomes soluble in the alkali developing solution by the action of an acid and has a structure substituted with a fluorine atom in the main chain and/or side chain of a polymer skeleton.

(5) The positive resist composition as described in any one of (1) to (4) above, wherein the positive resist composition further comprises (D) a fluorine-based and/or silicon-based surfactant.

(6) The positive resist composition as described in any one of (1) to (5) above, wherein the positive resist composition further comprises (E) a mixed solvent comprises a hydroxy group-containing solvent and a solvent free from a hydroxy group.

DETAILED DESCRIPTION OF THE INVENTION

The positive resist composition of the invention will be described in detail below.

With respect to the description of a group (atomic group) in the specification, the term "group", which is not particularly referred to whether it is substituted or not, means and includes both unsubstituted and substituted groups. For example, the description of an "alkyl group" means and includes an alkyl group having no substituent (unsubstituted alkyl group) and an alkyl group having a substituent (substituted alkyl group).

<<(A) Compound that Generates an Acid Upon Irradiation of an Actinic Ray or Radiation>>

The compound that generates an acid upon irradiation of an actinic ray or radiation (hereinafter, also referred to as an "acid generator") for use in the positive resist composition of the invention will be described below.

The acid generator, which can be used in the invention is appropriately selected from photoinitiators for photo-cationic polymerization, photoinitiators for photo-radical polymerization, photo-achromatic agents for dyes, photo-discoloring agents, known compounds capable of generating an acid upon irradiation of an actinic ray or radiation used for micro resists or the like, and mixtures thereof.

Examples of the acid generator include onium salts, for example, diazonium salts, ammonium salts, phosphonium salts, iodonium salts, sulfonium salts, selenonium salts or arsonium salts, organic halogen compounds, organic metal/organic halide compounds, acid generators having an o-nitrobenzyl protecting group, compounds generating a sulfonic acid by photolysis as represented by iminosulfonates, and disulfone compounds.

It is also possible to use polymer compounds having in the main chain or side chain thereof a group or compound capable of generating an acid upon irradiation of an actinic ray or radiation, for example, compounds as described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Compounds generating an acid by light as described, for example, in U.S. Pat. No. 3,779,778 and European Patent 126,712 are also used.

Of the above-described compounds used in the invention, which are decomposed upon irradiation of an active ray or radiation to generate an acid, those particularly effectively employed are described below.

(1) Iodonium salt represented by formula (PAG3) shown below and sulfonium salt represented by formula (PAG4) shown below.

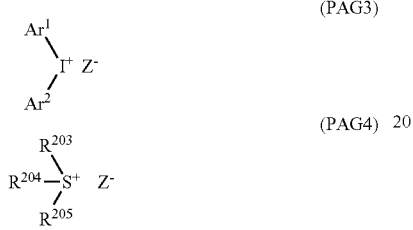

wherein $Ar^1$ and $Ar^2$ each independently represent a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$ each independently represent a substituted or unsubstituted alkyl group or a substituted or unsubstituted aryl group, and preferably an aryl group having from 6 to 14 carbon atoms, an alkyl group having 1 to 8 carbon atoms or a substituted derivative thereof.

Preferred examples of the substituent for the aryl group include an alkoxy group having from 1 to 8 carbon atoms, an alkyl group having from 1 to 8 carbon atoms, a nitro group, a carboxy group, a hydroxy group and a halogen atom. Preferred examples of the substituent for the alkyl group include an alkoxy group having from 1 to 8 carbon atoms, a carboxy group and an alkoxycarbonyl group.

$Z^-$ represents a counter anion. Examples the counter anion include $BF_4^-$, $AsF_6^-$, $PF_6^-$, $SbF_6^-$, $SiF_6^{2-}$, $ClO_4^-$, a perfluoroalkane sulfonic acid anion, e.g., $CF_3SO_3^-$, pentafluolobenzenesulfonic acid anion, a condensed polynuclear aromatic sulfonic acid anion, e.g., naphthalene-1-sulfonic acid anion, an anthraquinonesulfonic acid anion and a dye containing a sulfonic acid group. However, the invention should not be construed as being limited to these examples.

Alternatively, two of $R^{203}$, $R^{204}$ and $R^{205}$ or $Ar^1$ and $Ar^2$ may be connected to each other through a single bond or a substituent.

Specific examples of the compound are set forth below, but the invention should not be construed as being limited thereto.

Diphenyliodinium dodecylbenzenesulfonate, diphenyliodinium trifluoromethanesulfonate, bis(4-trifluoromethylphenyl)iodonium trifluoromethanesulfonate, bis(4-tert-butylphenyl)iodonium camphorsulfonate, triphenylsulfonium dodecylbenzenesulfonate, triphenylsulfonium 2,4,6-trimethylbenzenesulfonate, triphenylsulfonium 2,4,6-triisopropylbenzenesulfonate, triphenylsulfonium trifluoromethanesulfonate, triphenylsulfonium perfluorooctanesulfonate, triphenylsulfonium perfluorononanesulfonate, triphenylsulfonium camphorsulfonate, triphenylsulfonium perfluorobenzenesulfonate and triphenylsulfonium 3,4-bis(trifluoromethyl)benzenesulfonate.

The onium salts represented by formulae (PAG3) and (PAG4) are known, and can be synthesized by methods as described, for example, in U.S. Pat. Nos. 2,807,648 and 4,247,473 and JP-A-53-101331.

(2) Disulfone derivative represented by formula (PAG5) shown below and iminosulfonate derivative represented by formula (PAG6) shown below.

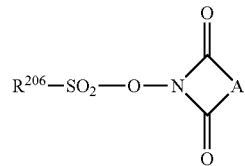

wherein, $Ar^3$ and $Ar^4$ each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or. unsubstituted alkenylene group or a substituted or unsubstituted arlenylene group.

Specific examples of the compound are set forth below, but the invention should not be construed as being limited thereto.

Bis(tolyl)disulfone, bis(4-methoxyphenyl)disulfone, bis(4-trifluoromethylphenyl)disulfone, phenyl-4-isopropylphenyldisulfone,

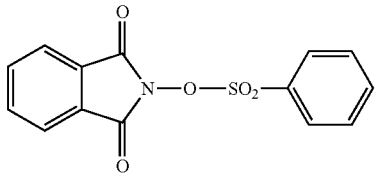

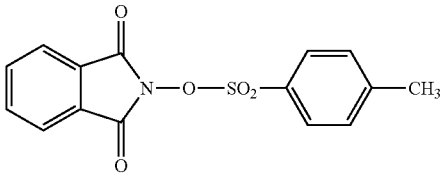

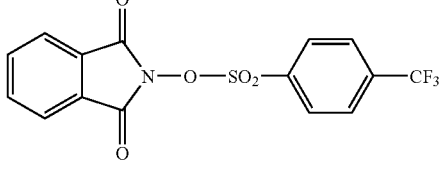

(3) Diazodisulfone derivative represented by formula (PAG7) shown below.

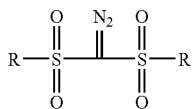
(PAG7)

wherein, R represents a straight chain, branched or cyclic alkyl group or an aryl group which may have a substituent.

Specific examples of the compound are set forth below, but the invention should not be construed as being limited thereto.

Bis(phenylsulfonyl)diazomethane, bis(2,4-dimethylphenylsulfonyl)diazomethane, bis(cyclohexylsulfonyl)diazomethane, bis(trisulfonyl)diazomethane and bis(tert-butylsulfonyl)diazomethane.

(4) Also, a phenacylsulfonium derivative represented by formula (I) shown below is used as the acid generator (B).

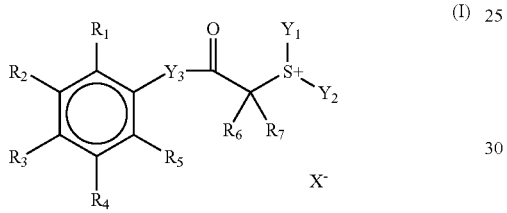
(I)

In formula (I), $R_1$ to $R_5$ each represent a hydrogen atom, an alkyl group, an alkoxy group, a nitro group, a halogen atom, an alkyloxycarbonyl group or an aryl group, or at least two of $R_1$ to $R_5$ may be connected to each other to form a ring structure.

$R_6$ and $R_7$ each represent a hydrogen atom, an alkyl group, a cyano group or an aryl group.

$Y_1$ and $Y_2$ each represent an alkyl group, an aryl group, an aralkyl group or an aromatic group containing a hetero atom, or $Y_1$ and $Y_2$ may be connected to each other to form a ring.

$Y_3$ represents a single bond or a divalent connecting group.

$X^-$ represents a non-nucleophilic anion.

At least one of $R_1$ to $R_5$ and at least $Y_1$ and $Y_2$ may be connected to each other to form a ring. At least one of $R_1$ to $R_5$ and at least $R_6$ and $R_7$ may be connected to each other to form a ring.

A compound including two or more structures represented by formula (I) combining through a connecting group at any one of $R_1$ to $R_7$, $Y_1$ and $Y_2$ may also be used.

Specific examples of the compound represented by formula (I) are set forth below, but the invention should not be construed as being limited thereto.

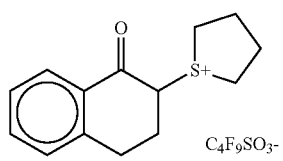
(I-1)

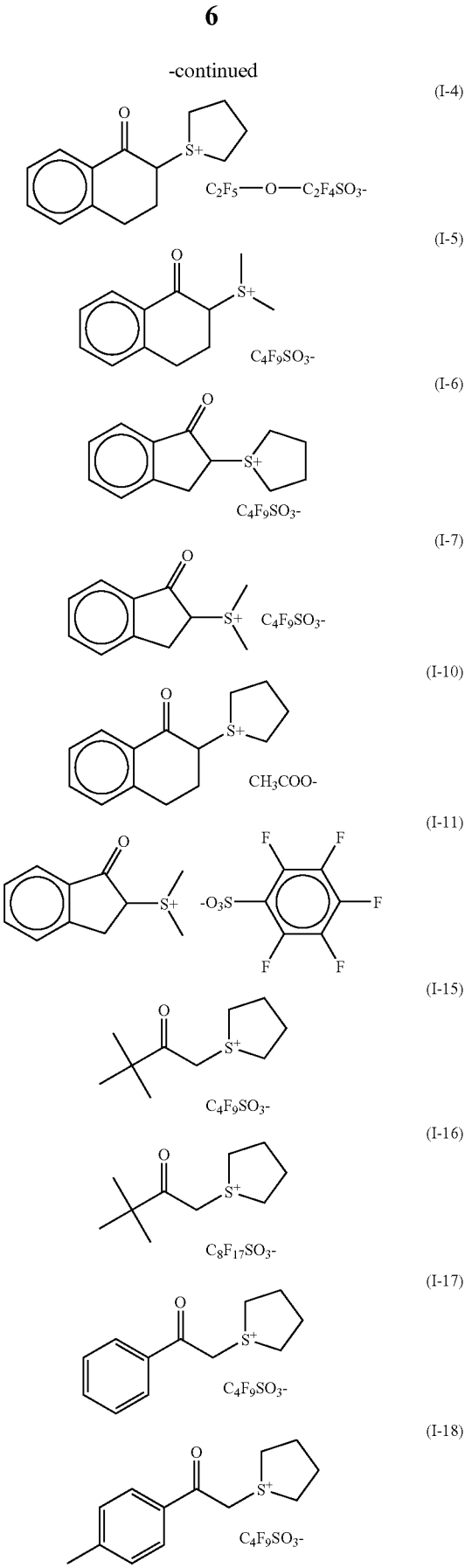

-continued
(I-22)
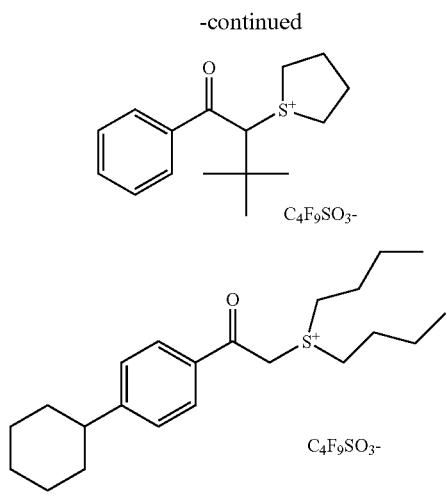
(I-24)
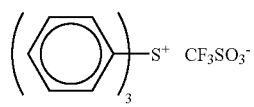
(I-25)
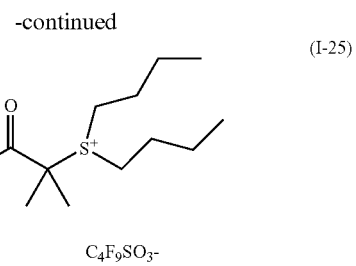
Of the compounds that are decomposed upon irradiation of an actinic ray or radiation to generate an acid, those particularly preferred are set forth below.
(z1)
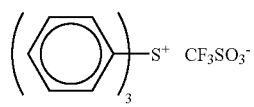
(z2)
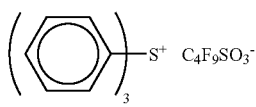
(z3)
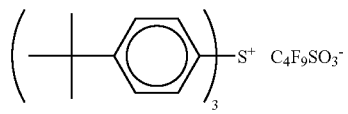
(z4)
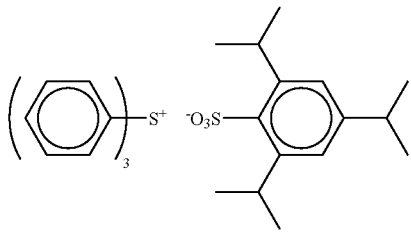
(z5)
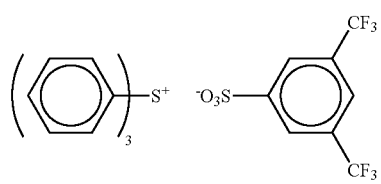
(z6)
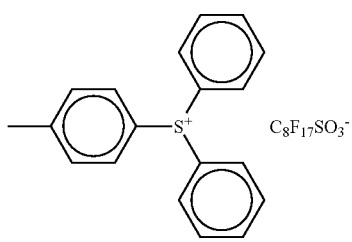
(z7)
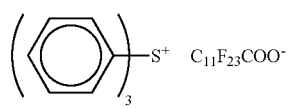
(z8)
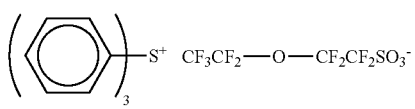
(z10)
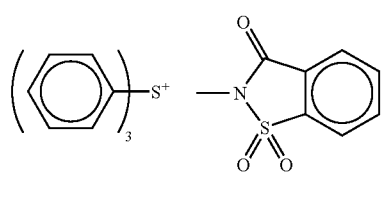
(z11)
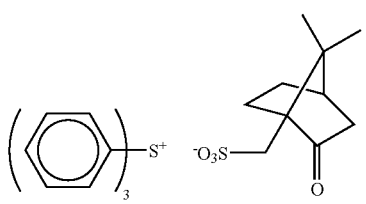

-continued
(z12) 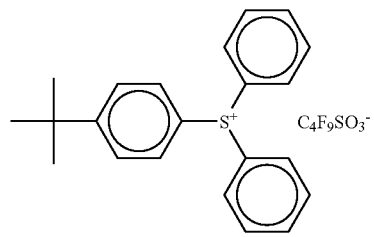
(z13) 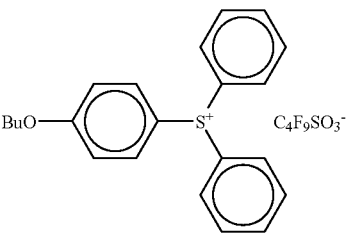
(z14) 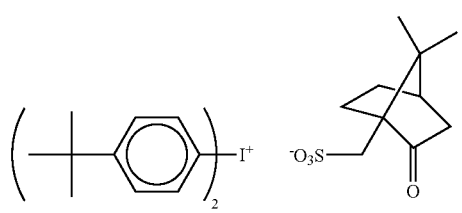
(z15) 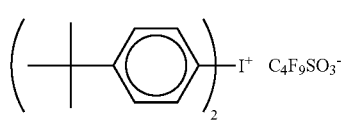
(z16) 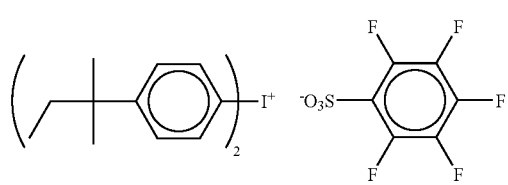
(z17) 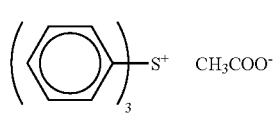
(z18) 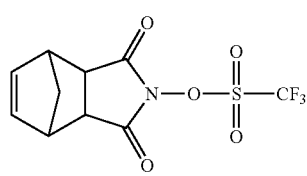
(z19) 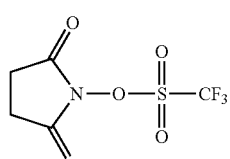
(z20) 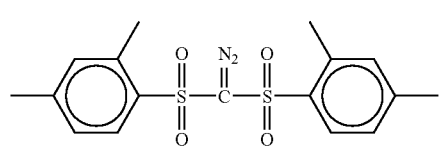
(z21) 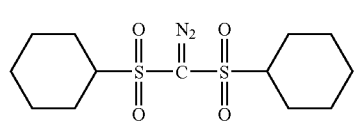
(z22) 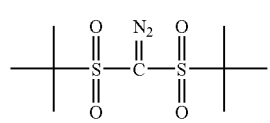
(z23) 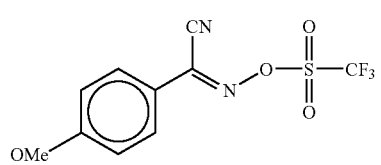
(z24) 
(z25) 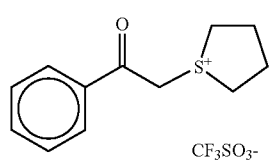
(z26) 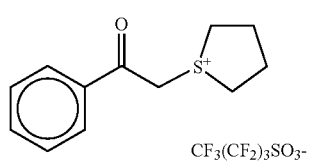

-continued
(z27)
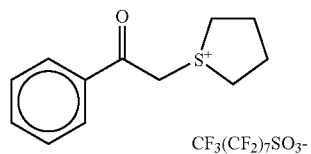
(z28)
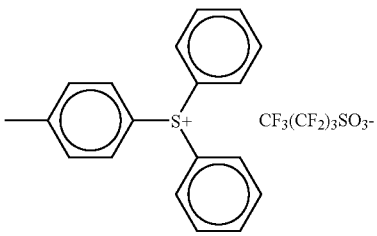
(z29)
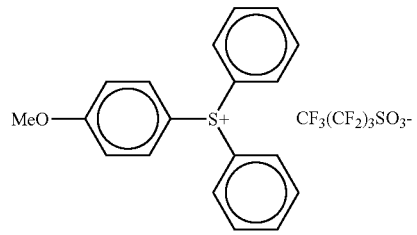
(z30)
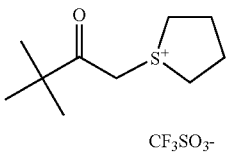
(z31)
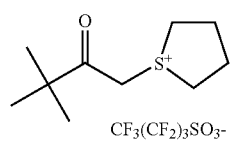
(z32)
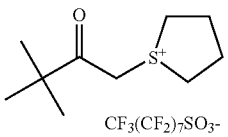
(z33)
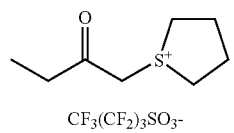
(z34)
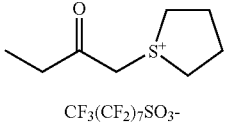
(z35)
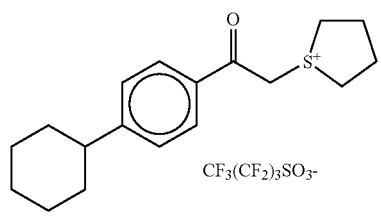
(z36)
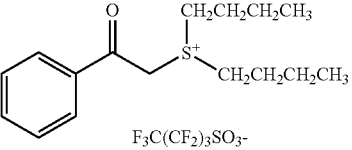
(z37)
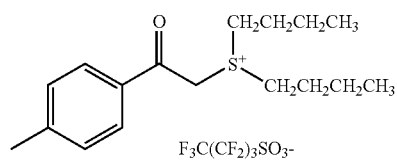
(z38)
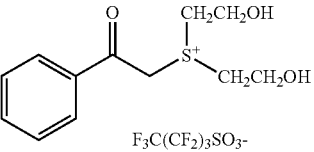
(z39)
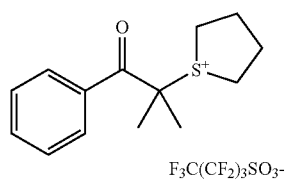
(z40)
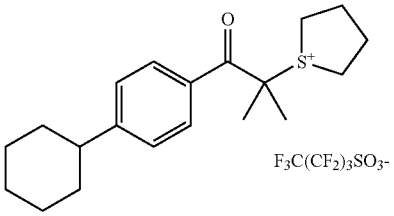
(z41)
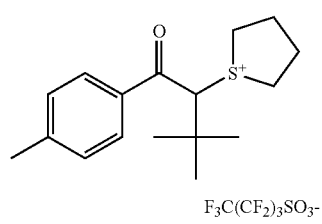
(z42)

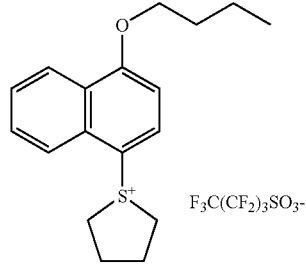

The compounds of Component (A) may be used individually or in combination of two or more thereof.

A content of the compound of Component (A) in the positive resist composition of the invention is preferably from 0.1 to 20% by weight, more preferably from 0.5 to 10% by weight, and still more preferably from 1 to 7% by weight, based on the solid content of the composition.

<<(B) Resin that is Insoluble or Hardly Soluble in an Alkali Developing Solution but Becomes Soluble in the Alkali Developing Solution by the Action of an Acid (Hereinafter Also Referred to as an "Acid-decomposable Resin")>>

The acid-decomposable resin (B) for use in the positive resist composition of the invention may be any resin that that is insoluble or hardly soluble in an alkali developing solution but becomes soluble in the alkali developing solution by the action of an acid in case of conducting exposure with KrF light or electron beam. A functional group for an alkali-soluble portion is preferably a phenolic hydroxy group or a carboxy group.

The resin that is insoluble or hardly soluble in an alkali developing solution but becomes soluble in the alkali developing solution by the action of an acid and has a phenolic hydroxy group structure includes preferably a resin containing at least a p-hydroxystyrene unit, and more preferably poly-p-hydroxystyrene wherein the hydroxy groups are partially protected with groups capable of being decomposed with an acid, a copolymer of p-hydroxystyrene and tert-butyl acrylate, and derivatives thereof.

For example, the resins described below can be employed.

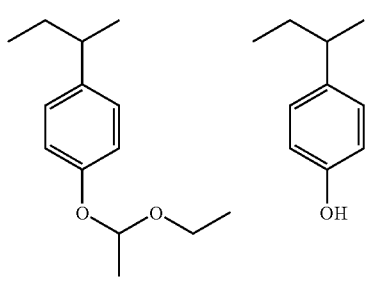

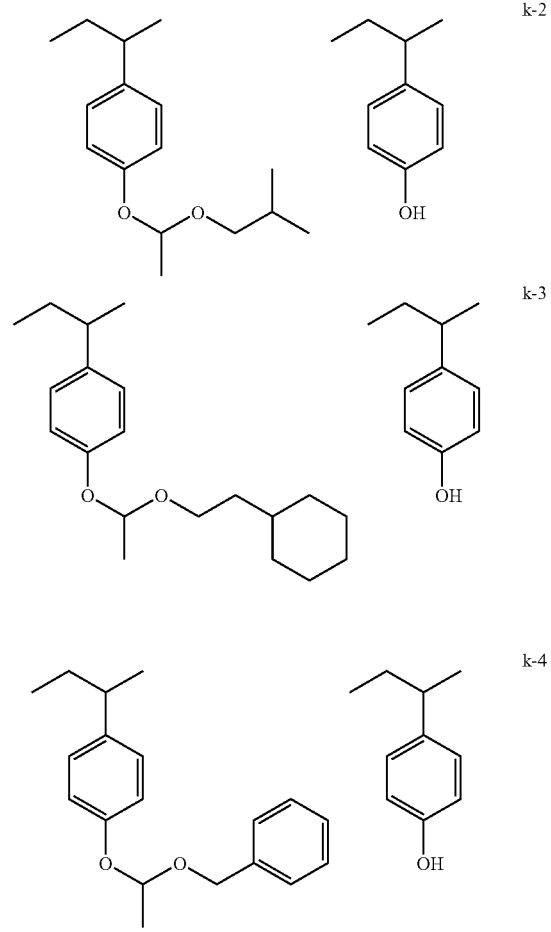

-continued
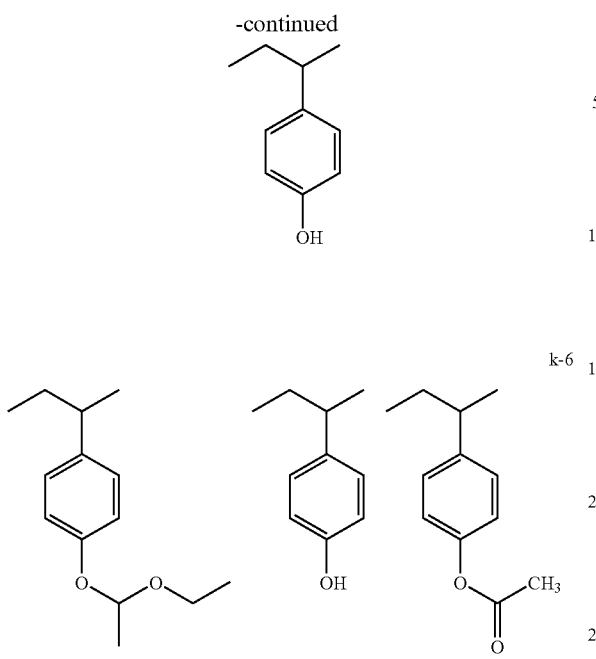
k-6
k-7
k-8
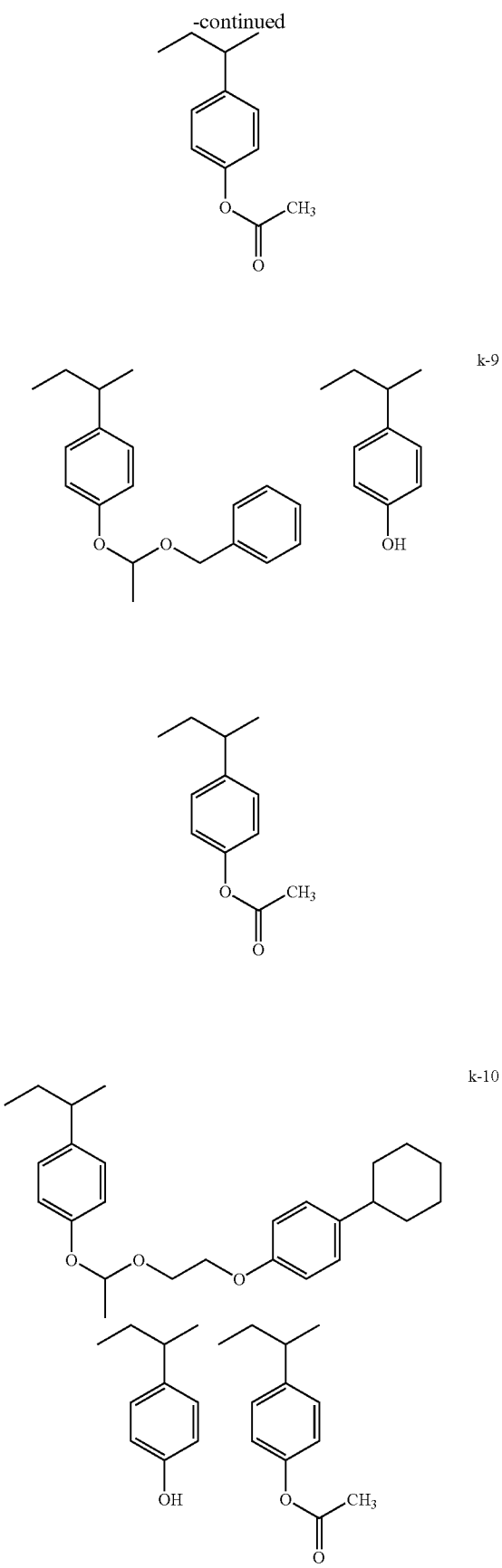
k-9
k-10

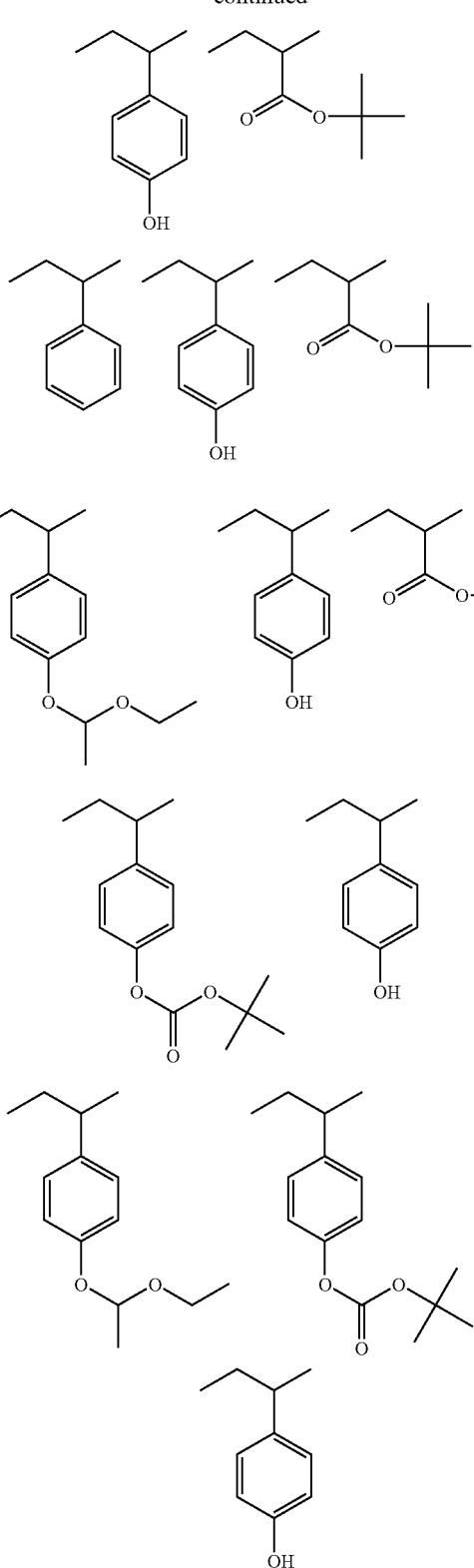

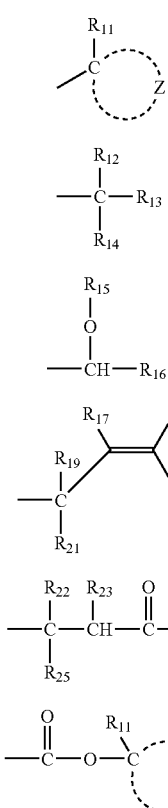

Examples of the repeating unit having a group capable of being decomposed with an acid in the above resins include tert-butoxycarbonyloxystyrene, 1-alkoxyethoxystyrene and a tertiary ester of (meth)acrylic acid.

A content of the group capable of being decomposed with an acid is defined by a formula B/(B+S) wherein B represents a number of the group capable of being decomposed with an acid and S represents a number of alkali-soluble group that is not protected with the group capable of being decomposed with an acid. The content is preferably from 0.01 to 0.7, more preferably from 0.05 to 0.50, and still more preferably from 0.05 to 0.40.

Of the acid-decomposable resins (B) according to the invention, a resin that is insoluble or hardly soluble in an alkali developing solution but becomes soluble in the alkali developing solution by the action of an acid and has a monocyclic or polycyclic alicyclic hydrocarbon structure, in case of conducting exposure with ArF light. A resin containing at least one repeating unit selected from a repeating unit having a partial structure including an alicyclic hydrocarbon represented by formulae (pI) to (pVI) described below and a repeating unit represented by formula (II-AB) described below is more preferred.

In the above formulae, $R_{11}$ represents a methyl group, an ethyl group, an n-propyl group, an isopropyl group, an n-butyl group, an isobutyl group or a sec-butyl group; and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and that either $R_{19}$ or $R_{21}$ represents a straight chain or branched alkyl group having from 1 to 4 carbon atoms or an alicyclic hydrocarbon group.

$R_{22}$ to $R_{25}$ each independently represent a hydrogen atom, a straight chain or branched alkyl group having from 1 to 4 carbon atoms or an alicyclic hydrocarbon group, provided that at least one of $R_{22}$ to $R_{25}$ represents an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

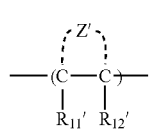

(II-AB)

In formula (II-AB), $R_{11}'$ and $R_{12}'$ each independently represent a hydrogen atom, a cyano group, a halogen atom or an alkyl group, which may have a substituent.

Z' represents an atomic group necessary for forming an alicyclic structure, which may have a substituent, together with the connected two carbon atoms (C-C).

Of the repeating units represented by formula (II-AB), those represented by formulae (II-A) and (II-B) shown below are more preferred.

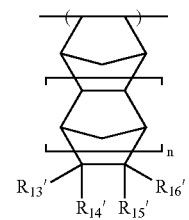

(II-A)

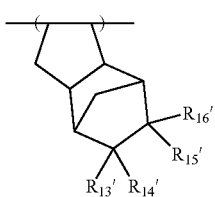

(II-B)

In formulae (II-A) and (II-B), $R_{13}'$ to $R_{16}'$ each independently represent a hydrogen atom, a halogen atom, a cyano group, —COOH, —COOR$_5$, a group capable of being decomposed by the action of an acid, —C(=O)—X-A'-R$_{17}'$, an alkyl group which may have a substituent or a cyclic hydrocarbon group which may have a substituent.

$R_5$ represents an alkyl group, which may have a substituent, a cyclic hydrocarbon group, which may have a substituent or a group represented by Y described below.

X represents an oxygen atom, a sulfur atom, —NH—, —NHSO$_2$— or —NHSO$_2$NH—.

A' represents a single bond or a divalent linking group.

Alternatively, at least two of $R_{13}'$ to $R_{16}'$ may be combined with each other to form a ring. n represents 0 or 1.

$R_{17}'$ represents —COOH, —COOR$_5$, a cyano group, a hydroxy group, an alkoxy group, which may have a substituent, —CO—NH—R$_6$, —CO—NH—SO$_2$—R$_6$ or a group represented by Y described below.

$R_6$ represents an alkyl group, which may have a substituent or a cyclic hydrocarbon group, which may have a substituent.

The group represented by Y has the following structure:

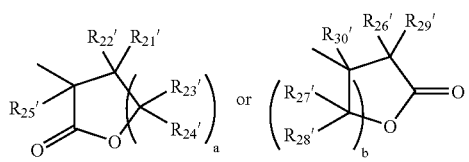

wherein $R_{21}'$ to $R_{30}'$ each independently represent a hydrogen atom or an alkyl group, which may have a substituent; and a and b each represent 1 or 2.

In formulae (pI) to (pVI), the alkyl group for $R_{12}$ to $R_{25}$ includes a straight chain or branched alkyl group having from 1 to 4 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclo, bicyclo, tricyclo or tetracyclo structure. The number of carbon atoms included is preferably from 6 to 30, and particularly preferably from 7 to 25. The alicyclic hydrocarbon group may have a substituent.

Examples of the structure of alicyclic portion in the alicyclic hydrocarbon group are set forth below.

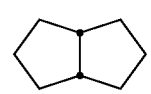

(1)

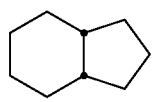

(2)

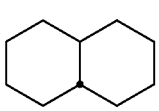

(3)

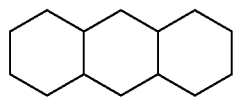

(4)

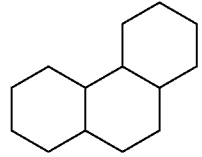

(5)

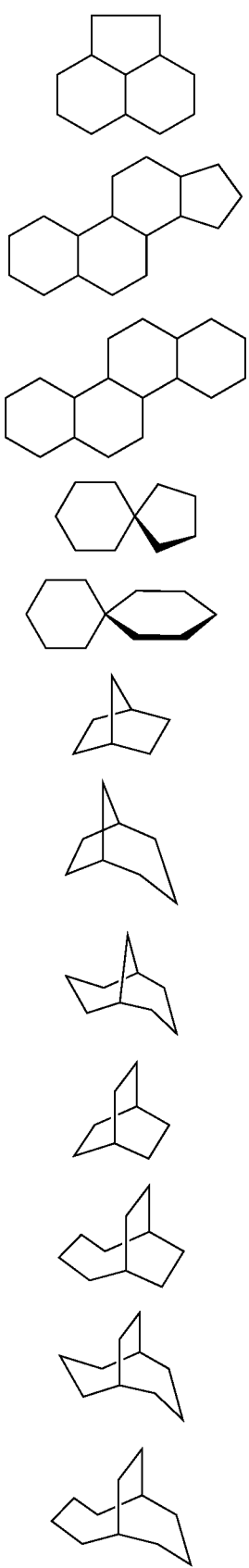
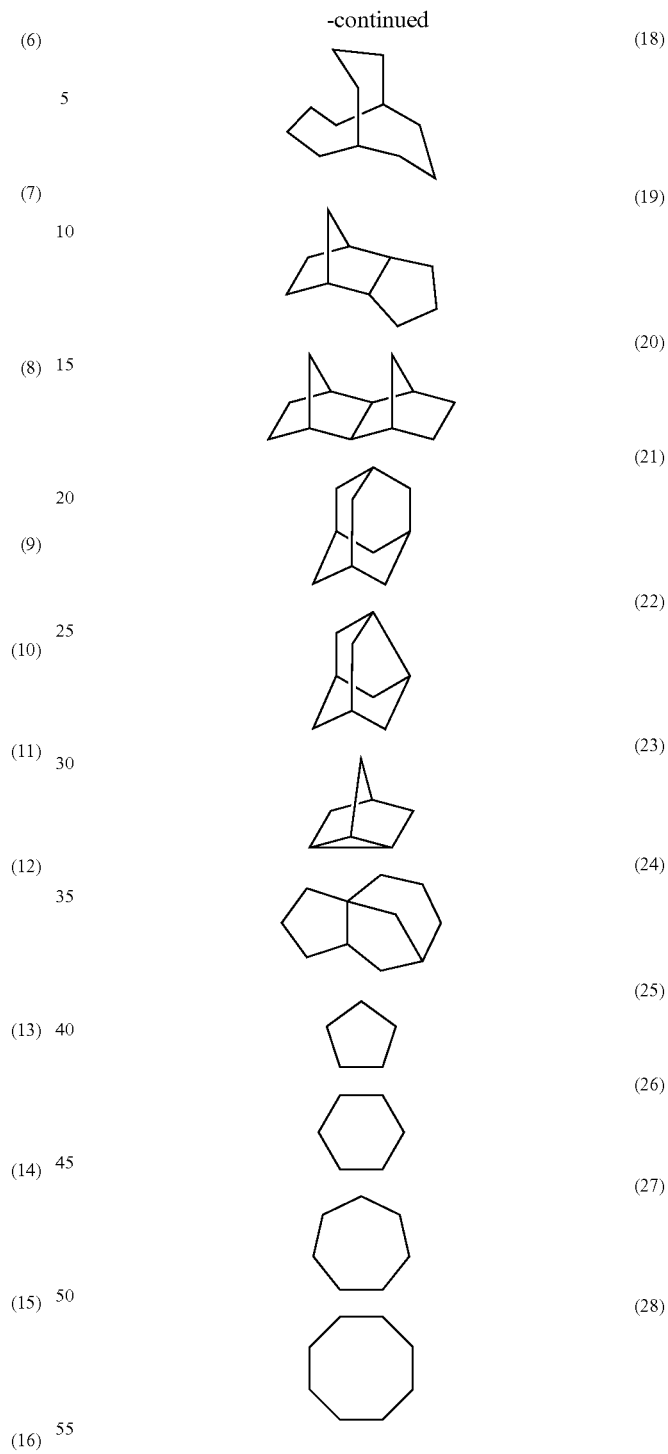

Preferred examples of the alicyclic portion for use in the invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The structure represented by any one of formulae (pI) to (pVI) in the resin can be used for protecting an alkali-soluble group. The alkali-soluble group includes various groups known in the field of art.

Specific examples of the alkali-soluble group include a carboxylic acid group, a sulfonic acid group, a phenol group and a thiol group, and a carboxylic acid group and a sulfonic acid group are preferably used.

The alkali-soluble group protected by the structure represented by any one of formulae (pI) to (pVI) in the resin preferably includes groups represented by the following formulae (pVII) to (pXI):

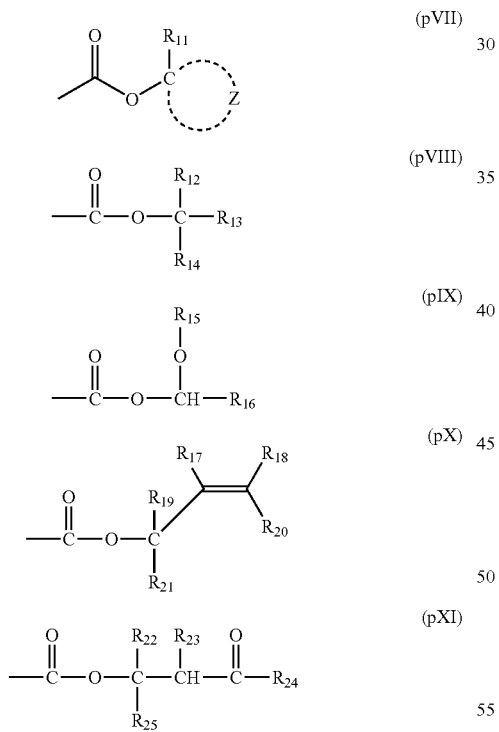

In the above formulae, $R_{11}$ to $R_{25}$ and Z has the same meanings as defined above, respectively.

A repeating unit having the alkali-soluble group protected by the structure represented by any one of formulae (pI) to (pVI) in the resin is preferably represented by the following formula (pA):

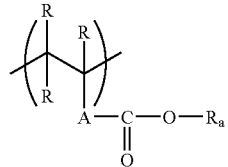

In the formula, R represents a hydrogen atom, a halogen atom or a straight chain or branched alkyl group having from 1 to 4 carbon atoms, which may be substituted. A plurality of R may be the same or different.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Specific examples of the monomer corresponding to the repeating unit represented by formula (pA) are set forth below, but the present invention should not be construed as being limited thereto.

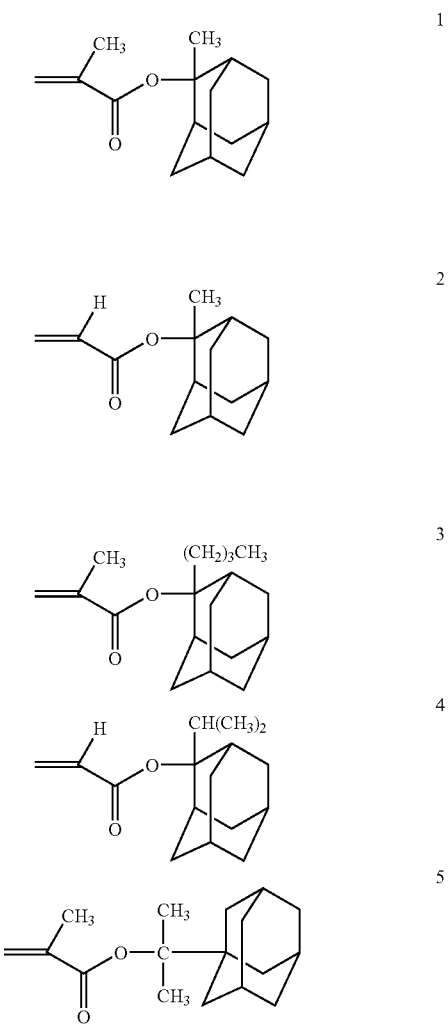

-continued

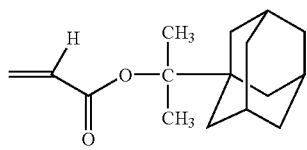
6

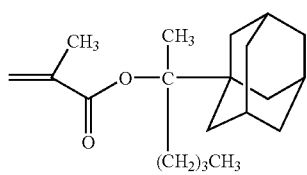
7

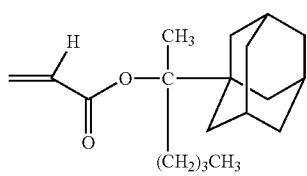
8

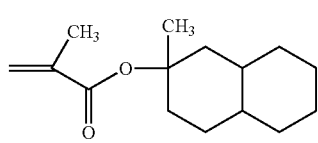
9

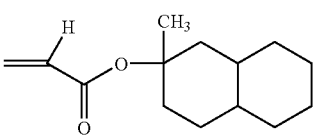
10

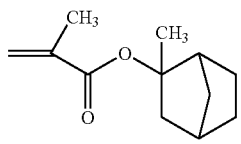
11

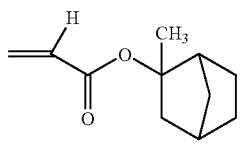
12

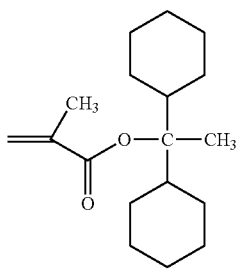
13

-continued

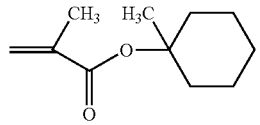
14

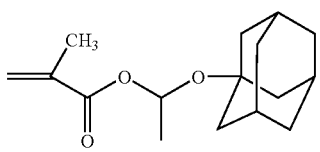
15

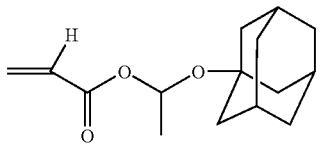
16

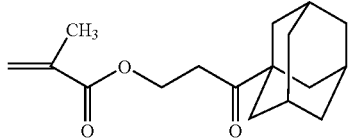
17

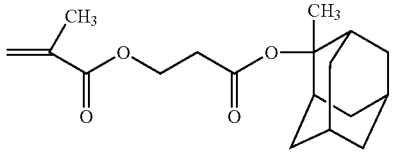
18

In formula (II-AB), $R_{11}'$ and $R_{12}'$ each independently represent a hydrogen atom, a cyano group, a halogen atom or an alkyl group, which may have a substituent.

Z' represents an atomic group necessary for forming an alicyclic structure, which may be substituted, together with the connected two carbon atoms (C—C).

The halogen atom for $R_{11}'$ or $R_{12}'$ includes, for example, chlorine, bromine, fluorine and iodine atoms.

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

Examples of the substituent for the alkyl group include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl or acetyl group. The acyloxy group includes, for example, an acetoxy group.

The atomic group necessary for forming an alicyclic structure represented by Z' is an atomic group necessary for forming a repeating unit of alicyclic hydrocarbon moiety, which may be substituted. In particular, an atomic group necessary for forming a bridged alicyclic structure, by which a repeating unit of the bridged alicyclic hydrocarbon is completed, is preferred.

The skeleton of the alicyclic hydrocarbon formed includes the examples of structure of alicyclic portion in the alicyclic hydrocarbon group in formulae (pI) to (pVI) above.

The skeleton of the alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In formulae (II-A) and (II-B), $R_{13}'$ to $R_{16}'$ each independently represent a hydrogen atom, a halogen atom, a cyano group, —COOH, —COOR$_5$, a group that is decomposed by the action of acid, —C(=O)—X-A'-$R_{17}'$, an alkyl group, which may have a substituent or a cyclic hydrocarbon group, which may have a substituent.

$R_5$ represents an alkyl group, which may have a substituent, a cyclic hydrocarbon group, which may have a substituent or a group represented by Y.

X represents an oxygen atom, a sulfur atom, —NH—, —NHSO$_2$— or —NHSO$_2$NH—.

A' represents a single bond or a divalent linking group.

Alternatively, at least two of $R_{13}'$ to $R_{16}'$ may be combined with each other to form a ring. n represents 0 or 1.

$R_{17}'$ represents —COOH, —COOR$_5$, —CN, a hydroxy group, an alkoxy group, which may have a substituent, —CO—NH—R$_6$, —CO—NH—SO$_2$—R$_6$ or a group represented by Y.

$R_6$ represents an alkyl group, which may have a substituent or a cyclic hydrocarbon group, which may have a substituent.

In the group represented by Y, $R_{21}'$ to $R_{30}'$ each independently represent a hydrogen atom or an alkyl group, which may have a substituent, and a and b each represent 1 or 2.

In the resin according to the invention, an acid-decomposable group may be incorporated into the above described —C(=O)—X-A'-$R_{17}'$ or as a substituent for Z' in formula (II-AB).

The acid-decomposable group includes a group represented by the following formula:

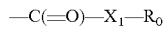

In the formula, $R_0$ represents a tertiary alkyl group, for example, tert-butyl or tert-amyl group, an isobornyl group, an 1-alkoxyethyl group, for example, 1-ethoxyethyl, 1-butoxyethyl, 1-isobutoxyethyl or 1-cyclohexyloxyethyl group, an alkoxymethyl group, for example, 1-metoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue. $X_1$ has the same meaning as X defined above.

The halogen atom for each of $R_{13}'$ or $R_{16}'$ includes, for example, chlorine, bromine, fluorine and iodine atoms.

The alkyl group for each of $R_5$, $R_6$ and $R_{13}'$ to $R_{16}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

The cyclic hydrocarbon group for each of $R_5$, $R_6$ and $R_{13}'$ to $R_{16}'$ includes a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl or tetracyclododecanyl group.

The ring formed by combining at least two of $R_{13}'$ to $R_{16}'$ includes a ring having from 5 to 12 carbon atoms, for example, cyclopentene, -cyclohexene, cycloheptane or cyclooctane ring.

The alkoxy group for $R_{17}'$ includes an alkoxy group having from 1 to 4 carbon atoms, for example, methoxy, ethoxy, propoxy or butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The alkyl group and cyclic hydrocarbon group include those described above.

The divalent linking group for A' includes an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group for A' include a group represented by the following formula:

In the formula, $R_a$ and $R_b$, which may be the same or different, each represent a hydrogen atom, an alkyl group, a substituted alkyl group, a halogen atom, a hydroxy group or an alkoxy group. The alkyl group includes preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r represents an integer of from 1 to 10.

In the resin according to the invention, the acid-decomposable group may be incorporated into at least one repeating unit selected from the repeating unit having a partial structure including an alicyclic hydrocarbon represented by any one of formulae (pI) to (pVI), the repeating unit represented by formula (II-AB), and a repeating unit of a copolymerization component described hereinafter.

Various atoms and groups represented by $R_{13}'$ to $R_{16}'$ in formula (II-A) or (II-B) constitute substituents for the atomic group necessary for forming an alicyclic structure or a bridged alicyclic structure represented by Z' in formula (II-AB).

Specific examples of the repeating unit represented by formula (II-A) or (II-B) are set forth below, but the invention should not be construed as being limited thereto.

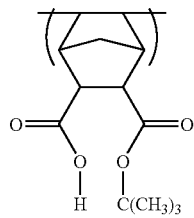

[II-1]

-continued
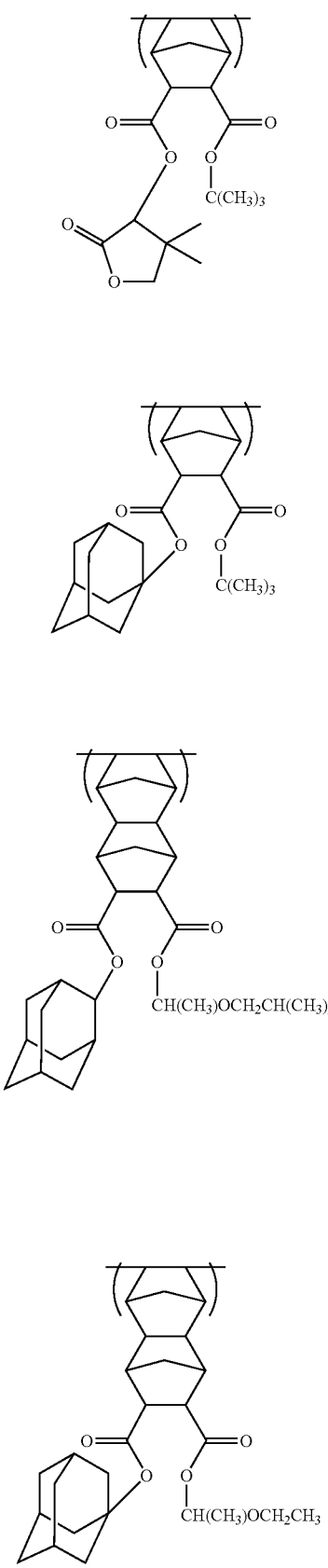
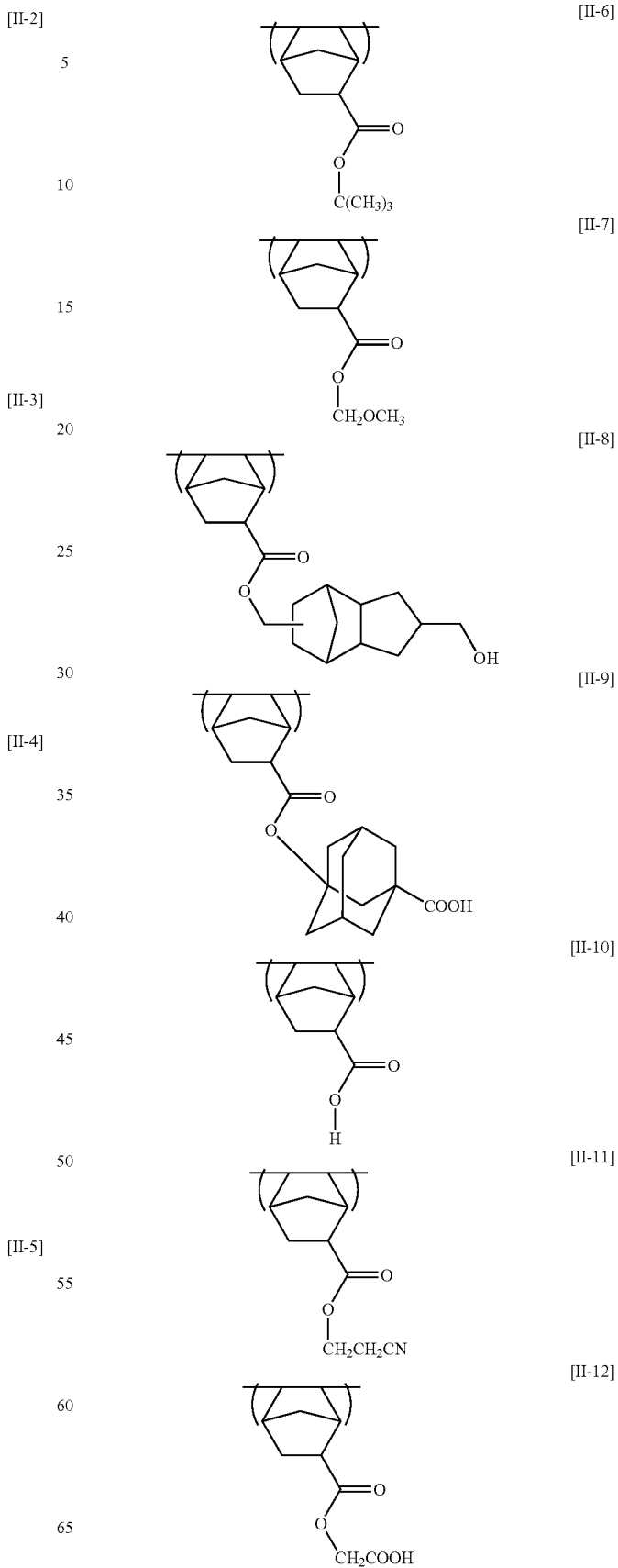

-continued
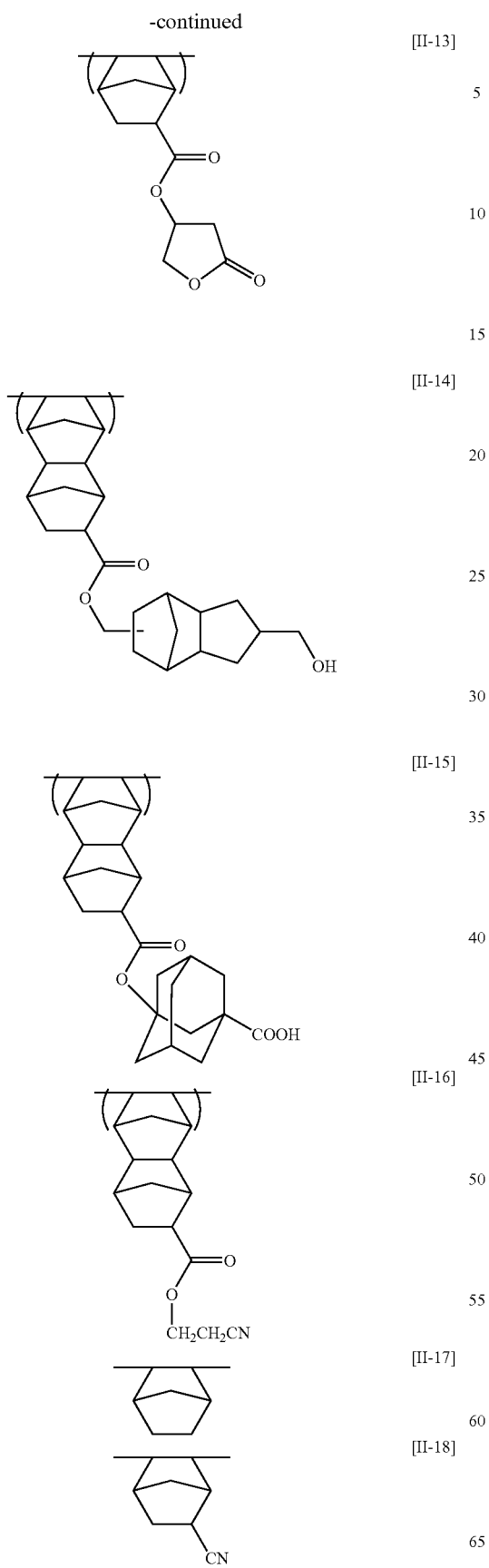
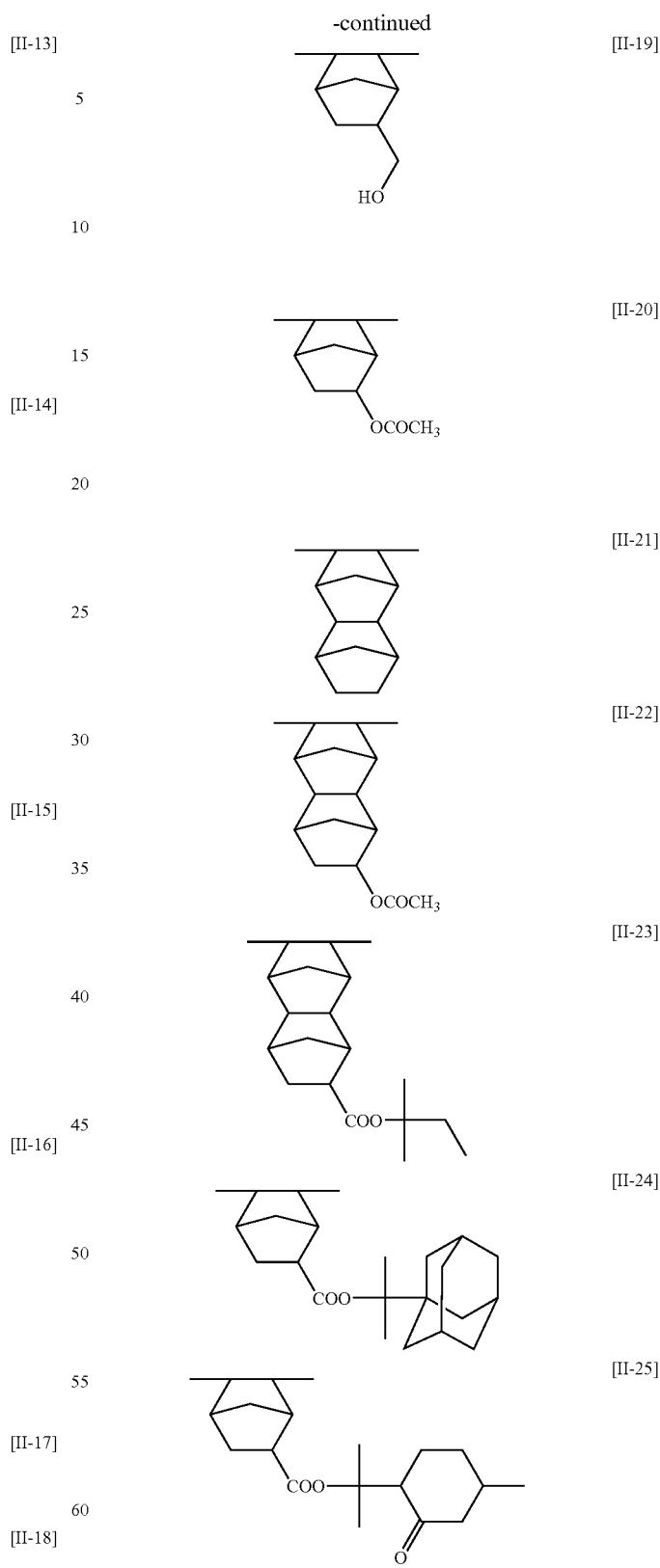
The acid-decomposable resin according to the invention may further contain a repeating unit having a lactone structure represented by the following formula (IV):

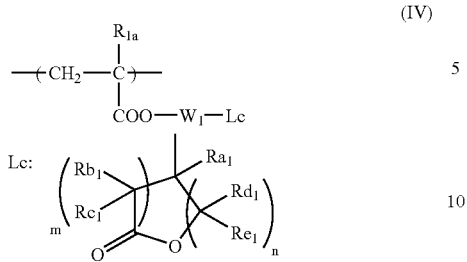
(IV)

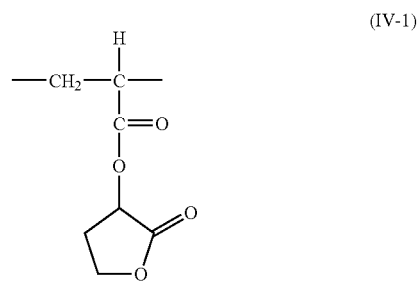
(IV-1)

In formula (IV), $R_{1a}$ represents a hydrogen atom or a methyl group.

$W_1$ represents a single bond, an alkylene group, an ether group, a thioether group, a carbonyl group, an ester group or a combination of two or more of thereof.

$R_{a1}$, $R_{b1}$, $R_{c1}$, $R_{d1}$ and $R_{e1}$ each independently represent a hydrogen atom or an alkyl group having from 1 to 4 carbon atoms. m and n each independently represent an integer of from 0 to 3, provided that the sum total of m and n is from 2 to 6.

The alkyl group having from 1 to 4 carbon atoms represented by any one of $R_{a1}$ to $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

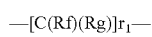

In the above formula, Rf and Rg, which may be the same or different, each represent a hydrogen atom, an alkyl group, a substituted alkyl group, a halogen atom, a hydroxy group or an alkoxy group. The alkyl group is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. $r_1$ represents an integer of from 1 to 10.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an alkoxy group having from 1 to 4 carbon atoms, for example, methoxy, ethoxy, propoxy or butoxy group. The acyloxy group includes, for example, an acetoxy group. The halogen atom includes, for example, chlorine, bromine, fluorine and iodine atoms.

Specific examples of the repeating unit represented by formula (IV) are set forth below, but the invention should not be construed as being limited thereto.

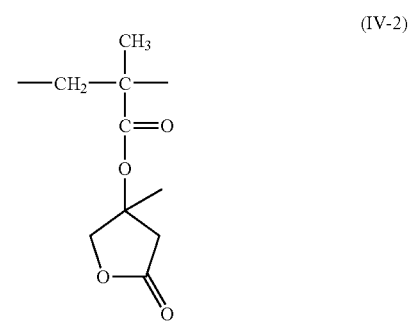
(IV-2)

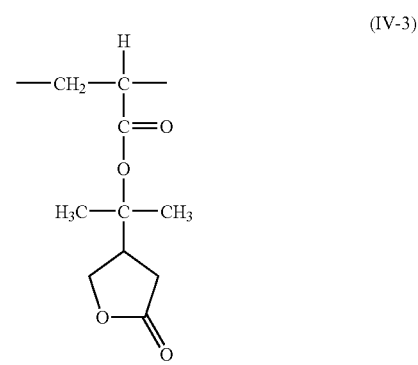
(IV-3)

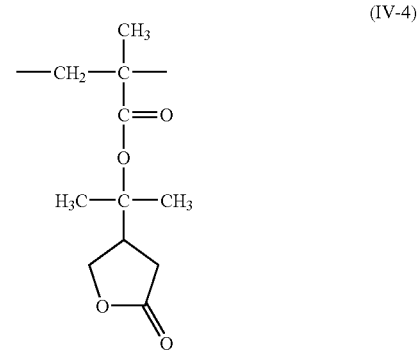
(IV-4)

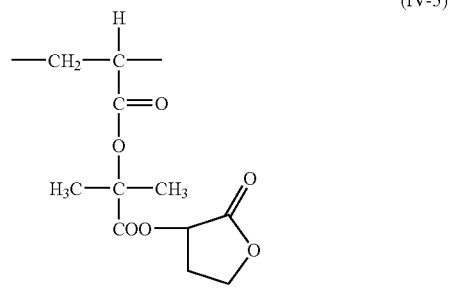
(IV-5)

-continued

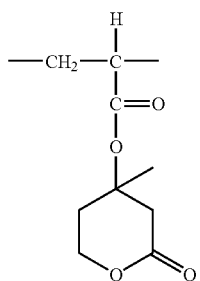
(IV-6)

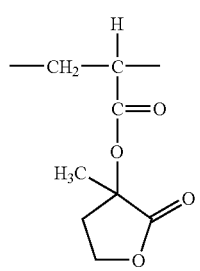
(IV-7)

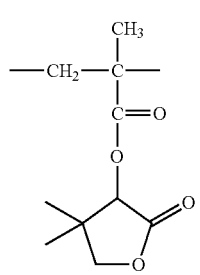
(IV-8)

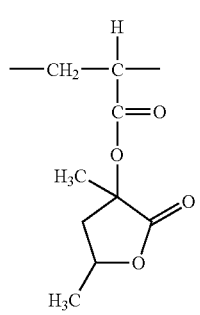
(IV-9)

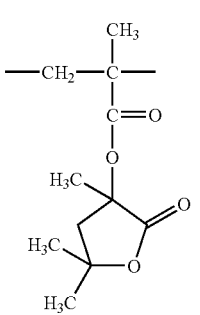
(IV-10)

-continued

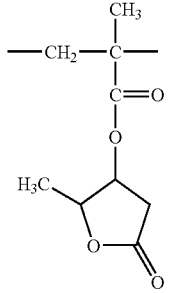
(IV-11)

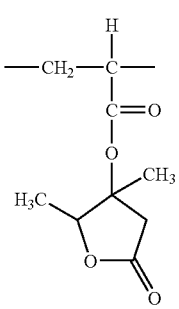
(IV-12)

Of the specific examples of the repeating unit represented by formula (IV), (IV-9) to (IV-12) are preferred in view of more favorable exposure margin.

Further, the repeating units represented by formula (IV) wherein an acrylate structure is included are preferred from a standpoint of good edge roughness.

The resin according to the invention may contain a repeating unit having a group represented by any one of the following formulae (V-1) to (V-4):

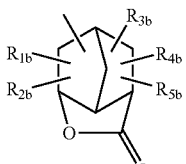
(V-1)

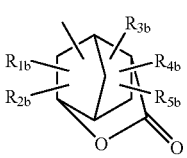
(V-2)

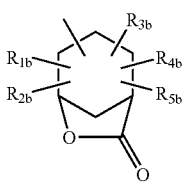
(V-3)

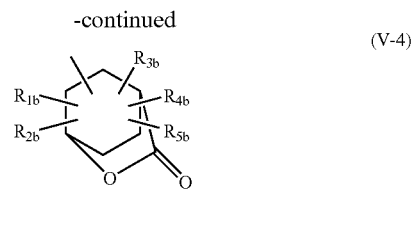

(V-4)

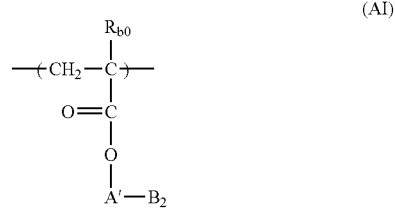

(AI)

In formulae (V-1) to (V-4), $R_{1b}$, $R_{2b}$, $R_{3b}$, $R_{4b}$ and $R_{5b}$ each independently represent a hydrogen atom, an alkyl group, which may be substituted, a cycloalkyl group, which may be substituted or an alkenyl group which may be substituted, or two of $R_{1b}$, $R_{2b}$, $R_{3b}$, $R_{4b}$ and $R_{5b}$ may be combined with each other to form a ring.

The alkyl group represented by any one of $R_{1b}$ to $R_{5b}$ in formulae (V-1) to (V-4) includes a straight chain or branched alkyl group, which may be substituted.

The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group includes preferably a cycloalkyl group having from 3 to 8 carbon atoms, for example, cyclopropyl, cyclopentyl, cyclohexyl, cycloheptyl or cyclooctyl group.

The alkenyl group includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-4) can be connected to any one of the carbon atoms constituting the cyclic structure.

Preferred examples of the substituent for the alkyl group, cycloalkyl group or alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (II-A) or (II-B) described above wherein one of $R_{13}'$ to $R_{16}'$ has the group represented by any one of formulae (V-1) to (V-4), for example, $R_5$ of —COOR$_5$ is the group represented by any one of formulae (V-1) to (V-4), and a repeating unit represented by formula (AI) shown below.

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by $R_{1b}$ in any one of formulae (V-1) to (V-4) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combination of these groups.

$B_2$ in formula (AI) represents the group represented by any one of formulae (V-1) to (V-4).

Examples of the divalent group formed by combination of the groups represented by A' include groups represented by the following formulae:

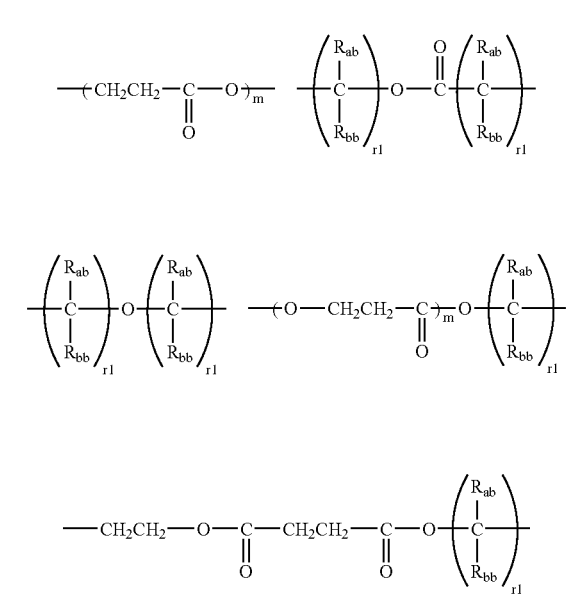

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group is preferably a lower alkyl group, for example, methyl, ethyl, propyl, isopropyl or butyl group, and more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r1 represents an integer of from 1 to 10, and preferably from 1 to 4. m represents an integer of from 1 to 3, and preferably 1 or 2.
Specific examples of the repeating unit represented by formula (AI) are set forth below, but the invention should not be construed as being limited thereto.
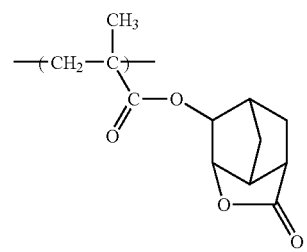
(Ib-1)
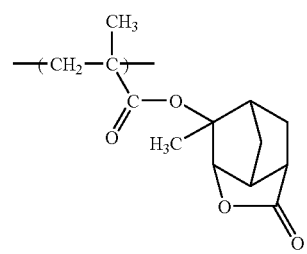
(Ib-2)
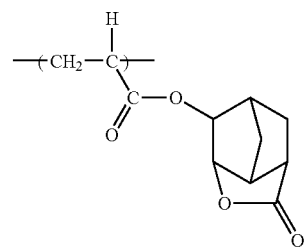
(Ib-3)
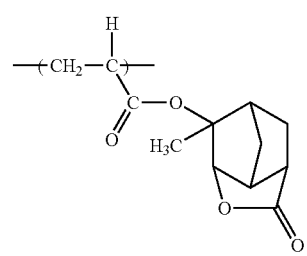
(Ib-4)
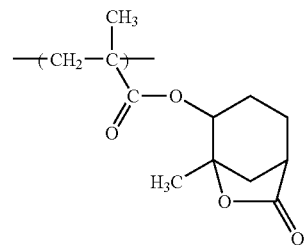
(Ib-5)
-continued
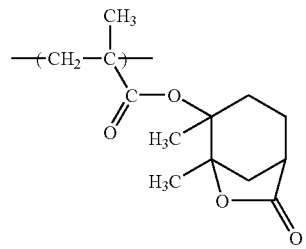
(Ib-6)
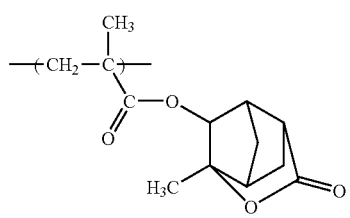
(Ib-7)
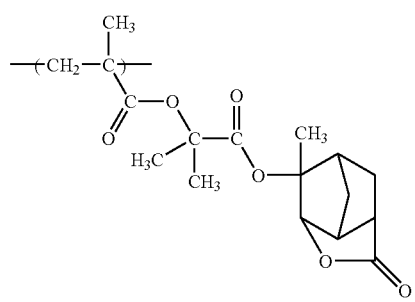
(Ib-8)
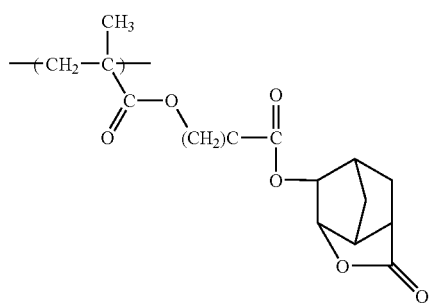
(Ib-9)
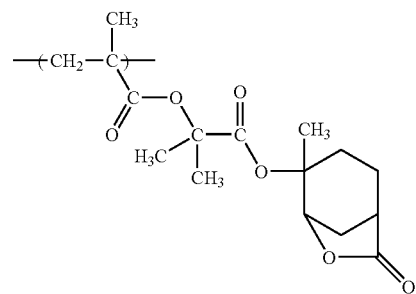
(Ib-10)

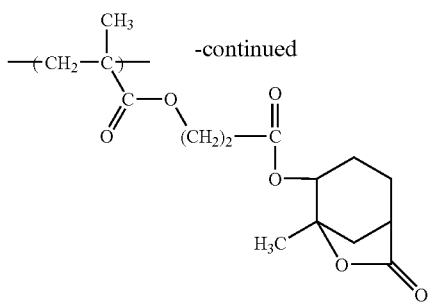

(Ib-11)

The acid-decomposable resin according to the invention may further contain a repeating unit represented by the following formula (VI):

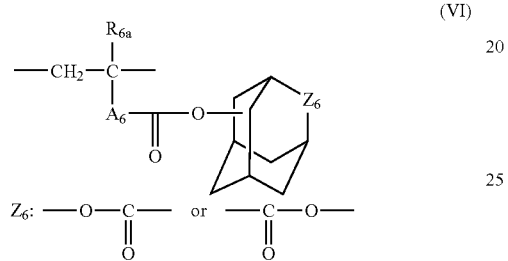

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group represented by $A_6$ in formula (VI) includes a group represented by the following formula:

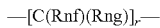
—[C(Rnf)(Rng)]$_r$—

In the above formula, Rnf and Rng, which may be the same or different, each represent a hydrogen atom, an alkyl group, a halogen atom, a hydroxy group or an alkoxy group.

The alkyl group includes preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r represents an integer of from 1 to 10.

The cycloalkylene group represented by $A_6$ in formula (VI) includes a cycloalkylene group having from 3 to 10 carbon atoms, for example, cyclopentylene, cyclohexylene or cyclooctylene group.

In formula (VI), the bridged alicyclic group including $Z_6$ may have a substituent. Examples of the substituent include a halogen atom, an alkoxy group (preferably an alkoxy group having from 1 to 4 carbon atoms), an alkoxycarbonyl group (preferably an alkoxycarbonyl group having from 2 to 5 carbon atoms), an acyl group (for example, formyl or benzoyl group), an acyloxy group (for example, propylcarbonyloxy or benzoyloxy group), an alkyl group (preferably an alkyl group having from 1 to 4 carbon atoms), a carboxy group, a hydroxy group and an alkylsulfonylcarbamoyl group (for example, —CONHSO$_2$CH$_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be connected to any one of the carbon atoms constituting the bridged alicyclic structure containing $Z_6$.

Specific examples of the repeating unit represented by formula (VI) are set forth below, but the invention should not be construed as being limited thereto.

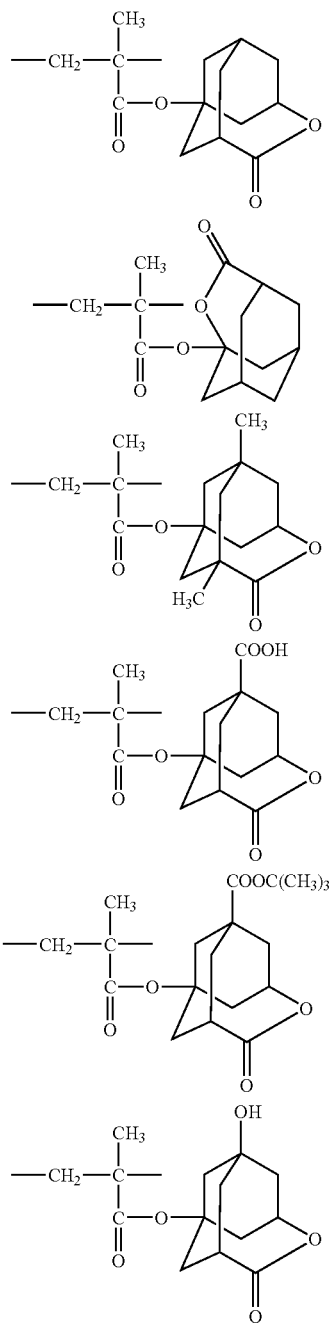

The resin (B) according to the invention may further contain a repeating unit having a group represented by the following formula (VII):

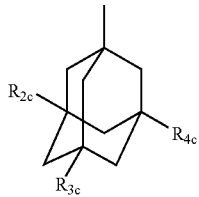
(VII)

In formula (VII), $R_{2c}$, $R_{3c}$ and $R_{4c}$ each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formula (VII) include a repeating unit represented by formula (II-A) or (II-B) described above wherein one of $R_{13}'$ to $R_{16}'$ has the group represented by formula (VII), for example, $R_5$ of —COOR$_5$ is the group represented by formula (VII), and a repeating unit represented by the following formula (AII):

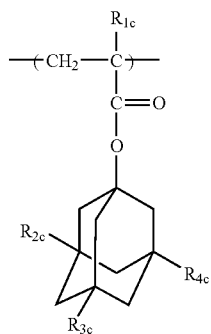
(AII)

In formula (AII), $R_{1c}$ represents a hydrogen atom or a methyl group, and $R_{2c}$, $R_{3c}$ and $R_{4c}$ each independently represents a hydrogen atom or a hydroxy group, provided that at least one of $R_{2c}$, $R_{3c}$ and $R_{4c}$ represents a hydroxy group.

Specific examples of the repeating unit represented by formula (AII) are set forth below, but the invention should not be construed as being limited thereto.

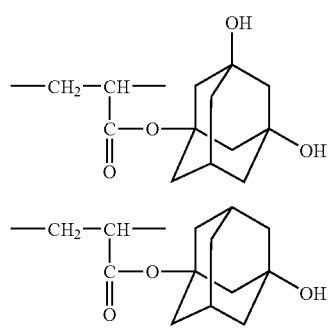
(1)
(2)
(3)
(4)

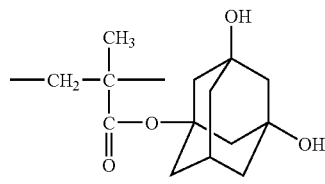

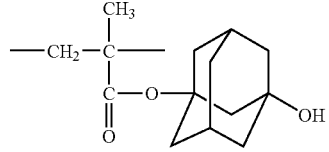

The resin (B) according to the invention may further contain a repeating unit having a group represented by the following formula (VIII):

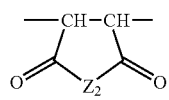
(VIII)

In formula (VIII), $Z_2$ represents —O— or —N(R$_{41}$)—, wherein $R_{41}$ represents a hydrogen atom, a hydroxy group, an alkyl group, a haloalkyl group or —O—SO$_2$—R$_{42}$, wherein $R_{42}$ represents an alkyl group, a haloakyl group, a cycloalkyl group or a camphor residue.

Examples of the alkyl group represented by $R_{41}$ or $R_{42}$ include preferably a straight chain or branched alkyl group having form 1 to 10 carbon atoms, more preferably a straight chain or branched alkyl group having form 1 to 6 carbon atoms, and still more preferably methyl, ethyl, propyl, isopropyl, n-butyl, isobutyl, sec-butyl and tert-butyl groups.

Examples of the haloalkyl group represented by $R_{41}$ or $R_{42}$ include trifluoromethyl, nonafluorobutyl, pentadecafluorooctyl and trichloromethyl groups.

Examples of the cycloalkyl group represented by $R_{42}$ include cyclopentyl, cyclohexyl and cyclooctyl groups.

The alkyl group and haloalkyl group represented by $R_{41}$ or $R_{42}$ and the cycloalkyl group and camphol residue represented by $R_{42}$ may have a substituent. Examples of the substituent for the alkyl group, haloalkyl group, cycloalkyl group and camphol residue include a hydroxy group, a carboxy group, a cyano group, a halogen atom (e.g., chlorine, bromine, fluorine or iodine atom), an alkoxy group (preferably an alkoxy group having from 1 to 4 carbon atoms, e.g., methoxy, ethoxy, propoxy or butoxy group), an acyl group (preferably an acyl group having from 2 to 5 carbon atoms, e.g., formyl or acetyl group), an acyloxy group (preferably an acyloxy group having from 2 to 5 carbon atoms, e.g., acetoxy group) and an aryl group (preferably an aryl group having from 6 to 14 carbon atoms, e.g., phenyl group).

Specific examples of the repeating unit represented by formula (VIII) are set forth below as formulae [I'-1] to [I'-7], but the present invention should not be construed as being limited thereto.

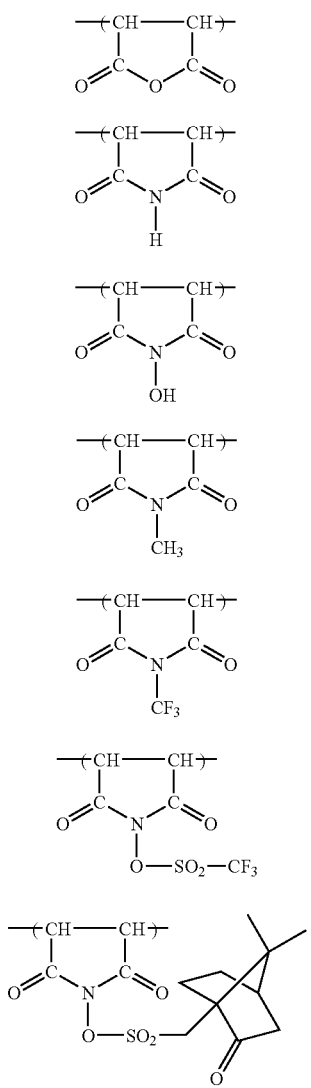

The acid-decomposable resin of Component (B) according to the invention may contain various repeating units in addition to the repeating units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating units include repeating units corresponding to monomers described below, but the present invention should not be construed as being limited thereto.

The introduction of additional repeating unit makes possible the minute control of characteristics required for the acid-decomposable resin, particularly (1) solubility in a coating solvent, (2) film forming property (glass transition temperature), (3) developing property with alkali, (4) reduction in a film thickness (hydrophilic/hydrophobic property, selection of alkali-soluble group), (5) adhesion of the unexposed area to a substrate, and (6) dry etching resistance.

Examples of such monomers include compounds having one addition-polymerizable unsaturated bond, for example, acrylates, methacrylates, acrylamides, methacrylamides, allyl compounds, vinyl ethers and vinyl esters.

Further, crotonic acid, itaconic acid, maleic anhydride, maleimide, acrylonitrile, methacrylonitrile and maleonitrile may also be employed.

In addition, any addition-polymerizable unsaturated compounds copolymerizable with monomers corresponding to the repeating units described above may be employed.

A molar ratio of each repeating unit in the acid-decomposable resin of Component (B) can be appropriately determined taking the adjustment of many factors including dry etching resistance of resist, standard developing solution aptitude, adhesion to substrate, resist profile, and other characteristics ordinarily required for resist, for example, resolution, heat resistance and sensitivity into consideration.

Preferred embodiments of the acid-decomposable resin of Component (B) according to the invention include (1) resin (side chain type) containing a repeating unit having a partial structure including an alicyclic hydrocarbon represented by formula (pI), (pII), (pIII), (pIV), (pV) or (pVI).

(2) resin (main chain type) containing a repeating unit represented by formula (II-AB). The resin of (2) includes the following resin of (3).

(3) resin (hybrid type) containing a repeating unit represented by formula (II-AB), a maleic anhydride derivative and a (meth)acrylate structure.

A content of the repeating unit having a partial structure including an alicyclic hydrocarbon represented by formula (pI), (pII), (pIII), (pIV), (pV) or (pVI) is preferably from 30 to 70% by mole, more preferably from 35 to 65% by mole, and still more preferably from 40 to 60% by mole, based on the total repeating units in the acid-decomposable resin.

A content of the repeating unit represented by formula (II-AB) is preferably from 10 to 60% by mole, more preferably from 15 to 55% by mole, and still more preferably from 20 to 50% by mole, based on the total repeating units in the acid-decomposable resin.

A content of the repeating unit corresponding to the additional copolymerization component described above can be appropriately determined depending on the desired performance of resist. In general, the content is preferably 99% by mole or less, more preferably 90% by mole or less, and still more preferably 80% by mole or less, to the sum total of the repeating unit having a partial structure including an alicyclic hydrocarbon represented by formula (pI), (pII), (pIII), (pIV), (pV) or (pVI) and the repeating unit represented by formula (II-AB).

When the resist composition of the invention is used for ArF exposure, it is preferred that the acid-decomposable resin does not contain an aromatic group in order to ensure transparency of the ArF beam.

A content of the repeating unit having an acid-decomposable group is preferably from 10 to 50% by mole, more preferably from 20 to 40% by mole, based on the total repeating units of the acid-decomposable resin.

The acid-decomposable resin (B) according to the invention is preferably a resin (hereinafter also referred to as a fluorine group-containing resin) that is insoluble or hardly soluble in an alkali developing solution but becomes soluble in the alkali developing solution upon the action of an acid and has a structure substituted with a fluorine atom in the main chain and/or side chain of polymer skeleton, in case of conducting exposure with $F_2$ light, and more preferably a fluorine group-containing resin containing at least one moiety selected from a perfluoroalkylene group and a perfluoroarylene group in the main chain of polymer skeleton or a resin containing at least one moiety selected from a perfluoroalkyl group, a perfluoroaryl group, a hexafluoro-2-propanol group and a group obtained by protecting the hydroxy group of hexafluoro-2-propanol group in the side chain of polymer skeleton.

Specifically, the fluorine group-containing resin is a resin having at least one of repeating units represented by the following formulae (I) to (X):

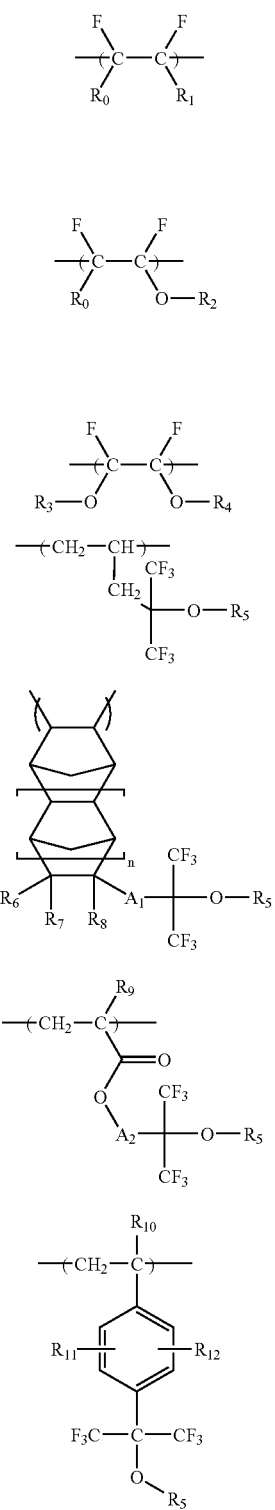

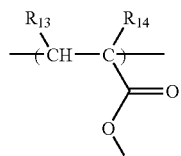

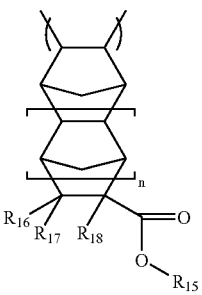

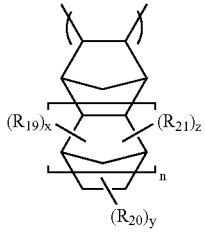

In the formulae, $R_0$ and $R_1$ each represent a hydrogen atom, a fluorine atom, an alkyl group, which may have a substituent, a perfluoroalkyl group, which may have a substituent, a cycloalkyl group, which may have a substituent or an aryl group, which may have a substituent.

$R_2$ to $R_4$ each represent an alkyl group, which may have a substituent, a perfluoroalkyl group, which may have a substituent, a cycloalkyl group, which may have a substituent or an aryl group, which may have a substituent. Alternatively, $R_0$ and $R_1$, $R_0$ and $R_2$ or $R_3$ and $R_4$ may be combined with each other to form a ring.

$R_5$ represents a hydrogen atom, an alkyl group, which may have a substituent, a perfluoroalkyl group, which may have a substituent, a monocyclic or polycyclic cycloalkyl group, which may have a substituent, an acyl group, which may have a substituent or an alkoxycarbonyl group, which may have a substituent.

$R_6$, $R_7$ and $R_8$, which may be the same or different, each represent a hydrogen atom, a halogen atom, an alkyl group which, may have a substituent, a perfluoroalkyl group, which may have a substituent or an alkoxy group, which may have a substituent.

$R_9$ and $R_{10}$, which may be the same or different, each represent a hydrogen atom, a halogen atom, a cyano group, an alkyl group, which may have a substituent or a haloalkyl group, which may have a substituent.

$R_{11}$ and $R_{12}$, which may be the same or different, each represent a hydrogen atom, a hydroxy group, a halogen atom, a cyano group, an alkoxy group, an acyl group, an alkyl group, which may have a substituent, a cycloalkyl group, which may have a substituent, an alkenyl group which may have a substituent, an aralkyl group, which may have a substituent or an aryl group, which may have a substituent.

$R_{13}$ and $R_{14}$, which may be the same or different, each represent a hydrogen atom, a halogen atom, a cyano group, an alkyl group, which may have a substituent or a haloalkyl group, which may have a substituent.

$R_{15}$ represents an alkyl group having a fluorine atom, a monocyclic or polycyclic cycloalkyl group having a fluorine atom, an alkenyl group having a fluorine atom, an aralkyl group having a fluorine atom or an aryl group having a fluorine atom.

$R_{16}$, $R_{17}$ and $R_{18}$, which may be the same or different, each represent a hydrogen atom, a halogen atom, a cyano group, an alkyl group, which may have a substituent, a perfluoroalkyl group, which may have a substituent, an alkoxy group, which may have a substituent or —CO—O—$R_{15}$.

$R_{19}$, $R_{20}$ and $R_{21}$, which may be the same or different, each represent a hydrogen atom, a fluorine atom, an alkyl group having a fluorine atom, a monocyclic or polycyclic cycloalkyl group having a fluorine atom, an alkenyl group having a fluorine atom, an aralkyl group having a fluorine atom, an aryl group having a fluorine atom or an alkoxy group having a fluorine atom, provided that at least one of $R_{19}$, $R_{20}$ and $R_{21}$ is a substituent other than a hydrogen atom.

$A_1$ and $A_2$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group.

$R_{24}$ represents a hydrogen atom, an alkyl group, which may have a substituent, a cycloalkyl group, which may have a substituent, an aralkyl group, which may have a substituent or an aryl group, which may have a substituent.

n represents 0 or 1, and x, y and z each represent an integer of from 0 to 4.

As the acid-decomposable resin (B) according to the invention, the fluorine group-containing resin having an acid-decomposable group preferably further has at least one of repeating units represented by the following formulae (XI) to (XIII):

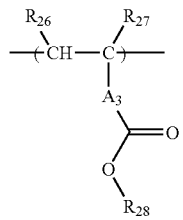

(XI)

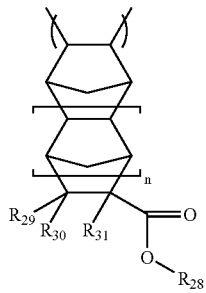

(XII)

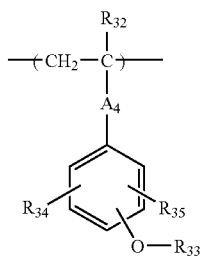

(XIII)

In the formulae, $R_{26}$, $R_{27}$ and $R_{32}$, which may be the same or different, each represent a hydrogen atom, a halogen atom, a cyano group, an alkyl group, which may have a substituent or a haloalkoxy group, which may have a substituent.

$R_{28}$ and $R_{33}$ each represent —C($R_{36}$)($R_{37}$)($R_{38}$), —C($R_{36}$)($R_{37}$)(O$R_{39}$) or a group represented by the following formula (XIV):

(XIV)

wherein $R_{29}$, $R_{30}$ and $R_{31}$, which may be the same or different, each represent a hydrogen atom, a halogen atom, a cyano group, an alkyl group, which may have a substituent, a perfluoroalkyl group, which may have a substituent, an alkoxy group, which may have a substituent or —CO—O—$R_{28}$.

$R_{34}$ and $R_{35}$, which may be the same or different, each represent a hydrogen atom, a hydroxy group, a halogen atom, a cyano group, an alkoxy group, an acyl group, an alkyl group, which may have a substituent, a cycloalkyl group, which may have a substituent, an alkenyl group, which may have a substituent, an aralkyl group, which may have a substituent or an aryl group, which may have a substituent.

$R_{36}$, $R_{37}$, $R_{38}$ and $R_{39}$, which may be the same or different, each represent an alkyl group, which may have a substituent, a cycloalkyl group, which may have a substituent, an alkenyl group, which may have a substituent, an alkynyl group which may have a substituent, an aralkyl group, which may have a substituent or an aryl group, which may have a substituent. Alternatively, two of $R_{36}$, $R_{37}$ and $R_{38}$ or two of $R_{36}$, $R_{37}$ and $R_{39}$ may be combined with each other to form a ring. The ring formed may also contain an oxo group.

$R_{40}$ represents an alkyl group, which may have a substituent, a cycloalkyl group, which may have a substituent, an alkenyl group, which may have a substituent, an alkynyl group, which may have a substituent, an aralkyl group, which may have a substituent or an aryl group, which may have a substituent.

$A_3$ and $A_4$ each represent a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—. $R_{22}$ to $R_{25}$ have the same meanings as defined above, respectively.

Z represents an atomic group necessary for forming a monocyclic or polycyclic alicyclic group together with the carbon atom. n represents 0 or 1.

In the invention, the fluorine group-containing resin may have at least one of repeating units derived from maleic anhydride, vinyl ether and a vinyl compound containing a cyano group and represented by formulae (XV) to (XVII) shown below respectively in order to adjust characteristics of the resin, for example, a hydrophilic/hydrophobic property, a glass transition point or transmittancy to exposure light, or to control a polymerization property at the synthesis of the resin.

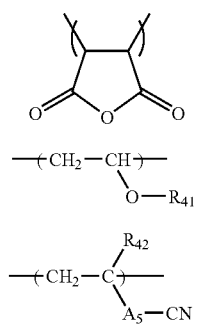

(XV)

(XVI)

(XVII)

In the formulae, $R_{41}$, represents an alkyl group, which may have a substituent, a cycloalkyl group, which may have a substituent, an aralkyl group, which may have a substituent or an aryl group, which may have a substituent.

$R_{42}$ represents a hydrogen atom, a halogen atom, a cyano group, an alkyl group, which may have a substituent or a haloalkyl group, which may have a substituent.

$A_5$ represents a single bond, a divalent group selected from an alkylene group, an alkenylene group, a cycloalkylene group and an arylene group, each of which may have a substituent, —O—CO—$R_{22}$—, —CO—O—$R_{23}$— or —CO—N($R_{24}$)—$R_{25}$—. $R_{22}$ to $R_{25}$ have the same meanings as defined above, respectively.

More preferred fluorine-group containing resin for use in the invention includes a resin having at least one repeating unit represented by formula (IA) shown below and at least one repeating unit represented by formula (IIA) shown below and a resin having at least one repeating unit represented by formula (IIA) shown below and at least one repeating unit represented by formula (VIA) shown below.

The fluorine-group containing resin having at least one repeating unit represented by formula (IA) and at least one repeating unit represented by formula (IIA) and the fluorine-group containing resin having at least one repeating unit represented by formula (IIA) and at least one repeating unit represented by formula (VIA) may further have a repeating unit represented by any one of formulae (I) to (V) described above.

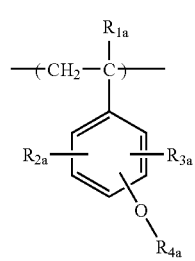

(IA)

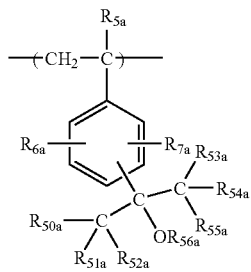

(IIA)

In formulae (IA) and (IIA), $R_{1a}$ and $R_{5a}$, which may be the same or different, each represent a hydrogen atom, a halogen atom, a cyano group or an alkyl group, which may have a substituent.

$R_{2a}$, $R_{3a}$, $R_{6a}$ and $R_{7a}$, which may be the same or different, each represent a hydrogen atom, a halogen atom, a cyano group, a hydroxy group, an alkyl group, which may have a substituent, a cycloalkyl group, which may have a substituent, an alkoxy group, which may have a substituent, an acyl group, which may have a substituent, an acyloxy group, which may have a substituent, an alkenyl group, which may have a substituent, an aryl group, which may have a substituent or an aralkyl group, which may have a substituent.

$R_{50a}$ to $R_{55a}$, which may be the same or different, each represent a hydrogen atom, a fluorine atom or an alkyl group, which may have a substituent, provided that at least one of $R_{50a}$ to $R_{55a}$ represents a fluorine atom or an alkyl group in which at least one of the hydrogen atoms is substituted with a fluorine atom.

$R_{56a}$ represents a hydrogen atom, an alkyl group, which may have a substituent, a cycloalkyl group, which may have a substituent, an acyl group, which may have a substituent or an alkoxycarbonyl group, which may have a substituent. $R_{56a}$ is preferably a hydrogen atom.

$R_{4a}$ represents a group represented by the following formula (IVA) or (VA):

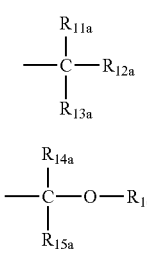

(IVA)

(VA)

In formula (IVA), $R_{11a}$, $R_{12a}$ and $R_{13a}$, which may be the same or different, each represent an alkyl group, which may have a substituent, a cycloalkyl group, which may have a substituent, an alkenyl group, which may have a substituent, an aralkyl group, which may have a substituent or an aryl group, which may have a substituent.

In formula (VA), $R_{14a}$ and $R_{15a}$, which may be the same or different, each represent a hydrogen atom or an alkyl group, which may have a substituent. $R_{16a}$ represents an alkyl group, which may have a substituent, a cycloalkyl group, which may have a substituent, an aralkyl group, which may have a substituent or an aryl group, which may have a substituent, or two of $R_{14a}$ to $R_{16a}$ may be combined with each other to form a ring.

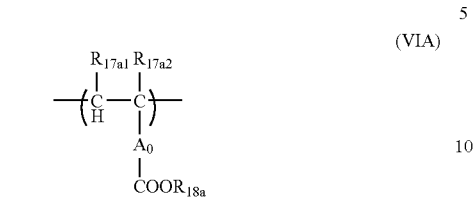

(VIA)

In formula (VIA), $R_{17a1}$ and $R_{17a2}$, which may be the same or different, each represent a hydrogen atom, a halogen atom, a cyano group or an alkyl group, which may have a substituent. $R_{18a}$ represents —C($R_{18a1}$)($R_{18a2}$)($R_{18a3}$) or —C($R_{18a1}$)($R_{18a2}$)(OR$_{18a4}$). $R_{18a1}$ to $R_{18a4}$, which may be the same or different, each represent a hydrogen atom, an alkyl group, which may have a substituent, a cycloalkyl group, which may have a substituent, an alkenyl group, which may have a substituent, an aralkyl group, which may have a substituent or an aryl group, which may have a substituent, or two of $R_{18a1}$, $R_{18a2}$ and $R_{18a3}$ or two of $R_{18a1}$, $R_{18a2}$ and $R_{18a4}$ may be combined with each other to form a ring. $A_0$ represents a single bond or a divalent connecting group, which may have a substituent. $A_0$ is preferably a single bond.

Of these fluorine-group containing resins, it is preferred that $R_{18a}$ in formula (VIA) is a group represented by formula (VIA-A) or (VIA-B) shown below. Of these fluorine-group containing resins, it is also preferred that at least one of $R_{1a}$ in formula (IA), $R_{5a}$ in formula (IIA) and $R_{17a2}$ in formula (VIA) is a trifluoromethyl group.

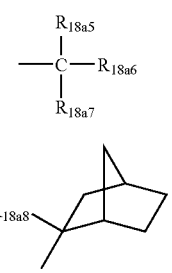

(VIA-A)

(VIA-B)

In formula (VIA-A), $R_{18a5}$ and $R_{18a6}$, which may be the same or different, each represent an alkyl group, which may have a substituent. $R_{18a7}$ represents a cycloalkyl group, which may have a substituent.

In formula (VIA-B), $R_{18a8}$ represents an alkyl group, which may have a substituent, an alkenyl group, which may have a substituent, an alkynyl group, which may have a substituent, an aralkyl group, which may have a substituent or an aryl group, which may have a substituent.

The fluorine-group containing resin having at least one repeating unit represented by formula (IA) and at least one repeating unit represented by formula (IIA) and the fluorine-group containing resin having at least one repeating unit represented by formula (IIA) and at least one repeating unit represented by formula (VIA) may further have a repeating unit represented by any one of the following formulae (IIIA) to (VIIA):

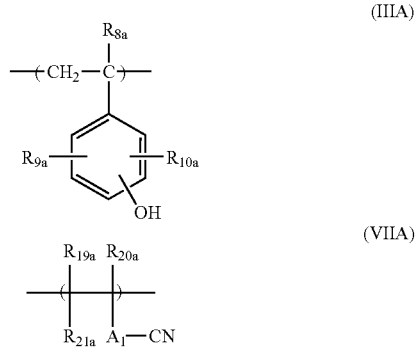

(IIIA)

(VIIA)

In formula (IIIA), $R_{8a}$ represents a hydrogen atom, a halogen atom, a cyano group or an alkyl group, which may have a substituent. $R_{9a}$ and $R_{10a}$, which may be the same or different, each represent a hydrogen atom, a halogen atom, a cyano group, an alkyl group, which may have a substituent, a cycloalkyl group, which may have a substituent, an alkoxy group, which may have a substituent, an acyl group, which may have a substituent, an acyloxy group, which may have a substituent, an alkenyl group, which may have a substituent, an aryl group, which may have a substituent or an aralkyl group, which may have a substituent.

In formula (VIIA), $R_{19a}$ and $R_{20a}$, which may be the same or different, each represent a hydrogen atom, a halogen atom, a cyano group or an alkyl group, which may have a substituent. $R_{21a}$ represent a hydrogen atom, a halogen atom, an alkyl group, which may have a substituent or a group of -$A_1$-CN wherein $A_1$ represents a single bond or a divalent connecting group.

The alkyl group described above preferably includes an alkyl group having from 1 to 8 carbon atoms, specifically, for example, methyl, ethyl, propyl, n-butyl, sec-butyl, hexyl, 2-ethylhexyl or octyl group.

The cycloalkyl group described above may be a monocyclic group or a polycyclic group. The monocyclic group preferably includes that having from 3 to 8 carbon atoms, for example, cyclopropyl, cyclopentyl, cyclohexyl, cycloheptyl or cyclooctyl group. The polycyclic group preferably includes that having from 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atom in the monocyclic or polycyclic cycloalkyl group may be replaced by a hetero atom, for example, an oxygen atom.

The perfluoroalkyl group described above preferably includes a perfluoroalkyl group having from 4 to 12 carbon atoms, specifically, for example, perfluorobutyl, perfluorohexyl, perfluorooctyl, perfluorooctylethyl or perfluorododecyl group.

The haloalkyl group described above preferably includes a haloalkyl group having from 1 to 4 carbon atoms, specifically, for example, chloromethyl, chloroethyl, chloropropyl, chlorobutyl, bromomethyl or bromoethyl group.

The aryl group described above preferably includes an aryl group having from 6 to 15 carbon atoms, specifically, for example, phenyl, tolyl, dimethylphenyl, 2,4,6-trimethylphenyl, naphthyl, anthryl or 9,10-dimethoxyanthryl group.

The aralkyl group described above preferably includes an aralkyl group having from 7 to 12 carbon atoms, specifically, for example, benzyl, phenethyl or naphthylmethyl group.

The alkenyl group described above preferably includes an alkenyl group having from 2 to 8 carbon atoms, specifically, for example, vinyl, allyl, butenyl or cyclohexenyl group.

The alkoxy group described above preferably includes an alkoxy group having from 1 to 8 carbon atoms, specifically, for example, methoxy, ethoxy, n-propoxy, isopropoxy, butoxy, pentoxy, allyloxy or octoxy group.

The acyl group described above preferably includes an acyl group having from 1 to 10 carbon atoms, specifically, for example, formyl, acetyl, propanoyl, butanoyl, pivaloyl, octanoyl or benzoyl group.

The acyloxy group described above preferably includes an acyloxy group having from 2 to 12 carbon atoms, specifically, for example, acetoxy, propionyloxy or benzoyloxy group.

The alkynyl group described above preferably includes an alkynyl group having from 2 to 5 carbon atoms, specifically, for example, ethynyl, propynyl or butynyl group.

The alkoxycarbonyl group described above includes, for example, isopropoxycarbonyl, tert-butoxycarbonyl, tert-amyloxycarbonyl and 1-methyl-1-cyclohecyloxycarbonyl groups. The alkoxycarbonyl group is preferably a secondary alkoxycarbonyl group and more preferably a tertiary alkoxycarbonyl group.

The halogen atom described above includes, for example, fluorine, chlorine, bromine and iodine atoms.

The alkylene group described above preferably includes an alkylene group having from 1 to 8 carbon atoms, which may have a substituent, specifically, for example, methylene, ethylene, propylene, butylene, hexylene or octylene group.

The alkenylene group described above preferably includes an alkenylene group having from 2 to 6 carbon atoms, which may have a substituent, specifically, for example, ethenylene, propenylene or butenylene group.

The cycloalkylene group described above preferably includes a cycloalkylene group having from 5 to 8 carbon atoms, which may have a substituent, specifically, for example, cyclopentylene or cyclohexylene group.

The arylene group described above preferably includes an arylene group having from 6 to 15 carbon atoms, which may have a substituent, specifically, for example, phenylene, tolylene or naphthylene group.

The divalent connecting group described above includes a divalent group selected from an alkylene group, a cycloalkylene group, an alkenylene group and an arylene group, each of which may have a substituent, —O—CO—$R_{22a}$—, —CO—O—$R_{23a}$— or —CO—N($R_{24a}$)—$R_{25a}$—. $R_{22a}$, $R_{23a}$ and $R_{25a}$, which may be the same or different, each represent a single bond or a divalent group selected from an alkylene group, an alkenylene group, a cycloalkylene group and an arylene group, each of which may have an ether group, an ester group, an amido group, a urethane group or a ureido group. $R_{24}$ represents a hydrogen atom, an alkyl group, which may have a substituent, a cycloalkyl group, which may have a substituent, an aralkyl group, which may have a substituent or an aryl group, which may have a substituent.

The ring formed by combining $R_0$ and $R_1$, $R_0$ and $R_2$ or $R_3$ and $R_4$ includes, for example, a 5-membered to 7-membered ring, specifically, for example, pentane, hexane, furan, dioxonol or 1,3-dioxolane ring substituted with fluorine atoms.

The ring formed by combining two of $R_{36}$, $R_{37}$ and $R_{38}$ or two of $R_{36}$, $R_{37}$ and $R_{39}$ includes, for example, a 3-membered to 8-membered ring, specifically, for example, cyclopropane, cyclopentane, cyclohexane, furan or pyran ring.

The ring formed by combining two of $R_{14a}$, $R_{15a}$ and $R_{16a}$, two of $R_{18a1}$, $R_{18a2}$ and $R_{18a3}$ or two of $R_{18a1}$, $R_{18a2}$ and $R_{18a4}$ includes preferably a 3-membered to 8-membered ring, specifically, for example, cyclopropane, cyclopentane, cyclohexane, tetramethyleneoxide, pentamethyleneoxide, hexamethyleneoxide, furan, pyran, dioxonol or 1,3-dioxolane ring.

Z in formula (XIV) represents an atomic group necessary for forming a monocyclic or polycyclic alicyclic group. The monocyclic alicyclic group formed preferably includes that having from 3 to 8 carbon atoms, for example, cyclopropyl, cyclopentyl, cyclohexyl, cycloheptyl or cyclooctyl group. The polycyclic alicyclic group formed preferably includes that having from 6 to 20 carbon atoms, for example, adamantyl, norbornyl, isobornyl, camphanyl, dicyclopentyl, α-pinenyl, tricyclodecanyl, tetracyclodecyl or androstanyl group.

The substituent for the groups described above includes an alkyl group, a cycloalkyl group, an aryl group, an amino group, an amido group, a ureido group, a urethane group, a group having an active hydrogen atom, e.g., a hydroxy group or a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group.

The alkyl group, cycloalkyl group and aryl group as the substituents are same as those described above, respectively. The alkyl group may further be substituted with a fluorine atom or a cycloalkyl group.

The group, which is decomposed by the action of an acid to become alkali-soluble, included in the fluorine-group containing resin according to the invention includes, for example, —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) or —COO—C($R_{36}$)($R_{37}$)(O$R_{39}$). $R_{36}$ to $R_{39}$ have the same meanings as defined above, respectively. $R_{01}$ and $R_{02}$ each represent a hydrogen atom, an alkyl group, which may have the substituent described above, a cycloalkyl group, which may have the substituent described above, an alkenyl group, which may have the substituent described above, an aralkyl group, which may have the substituent described above or an aryl group, which may have the substituent described above.

Specific preferred examples of the group that is decomposed by the action of an acid include an ester or ether group of a tertiary alkyl group, e.g., tert-butyl, tert-amyl, 1-alkyl-1-cyclohexyl, 2-alkyl-2-adamantyl, 2-adamantyl-2-propyl or 2-(4-methylcyclohexyl)-2-propyl group, an acetal or acetal ester group, e.g., 1-alkoxy-1-ethoxy or tetrahydropyranyl group, a tertiary alkylcarbonate group and a tertiary alkylcarbonylmethoxy group.

The total content of repeating units represented by formulae (I) to (X) is ordinarily from 10 to 80% by mol, preferably from 30 to 70% by mol, and more preferably from 35 to 65% by mol, in the whole polymer composition.

The content of repeating units represented by formulae (XI) to (XIII) is ordinarily from 0 to 70% by mol, preferably from 10 to 60% by mol, and more preferably from 20 to 50% by mol, in the whole polymer composition.

The content of repeating units represented by formulae (XV) to (XVII) is ordinarily from 0 to 70% by mol, preferably from 10 to 60% by mol, and more preferably from 20 to 50% by mol, in the whole polymer composition.

As the resin of Component (B), a resin having at least one of repeating units represented by formulae (I) to (III) and at least one of repeating units represented by formulae (IV) to (VI) is more preferred.

Also, as the resin of Component (B), a resin having at least one of repeating units represented by formulae (IV) to (VI)

and at least one of repeating units represented by formulae (VIII) to (X) is more preferred same as described above.

Further, as the resin of Component (B), a resin having at least one of repeating units represented by formulae (IV) to (VII) and at least one of repeating units represented by formulae (XV) to (XVII) is more preferred same as described above.

Using these resins, the positive resist composition exhibits sufficiently high transmittancy in 157 nm and the degradation of dry etching resistance can be prevented.

In the case where the resin of Component (B) according to the invention has at least one of repeating units represented by formulae (I) to (III) and at least one of repeating units represented by formulae (IV) to (VI), the total content of repeating units represented by formulae (I) to (III) is ordinarily not more than 70% by mol, preferably from 10 to 60% by mol, and more preferably from 20 to 50% by mol, in the whole polymer composition.

The total content of repeating units represented by formulae (IV) to (VI) is ordinarily from 10 to 80% by mol, preferably from 30 to 70% by mol, and more preferably from 35 to 65% by mol, in the whole polymer composition.

In the case where the resin of Component (B) according to the invention has at least one of repeating units represented by formulae (IV) to (VI) and at least one of repeating units represented by formulae (VIII) to (X), the total content of repeating units represented by formulae (IV) to (VI) is ordinarily from 10 to 80% by mol, preferably from 30 to 70% by mol, and more preferably from 35 to 65% by mol, in the whole polymer composition.

The total content of repeating units represented by formulae (VIII) to (X) is ordinarily not more than 70% by mol, preferably from 10 to 60% by mol, and more preferably from 20 to 50% by mol, in the whole polymer composition.

In the case where the resin of Component (B) according to the invention has at least one of repeating units represented by formulae (IV) to (VII) and at least one of repeating units represented by formulae (XV) to (XVII), the total content of repeating units represented by formulae (IV) to (VII) is ordinarily from 10 to 80% by mol, preferably from 30 to 70% by mol, and more preferably from 35 to 65% by mol, in the whole polymer composition.

The total content of repeating units represented by formulae (XV) to (XVII) is ordinarily not more than 70% by mol, preferably from 10 to 60% by mol. and more preferably from 20 to 50% by mol, in the whole polymer composition.

In the fluorine group-containing resin having at least one of repeating unit represented by formula (IA) and at least one of repeating unit represented by formula (IIA), the content of repeating unit represented by formula (IA) is ordinarily from 5 to 80% by mol, preferably from 10 to 75% by mol, and more preferably from 20 to 70% by mol, in the whole polymer composition.

In the fluorine group-containing resin having at least one of repeating unit represented by formula (IA) and at least one of repeating unit represented by formula (IIA), the content of repeating unit represented by formula (IIA) is ordinarily from 5 to 80% by mol, preferably from 10 to 70% by mol, and more preferably from 20 to 65% by mol, in the whole polymer composition.

In the fluorine group-containing resin having at least one of repeating unit represented by formula (IIA) and at least one of repeating unit represented by formula (VIA), the content of repeating unit represented by formula (IIA) is ordinarily from 5 to 80% by mol, preferably from 10 to 70% by mol, and more preferably from 20 to 65% by mol, in the whole polymer composition.

In the fluorine group-containing resin having at least one of repeating unit represented by formula (IIA) and at least one of repeating unit represented by formula (VIA), the content of repeating unit represented by formula (VIA) is ordinarily from 5 to 80% by mol, preferably from 10 to 70% by mol, and more preferably from 20 to 65% by mol, in the whole polymer composition.

In the fluorine group-containing resins, the content of repeating unit represented by formula (IIIA) is ordinarily from 1 to 40% by mol, preferably from 3 to 35% by mol, and more preferably from 5 to 30% by mol, in the whole polymer composition.

In the fluorine group-containing resins, the content of repeating unit represented by formula (VIIA) is ordinarily from 1 to 40% by mol, preferably from 3 to 35% by mol, and more preferably from 5 to 30% by mol, in the whole polymer composition.

A content of the repeating unit having an acid-decomposable group is preferably from 30 to 70% by mole, more preferably from 35 to 65% by mole, and still more preferably from 40 to 60% by mole, based on the total repeating units of the fluorine group-containing resin.

The resin of Component (B) according to the invention may contain repeating units derived from other copolymerizable monomers in addition to the above-described repeating structural units for the purpose of improving the performances of the positive resist composition.

The copolymerizable monomer, which can be used, includes a compound having one addition polymerizable unsaturated bond selected, for example, from an acrylate, an acrylamide, a methacrylate, a methacrylamide, an allyl compound, a vinyl ether, a vinyl ester, a styrene and a crotonate. In addition, any addition polymerizable unsaturated compound copolymerizable with monomers corresponding to the repeating units described above may be ordinarily employed.

Specific examples of the repeating structural unit represented by any one of formulae (I) to (X) are set forth below, but the invention should not be construed as being limited thereto.

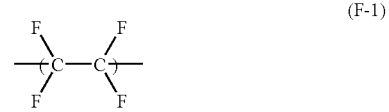
(F-1)

(F-2)

(F-3)

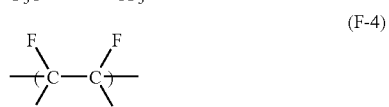
(F-4)

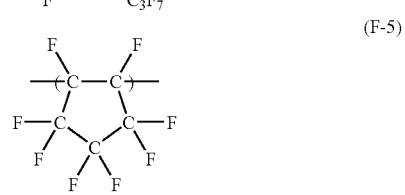
(F-5)

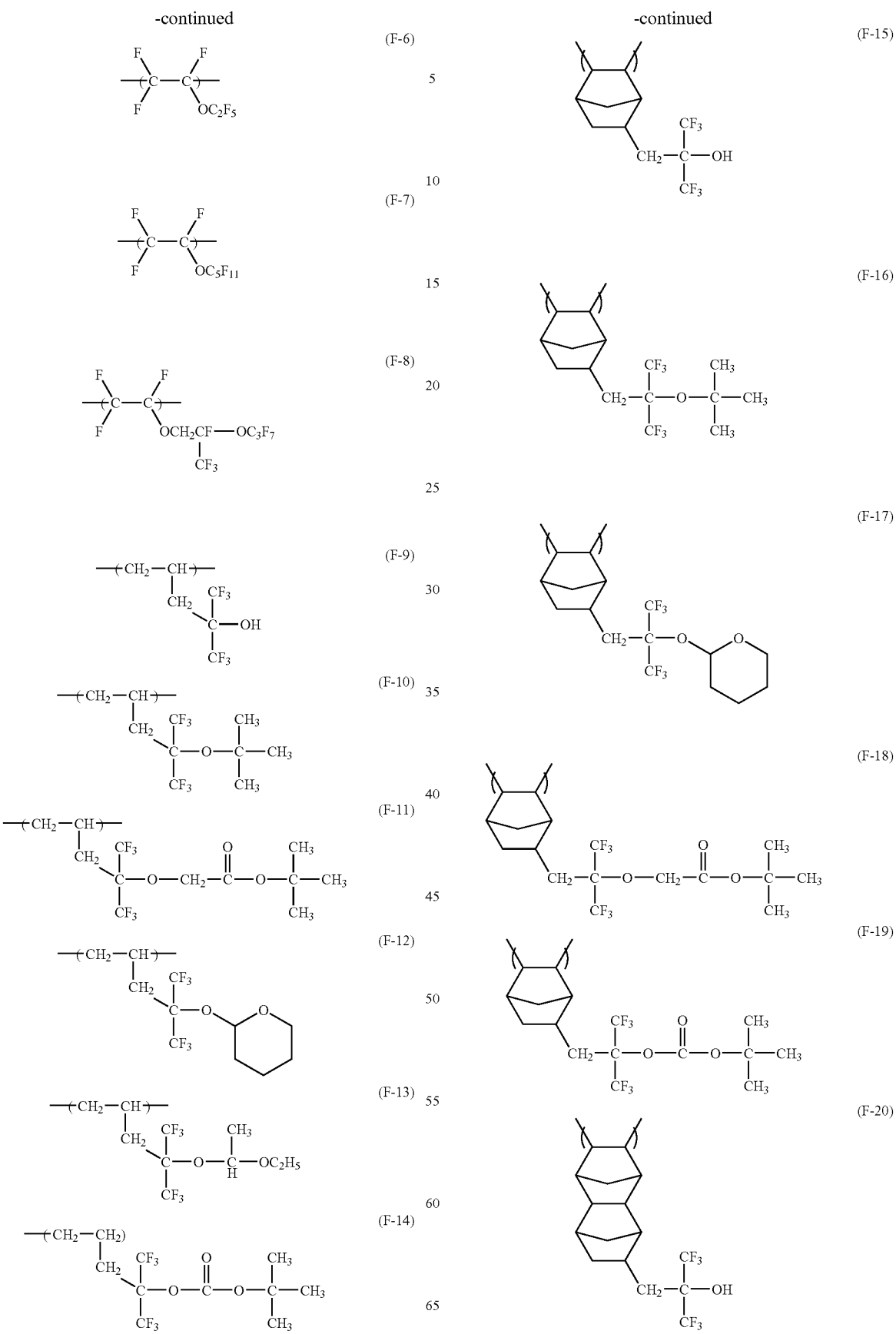

-continued
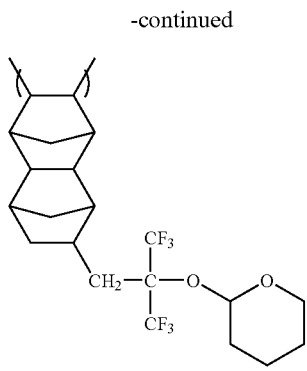
(F-21)
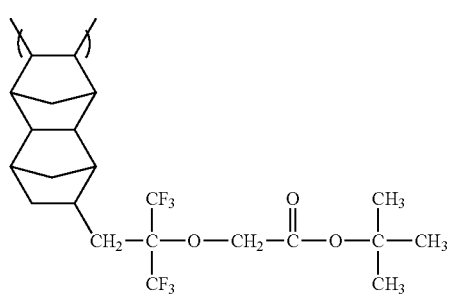
(F-22)
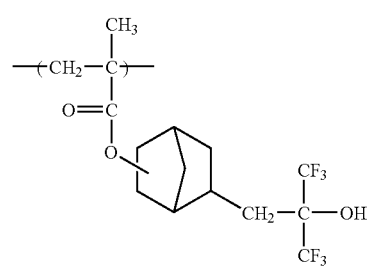
(F-23)
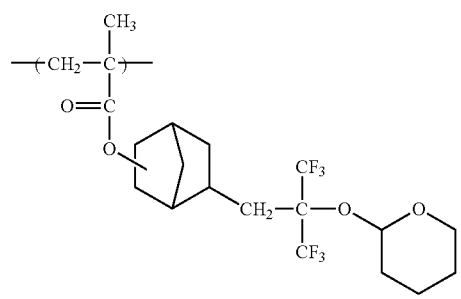
(F-24)
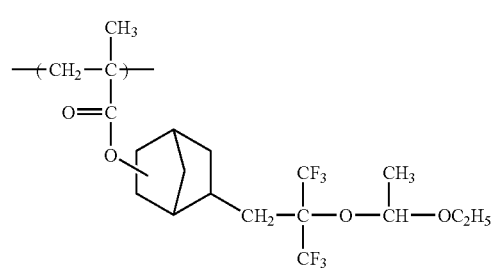
(F-25)
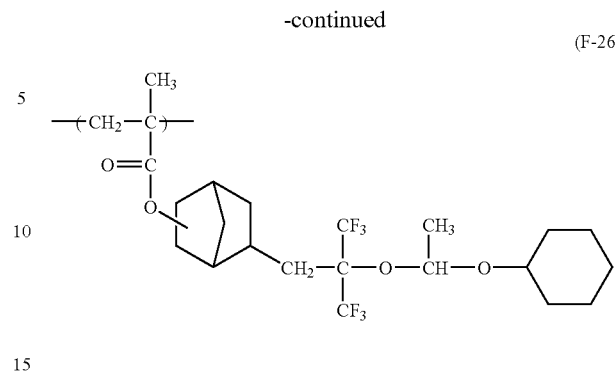
(F-26)
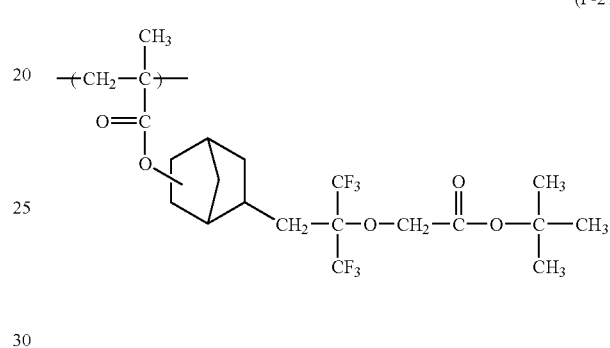
(F-27)
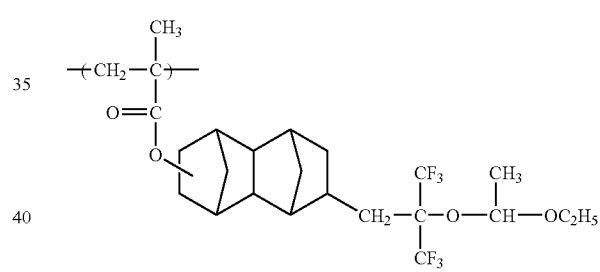
(F-28)
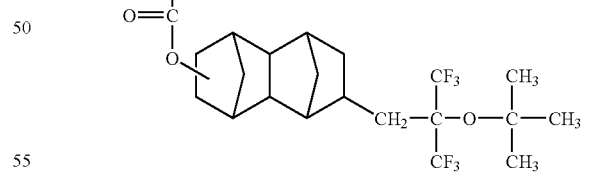
(F-29)
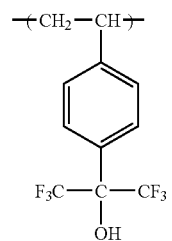
(F-30)

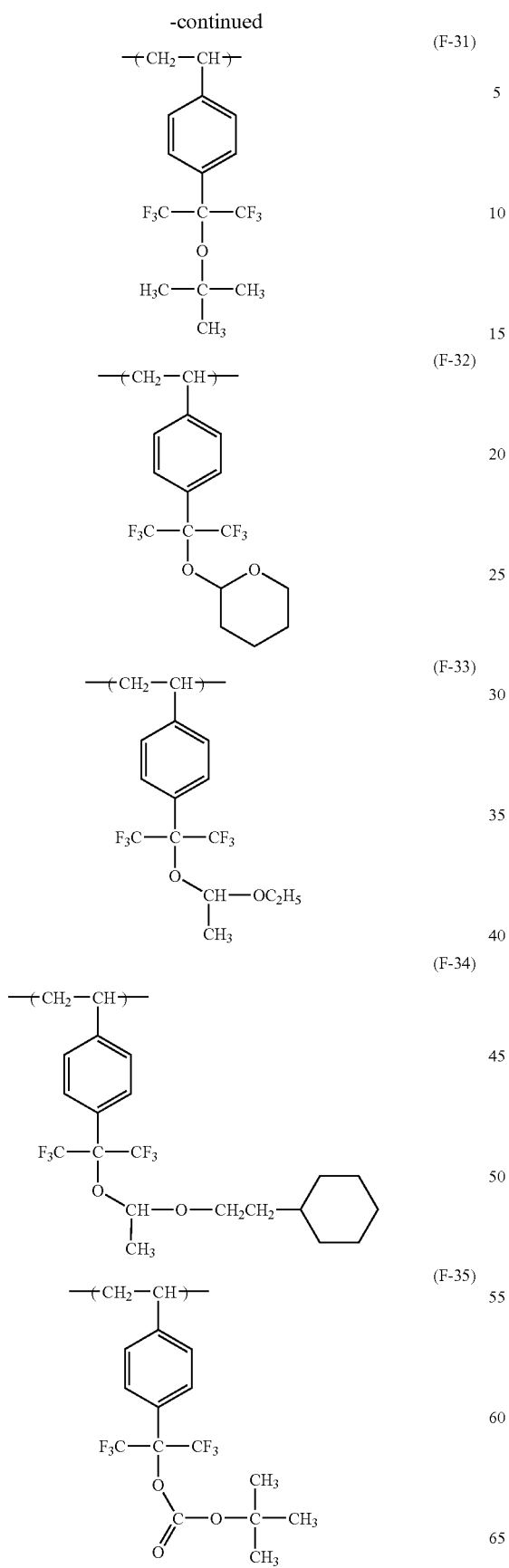
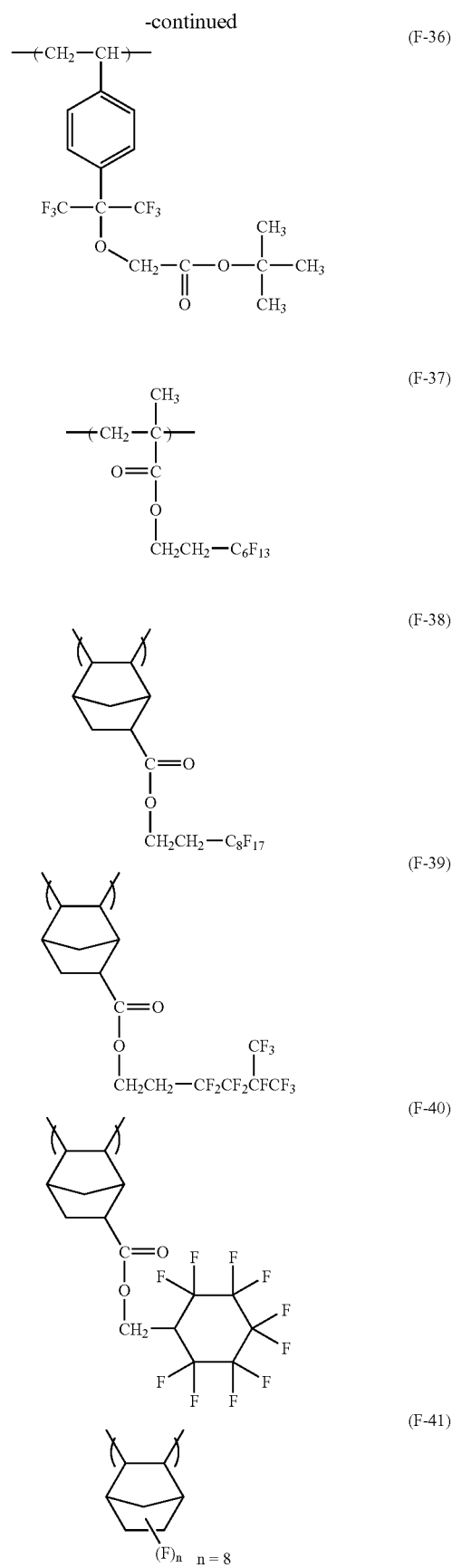

(F-42) 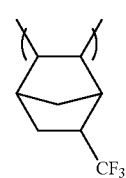
(F-43) 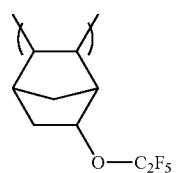
Specific examples of the repeating structural unit represented by any one of formulae (XI) to (XIII) are set forth below, but the invention should not be construed as being limited thereto.
(B-1) 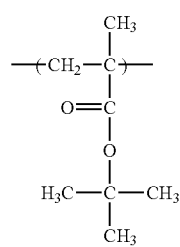
(B-2) 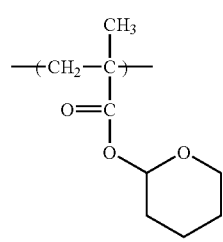
(B-3) 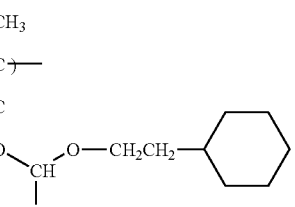
(B-4) 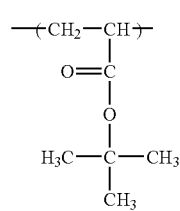
(B-5) 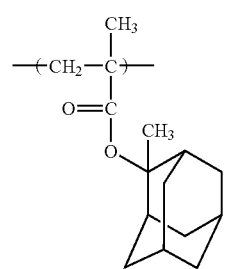
(B-6) 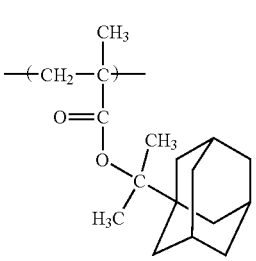
(B-7) 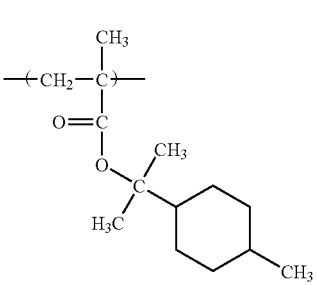
(B-8) 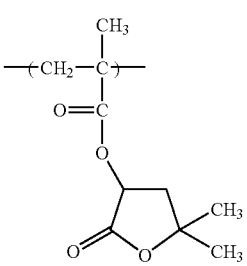
(B-9) 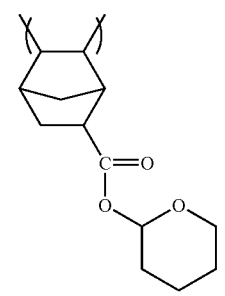

-continued
(B-10)
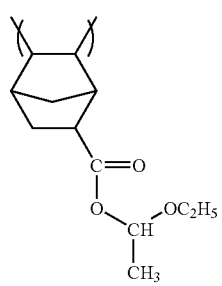
(B-11)
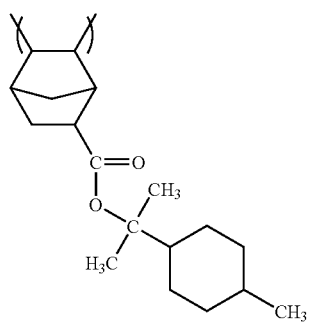
(B-12)
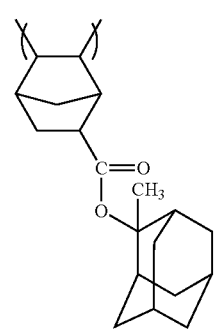
(B-13)
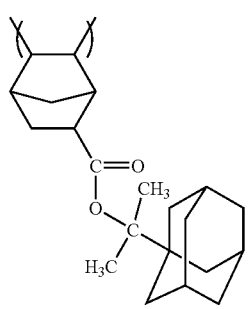
(B-14)
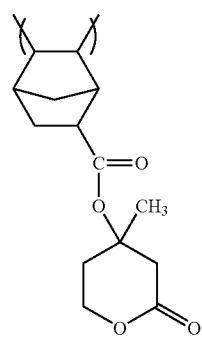
-continued
(B-15)
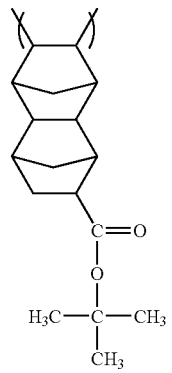
(B-16)
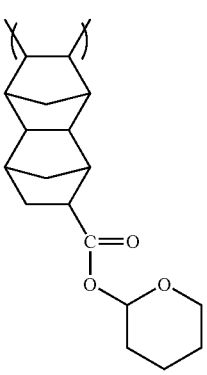
(B-17)
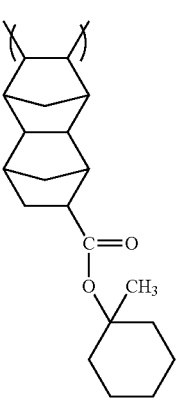
(B-18)
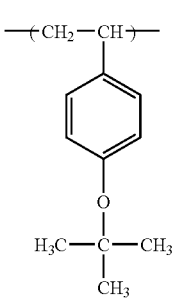

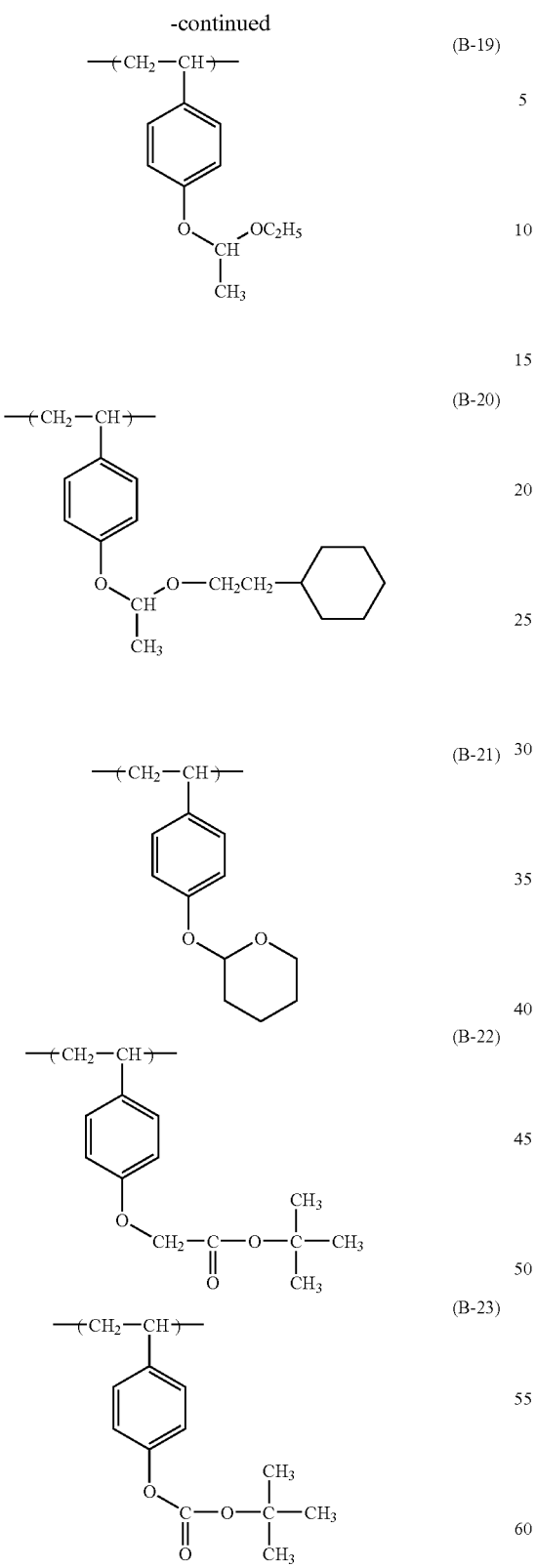
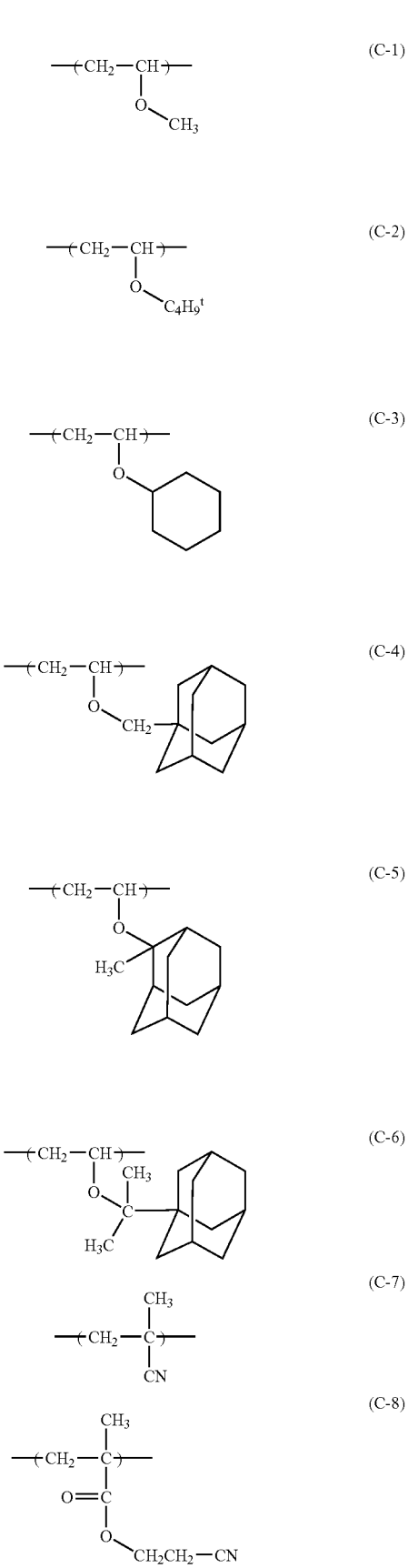
Specific examples of the repeating structural unit represented by any one of formulae (XVI) to (XVII) are set forth below, but the invention should not be construed as being limited thereto.

(C-9)
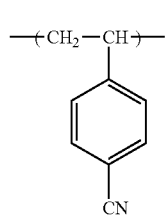
Specific examples of the repeating structural unit represented by formulae (IA) are set forth below, but the invention should not be construed as being limited thereto.
(A-1)
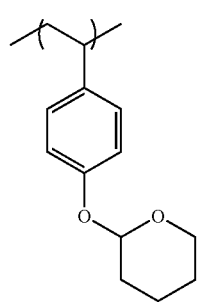
(A-2)
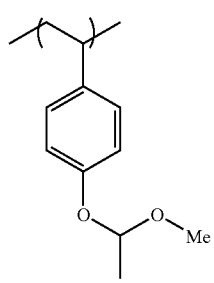
(A-3)
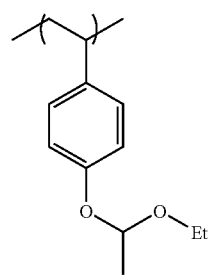
(A-4)
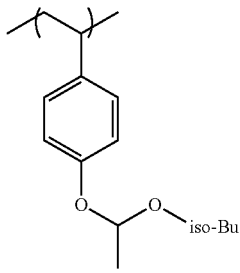
(A-5)
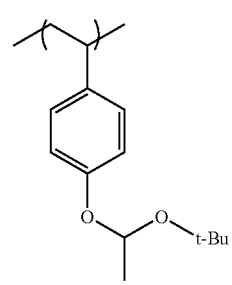
(A-6)
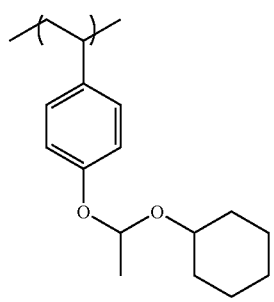
(A-7)
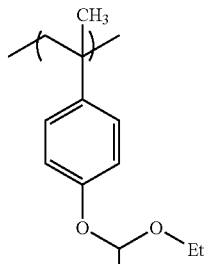
(A-8)
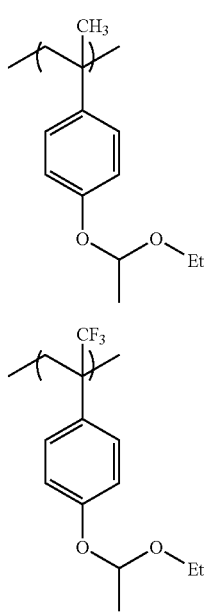
(A-9)
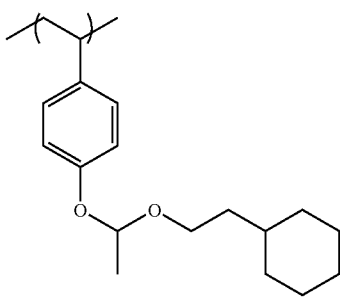

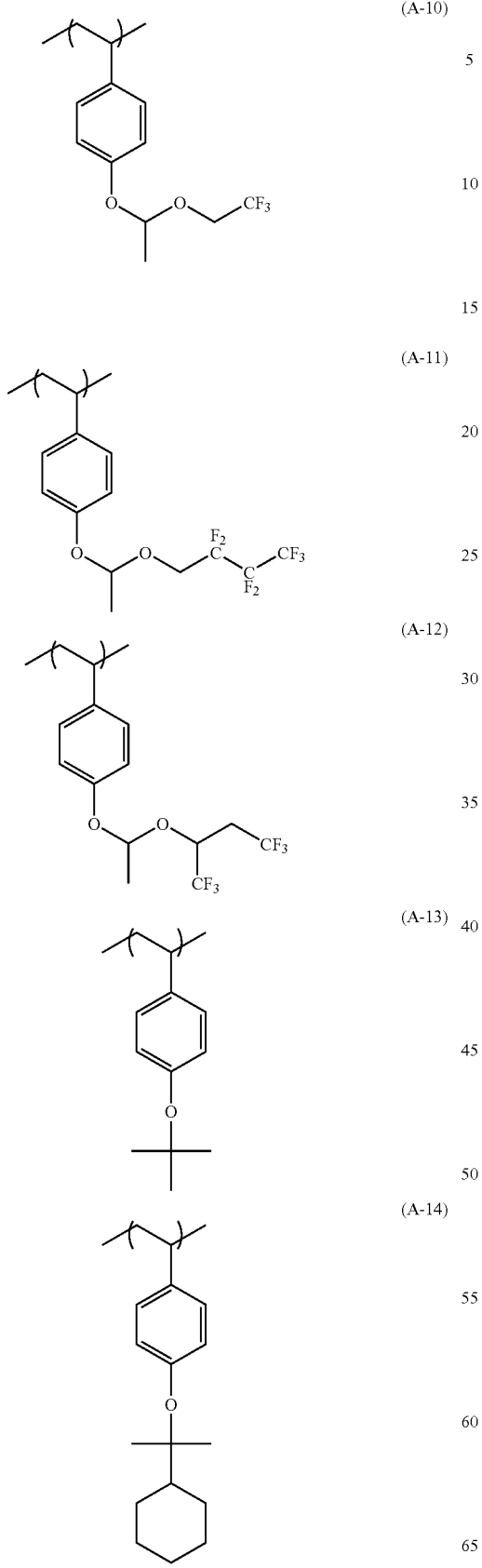
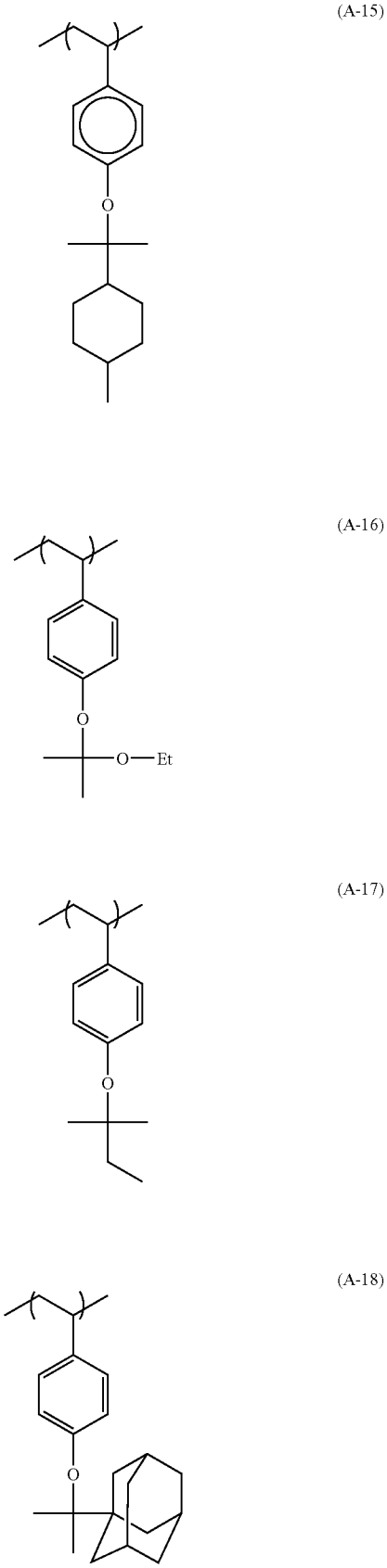

(A-19) 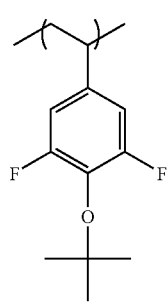
(A-20) 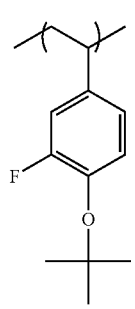
(A-21) 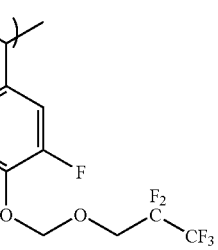
(A-22) 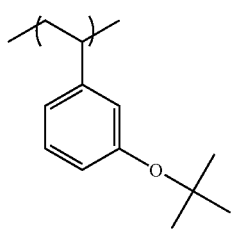
(A-23) 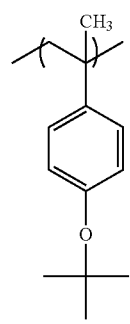
(A-24) 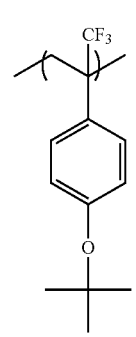
(A-25) 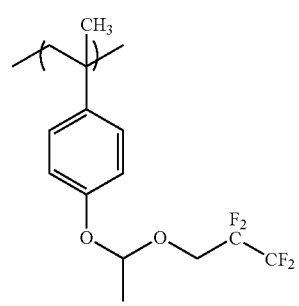
Specific examples of the repeating structural unit represented by formulae (IIA) are set forth below, but the invention should not be construed as being limited thereto.
(IIa-1) 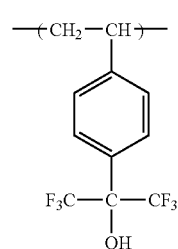
(IIa-2) 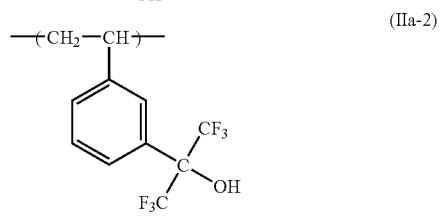
(IIa-3) 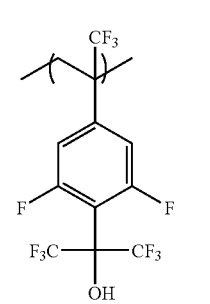

(IIa-4)
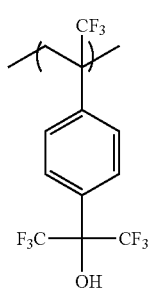
Further, the repeating structural units (F-31) to (F-36) shown hereinbefore are also the specific examples of repeating structural unit represented by formula (IIA).
Specific examples of the repeating structural unit represented by formula (VIA) are set forth below, but the invention should not be construed as being limited thereto.
(B-1)
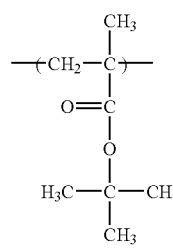
(B-2)
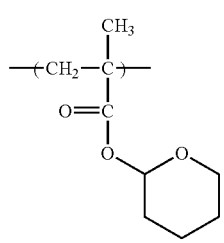
(B-3)
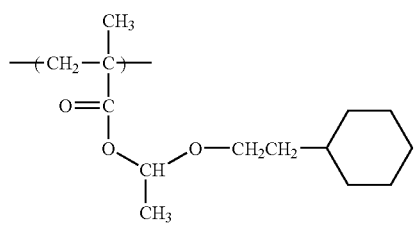
(B-4)
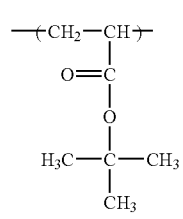
(B-5)
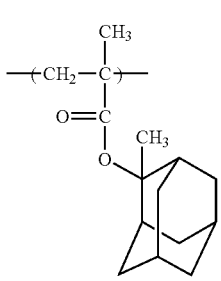
(B-6)
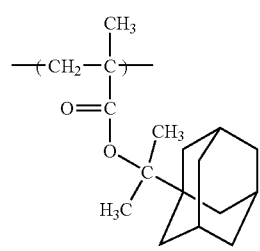
(B-7)
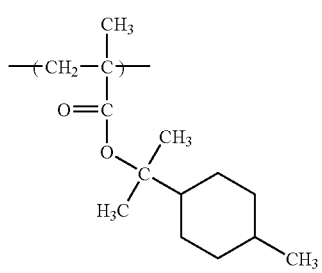
(B-31)
(B-32)
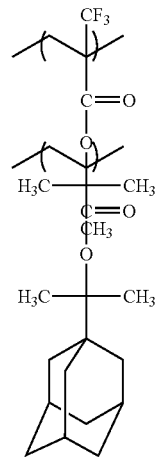

-continued

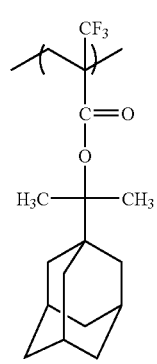
(B-33)

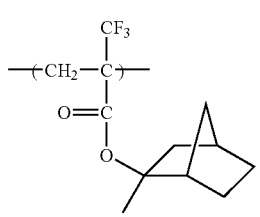
(B-34)

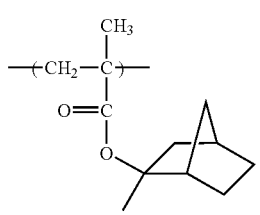
(B-35)

Further, the repeating structural units (F-23) to (F-29) and (F-37) shown hereinbefore are also the specific examples of repeating structural unit represented by formula (VIA).

Specific examples of the repeating structural unit represented by formula (IIIA) are set forth below, but the invention should not be construed as being limited thereto.

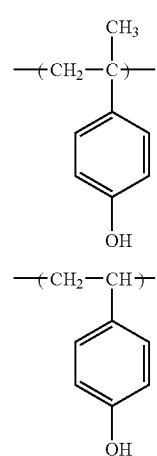
(III-1)

(III-2)

-continued

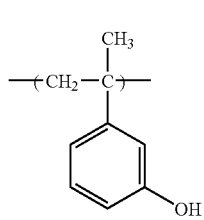
(III-3)

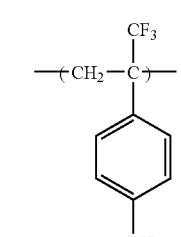
(III-4)

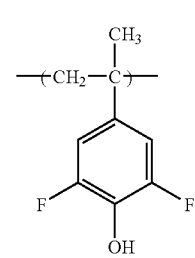
(III-5)

Specific examples of the repeating structural unit represented by formula (VIIA) are set forth below, but the invention should not be construed as being limited thereto.

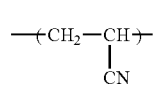
(VII-1)

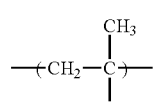
(VII-2)

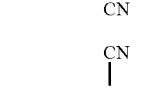
(VII-3)

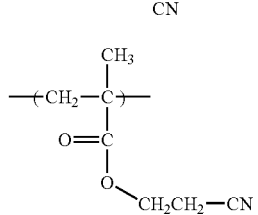
(VII-4)

-continued

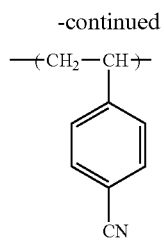
(VII-5)

The acid-decomposable resin (B) for use in the present invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct the resulting powder or solid, thereby obtaining the desired polymer.

The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

The repeating structural units may be used individually or as a mixture of two or more thereof.

Also, the resins (B) may be used individually or as a mixture of two or more thereof in the invention.

A weight average molecular weight of the resin (B) according to the invention is ordinarily from 1,000 to 200,000, preferably from 3,000 to 20,000, measured by a GPC method and calculated in terms of polystyrene.

The molecular weight distribution (Mw/Mn) is ordinarily from 1 to 10, preferably from 1 to 5, still more preferably from 1 to 4. A resin having a smaller molecular weight distribution shows a better resolution, and provides a better resist shape and a smoother sidewall of resist pattern, thereby being excellent in roughness.

A content of the total resins according to the invention in the positive resist composition of the invention is preferably from 40 to 99.99% by weight, more preferably from 50 to 99.97% by weight, based on the total solid content of the resist composition.

<<(C) Compound Having at Least One Group that is Decomposed with an Acid to Generate a Carboxylic Acid and at Least Three Groups Selected from Hydroxy Group and Substituted Hydroxy Group>>

The positive resist composition of the invention contains a compound having at least one group that is decomposed with an acid to generate a carboxylic acid and at least three groups selected from hydroxy group and substituted hydroxy group (hereinafter also referred to as "compound of component (C)").

The group that is decomposed with an acid to generate a carboxylic acid (carboxylic acid-generating group) preferably includes a tertiary ester group and an acetal ester group.

Examples of the tertiary ester group include tert-butyloxycarbonylmethyl, tert-amyloxycarbonylmethyl, tert-butyloxycarbonylethyl and tert-amyloxycarbonylethyl groups.

Examples of the acetal ester group include the following groups:

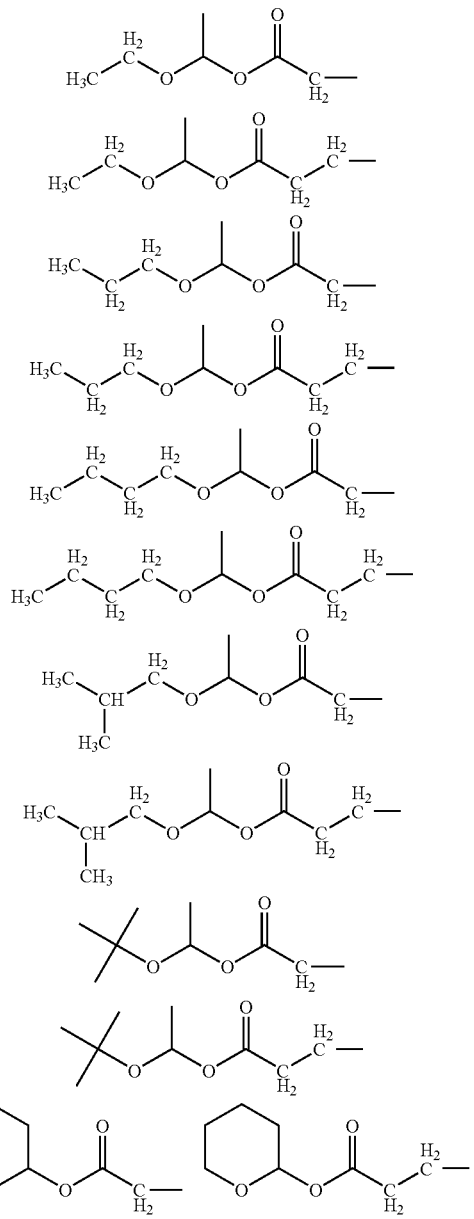

The carboxylic acid-generating group may be connected to any position of the skeleton having at least three groups selected from hydroxy group and substituted hydroxy group described hereinafter. Also, the carboxylic acid-generating group may be contained in the skeleton having at least three groups selected from hydroxy group and substituted hydroxy group described hereinafter. The compound (C) of the invention may contain plurality of the carboxylic acid-generating groups. The compound (C) preferably has one to two carboxylic acid-generating groups per molecule thereof.

The skeleton having at least three groups selected from hydroxy group and substituted hydroxy group means a skeleton having at least three substituents selected from a hydroxy group and a substituted hydroxy group in the molecule thereof.

The skeleton preferably includes a cyclic or linear saccharide derivative. Examples of the saccharide derivative include a 5-membered monosaccharide, a 6-membered monosaccharide, a pseudosaccharide and an analogous saccharide thereto, and these saccharides may be substituted with an acid-decomposable group or other substituent.

The substituted hydroxy group includes a hydroxy group substituted, for example, with an alkyl group, an aralkyl group or an aryl group, that is, an alkoxy group, an aralkyloxy group or an aryloxy group, and a hydroxy group substituted with an acid-decomposable group or other group to form an ether structure.

The acid-decomposable group means a group that is decomposed with an acid and specifically includes an acetal group, a ketal group, a tert-butoxycarbonyl group and a tert-butyl ester group.

Further, two hydroxy groups may be connected to a substituent to form a cyclic ketal or cyclic acetal structure as shown below.

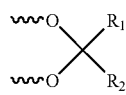

wherein $R_1$ and $R_2$ each independently represent an alkyl group, an aralkyl group or an aryl group, or $R_1$ and $R_2$ may be combined with each other to form a ring. The compound of component (C) according to the invention preferably has at least one of such cyclic ketal structure and cyclic acetal structure in the molecules thereof.

The compound of component (C) according to the invention must have at least three hydroxy or substituted hydroxy groups. The compound preferably has from 3 to 10 hydroxy groups, and more preferably from 4 to 8 hydroxy groups.

Although the compound of component (C) according to the invention may be any compounds that fulfill the above-described requirements, compounds having as skeletons saccharine derivatives, for example, cyclic saccharide derivative or linear saccharide derivative, and analogous compounds thereto are preferably used.

The cyclic saccharide derivative for use in the invention means a saccharide derivative, which contains a cyclic structure, for example, an alicyclic group, as a main skeleton or in a side chain. The cyclic structure preferably includes a 5-membered ring or 6-membered ring, and specifically a cyclohexane ring, a cyclopentane ring and a tetrahydrofuran or tetrahydropyran ring having an ether-oxygen atom.

Specific examples of the skeleton of cyclic saccharide derivative include arabinose, xylose, fucose, rhamnose, galactose, glucose, fructose, fructpyranose, sorbose, mannose, allopyranose, altrose, talose, tagatose, arabinopyranoside, thioagalactopyranose, mannopyranoside, glucopyranose, glucopyranoside, sucrose, paratinose, lactitol, lactose, malturose, maltose, maltoside, maltitol, sellobiose, turanose, trehalose, melibiose, marloriose, melezitose, raffinose, stachyose, maltotetraose, maltohexaose and cyclodextrin.

The linear saccharide derivative for use in the invention means a ring-opening structural compound of conventional saccharide and a compound having a structure similar thereto.

Examples of the skeleton of linear saccharide derivative specifically include threitol, erythritol, adonitol, arabitol, xylitol, sorbitol, mannitol, iditol, dulcitol, erythrose, xylulose, ribulose, deoxyribulose, glycelo-glucoheptose and the compounds shown below.

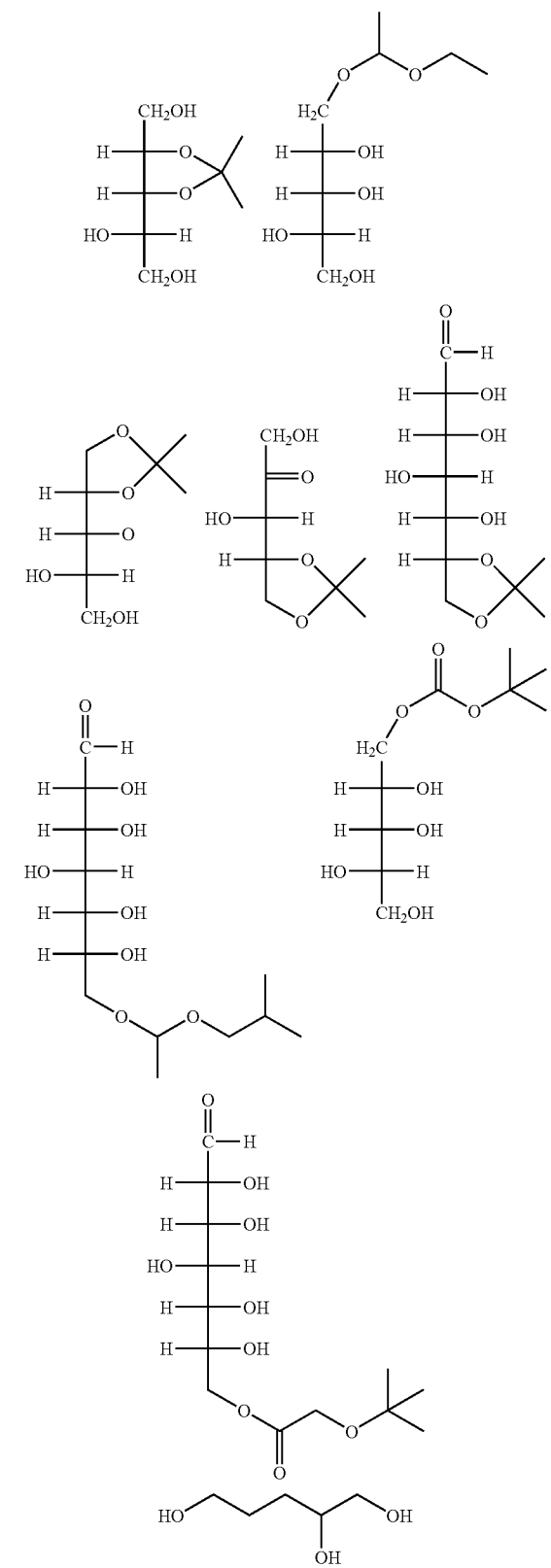

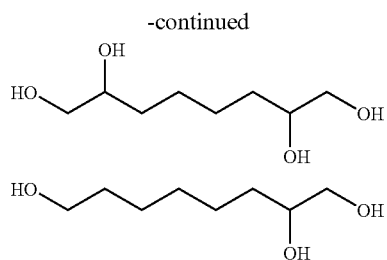
Specific examples of the compound having at least one group that is decomposed with an acid to generate a carboxylic acid and at least three groups selected from hydroxy group and substituted hydroxy group are set forth below, but the invention should not be construed as being limited thereto.
(S-1)
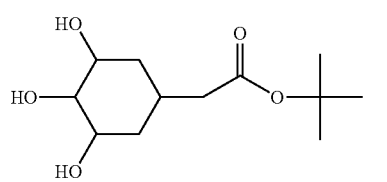
(S-2)
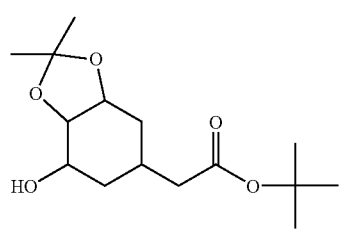
(S-3)
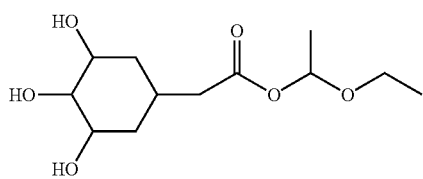
(S-4)
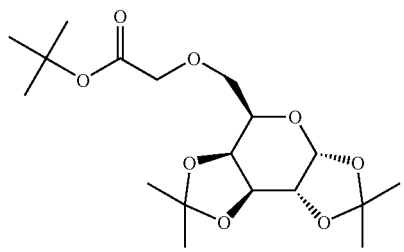
(S-5)
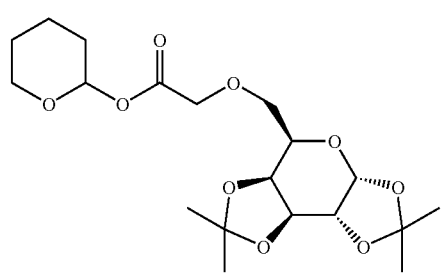
(S-6)
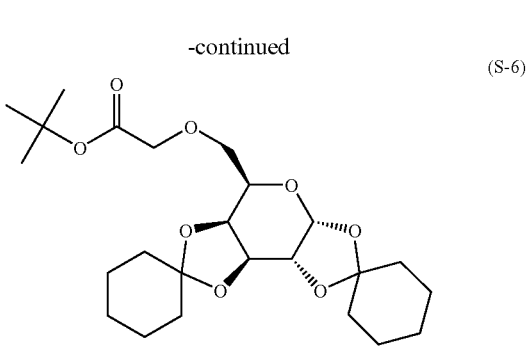
(S-7)
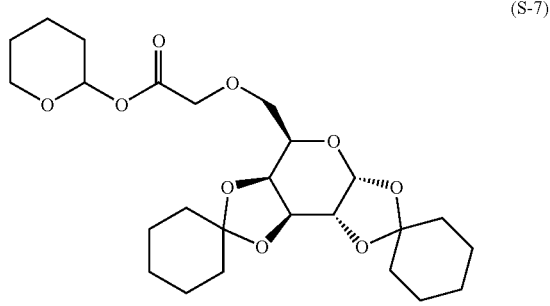
(S-8)
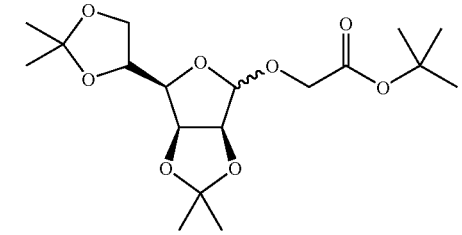
(S-9)
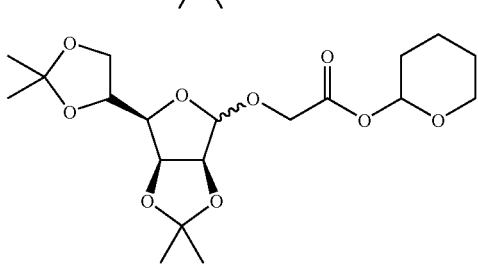
(S-10)
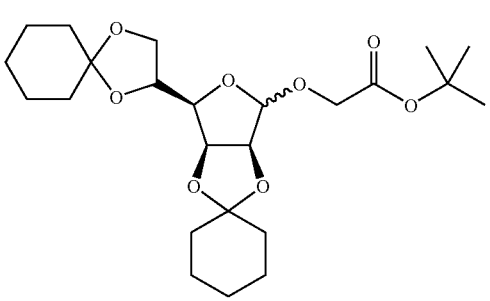

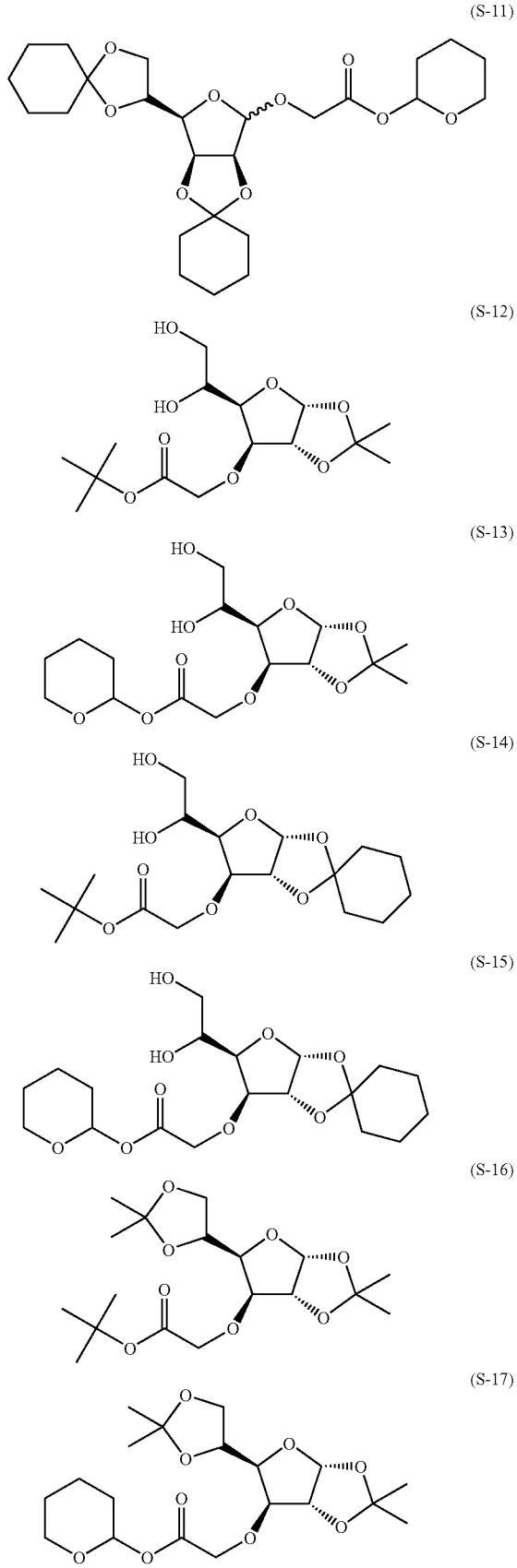
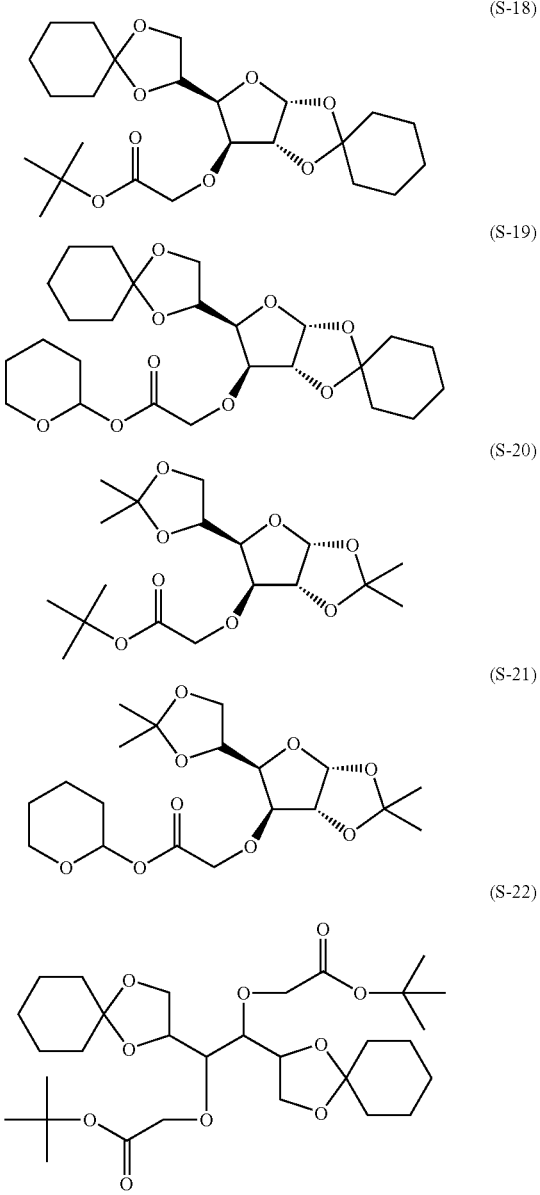

The above-described compounds include all optical isomers thereof when they have the optical isomers depending on the structures. The hydroxy groups of the compound may be substituted with an acid-decomposable group, for example, an acetal group or an isopropylidene group, or other substituent.

However, the invention should not be construed as being limited to these compounds.

The compounds of component (C) may be used individually or in combination of two or more thereof.

A molecular weight of the compound of component (C) is preferably from 150 to 3,000, and more preferably from 150 to 1,000.

A content of the compound of component (C) is preferably from 0.1 to 20% by weight, more preferably from 1 to 15% by weight, based on the solid content of the positive resist composition.

The compounds of component (C) can be synthesized in a conventional manner, for example, by substitution of a commercially available saccharide derivative or the like with a commercially available reagent.

<<Nitrogen-containing Basic Compound>>

It is preferred that the positive resist composition of the invention further contains a nitrogen-containing basic compound.

As the nitrogen-containing basic compound, there may be used, for example, an organic amine, a basic ammonium salt and a basic sulfonium salt that do not deteriorate sublimation property and resist performance.

Of the nitrogen-containing basic compounds, organic amines are preferred in view of providing excellent image performances. For instance, the basic compounds as described, for example, in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a "published Japanese translation of a PCT patent application"), U.S. Pat. Nos. 5,525,453, 5,629,134 and 5,667,938.

Specifically, the nitrogen-containing basic compound includes a structure represented by any one of the following formulae (A) to (E):

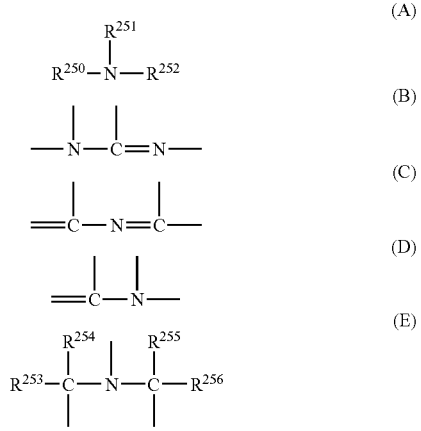

In the above formulae, $R^{250}$ $R^{251}$ and $R^{252}$ which may be the same or different, each represent a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{251}$ and $R^{252}$ may be combined with each other to form a ring.

$R^{253}$, $R^{254}$, $R^{255}$, and $R^{256}$, which may be the same or different, each represent an alkyl group having from 1 to 10 carbon atoms.

A nitrogen-containing basic compound having two or more nitrogen atoms having chemical environment different from each other in one molecule and an aliphatic tertiary amine are more preferred.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, a piperidine, hexamethylenetetramine, an imidazoles, a hydroxypyridine, a pyridine, an aniline, a hydroxyalkylaniline, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine, tridodecylamine, N,N-dihydroxyethylaniline and N-hydroxyethyl-N-ethylaniline.

Of these compounds, organic amines, for example, 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, an imidazole, a hydroxypyridine, a pyridine, an aniline, 4,4'-diaminodiphenyl ether, triethylamine, tributylamine, tripentylamine, tri-n-octylamine, tris(ethylhexyl) amine, tridecylamine, N,N-dihydroxyethylaniline and N-hydroxyethyl-N-ethylaniline are preferred.

A ratio of the acid generator to the nitrogen-containing basic compound used in the positive resist composition is ordinarily from 2.5 to 300, preferably from 5.0 to 200 and more preferably from 7.0 to 150, in terms of a molar ratio of (acid generator)/(nitrogen-containing basic compound).

<<Fluorine-based and/or Silicon-based Surfactant>>

It is preferred that the positive resist composition of the invention further contains one or more of fluorine-based and/or silicon-based surfactants (a fluorine atom-containing surfactant, a silicon atom-containing surfactant and a surfactant containing both a fluorine atom and a silicon atom).

By incorporating the surfactant into the positive resist composition of the invention, resist patterns having good adhesion and less development resist patterns having good adhesion and less development defect with high sensitivity and good resolution can be provided, when an exposure light source of 250 nm or less, especially 220 nm or less is used.

Examples of the surfactant include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants described below may also be used as they are.

Examples of the commercially available surfactant used include fluorine-based or silicon-based surfactants, for example, Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-based surfactant.

As the surfactant, there may be used surfactants using a polymer having a fluoroaliphatic group derived from a fluoroaliphatic compound produced by a teromerization process (also referred to as a teromer process) or an oliogomerization process (also referred to as an oligmer process). The fluoroaliphatic compound can be synthesized according to the process described in JP-A-2002-90991 in addition to the known ones shown above.

As the polymer including a fluoroaliphatic group, a copolymer of a monomer having a fluoroaliphatic group with (poly(oxyalkylene)) acrylate and/or (poly(oxyalkylene)) methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block linkage) or poly(oxyethylene-oxypropylene block linkage) may be used. Further, the copolymer of a monomer having a fluoroaliphatic group with a (poly(oxyalkylene)) acrylate (or methacrylate) may be not only a binary copolymer but also a ternary or more component-containing copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), and copolymers of acrylate (or methacrylate) having a $C_8F_{17}$ group, (poly(oxyethylene)) acrylate (or methacrylate) and (poly(oxypropylene)) acrylate (or methacrylate are exemplified.

The amount of the surfactant used is preferably from 0.0001 to 2% by weight, and more preferably from 0.001 to 1% by weight, based on the total amount of the positive resist composition (excluding a solvent).

<<Organic Solvent>>

The positive resist composition of the invention is used by dissolving the above-described components in an appropriate organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the invention, it is preferred to use, as the organic solvent, a mixed solvent comprises a hydroxy group-containing solvent and a solvent free from a hydroxy group. This makes it possible to reduce the occurrence of particles during storage of the solution of resist composition.

Examples of the hydroxy group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent free from a hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate, 2-heptanone, γ-butyrolactone, cyclohexanone and butyl acetate are particularly preferred, and propylene glycol monomethyl ether acetate, ethyl ethoxypropionate and 2-heptanone are most preferred.

A mixing ratio (by weight) of the hydroxy group-containing solvent to the solvent free from a hydroxy group ranges from 1/99 to 99/1, preferably from 10/90 to 90/10, and more preferably from 20/80 to 60/40. A mixed solvent containing not less than 50% by weight of the solvent free from a hydroxy group is particularly preferred in view of uniformity of coating.

<<Alkali-soluble Resin>>

The positive resist composition of the invention may contain a resin, which does not contain an acid-decomposable group and is insoluble in water but soluble in an alkali developing solution. By the addition of such a resin, sensitivity of the resist composition can be improved.

In the invention, a novolac resin having a molecular weight of from about 1,000 to about 20,000 or a polyhydroxystyrene derivative having a molecular weight of from about 3,000 to about 50,000 is used as such a resin. Since these resins have a large absorption of light of 250 nm or less, they are preferably used after being subjected to partial hydrogenation or in an amount not larger than 30% by weight based on the total amount of resins.

A resin having a carboxy group as an alkali-soluble group is also used. The carboxy group-containing resin preferably has a monocyclic or polycyclic alicyclic hydrocarbon group for improving dry etching resistance. Specific examples of such a resin include a copolymer of methacrylate and (meth) acrylic acid having an alicyclic hydrocarbon structure which does not exhibit acid decomposability and a (meth)acrylate resin containing an alicyclic hydrocarbon group having a carboxy group at the terminal thereof.

<Other Additives>

Into the positive resist composition of the invention, a dye, a plasticizer, a surfactant other than the surfactant described above, a photosensitizer and a compound for promoting dissolution in a developing solution may be incorporated.

The dissolution promoting compound in a developing solution for use in the invention is a low molecular weight compound having a molecular weight of not more than 1,000 and having at least two phenolic hydroxy groups or at least one carboxy group. In case of containing a carboxy group, an alicyclic or aliphatic compound is preferred because of the same reason as described above.

An amount of the dissolution promoting compound used is preferably from 2 to 50% by weight, and more preferably from 5 to 30% by weight, based on the resin of component (B). The amount not more than 50% by weight is preferred in view of inhibiting the development residue and deformation of pattern at the development.

Such a phenolic compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, for example, cholic acid, deoxycholic acid or lithocholic acid, an adamantanecarboxylic acid derivative, adamantanedicarboxylic acid, cyclohexanecarboxylic acid and cyclohexanedicarboxylic acid, but the invention should not be construed as being limited thereto.

In the invention, a surfactant other than the above-described fluorine-based and/or silicon-based surfactant may be used.

Specific examples of such a surfactant include a nonionic surfactant, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surface active agents may be used individually or in combination of two or more thereof.

<<Method for Use>>

The positive resist composition of the invention is used by dissolving the above components in an appropriate organic solvent, preferably. in the mixed solvent described above, and coating the solution on an appropriate substrate.

Specifically, the positive resist composition is coated on a substrate (e.g., silicon/silicon dioxide coating) as used for the production of a precision integrated circuit device by an appropriate coating method, for example, a spinner or a coater.

After the coating, the resulting resist layer is exposed to light through an appropriate mask, followed by baking and development. Thus, good resist patterns are obtained. As light for the exposure, a far ultraviolet ray having preferably a wavelength of 250 nm or shorter, more preferably 220 nm or shorter is used. Specific examples thereof include a KrF excimer laser beam (248 nm), an ArF excimer laser beam (193 nm), an F2 excimer laser beam (157 nm), an X-ray and an electron beam.

In the development step, an alkali developing solution as described below is used. The alkali developing solution for the positive resist composition includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surfactant to the aqueous alkaline solution described above is also used.

An alkali concentration of the alkali developing solution is ordinarily from 0.1 to 20% by weight.

A pH of the alkali developing solution is ordinarily from 10.0 to 14.0.

The present invention will be described in more detail with reference to the following examples, but the invention should not be construed as being limited thereto.

SYNTHESIS EXAMPLE OF COMPOUND OF COMPONENT (C)

Synthesis Example 1

Synthesis of Compound (S-16)

Into a three-necked flask was put 18 g of sodium hydroxide (60% assay), 200 ml of tetrahydrofuran (THF) was added thereto to dissolve (suspend) with stirring. Then, to the reaction solution was added dropwise a solution prepared by dissolving 78.1 g of commercially available diacetone-D-glucose in THF at room temperature. After stirring the mixture at room temperature for 30 minutes, 64.4 g of tert-butyl bromoacetate was added to the mixture, followed by stirring at room temperature for 2 hours.

The reaction mixture was poured into water, and after quenching the excess sodium hydroxide, it was extracted with ethyl acetate, and washed with water. The organic phase was concentrated to obtain a crude desired compound.

The crude desired compound was recrystallized from n-hexane including a small amount of ethyl acetate, thereby obtaining the desired compound as a white crystal.

A melting point of the compound obtained was 97.5 to 99.5° C.

Synthesis Example 2

Synthesis of Compound (S-18)

In the same manner as in Synthesis of Compound (S-16) expect for using commercially available 1,2,5,6-dicyclohexylidene-α-glucofuranose in place of the diacetone-D-glucose, the desired compound was obtained.

A melting point of the compound obtained was 93.0 to 93.5° C.

Other compounds can be synthesized in a similar manner.

Synthesis Example of Resin

Synthesis Example (1)

Synthesis of Resin (1) (Side Chain Type)

2-Ethyl-2-adamantyl methacrylate and butyrolactone methacrylate in a molar ratio of 55/45 were dissolved in a mixed solvent of methyl ethyl ketone and tetrahydrofuran (5/5 by weight) to prepare 100 ml of a solution having a solid concentration of 20% by weight. To the solution was added 2% by mole of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1% by mole of V-65 was again added thereto, followed by stirring for 4 hours. Then, the reaction solution was cooled to room temperature and poured into 3 liters of a mixed solvent of distilled water and isopropyl alcohol (1/1 by weight) to crystallize, and the white powder deposited was recovered to obtain Resin (1).

A polymer component ratio of the resin determined by $C^{13}$NMR was 46/54 by mole. A weight average molecular weight thereof measured by GPC method and calculated in terms of standard polystyrene was 10,700.

Resins (2) to (5) were synthesized in a similar manner to Synthesis Example (1), respectively.

The polymer component ratio and weight average molecular weight of each of Resins (2) to (5) are shown in Table 1 below. In Table 1, Repeating Units 1, 2, 3 and 4 denote the repeating units of Resins (2) to (5) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 42 | 31 | 27 | — | 8,300 |
| 3 | 50 | 20 | 20 | 10 | 11,500 |
| 4 | 40 | 40 | 20 | — | 12,300 |
| 5 | 40 | 40 | 20 | — | 11,300 |

Structures of Resins (1) to (5) are shown below.

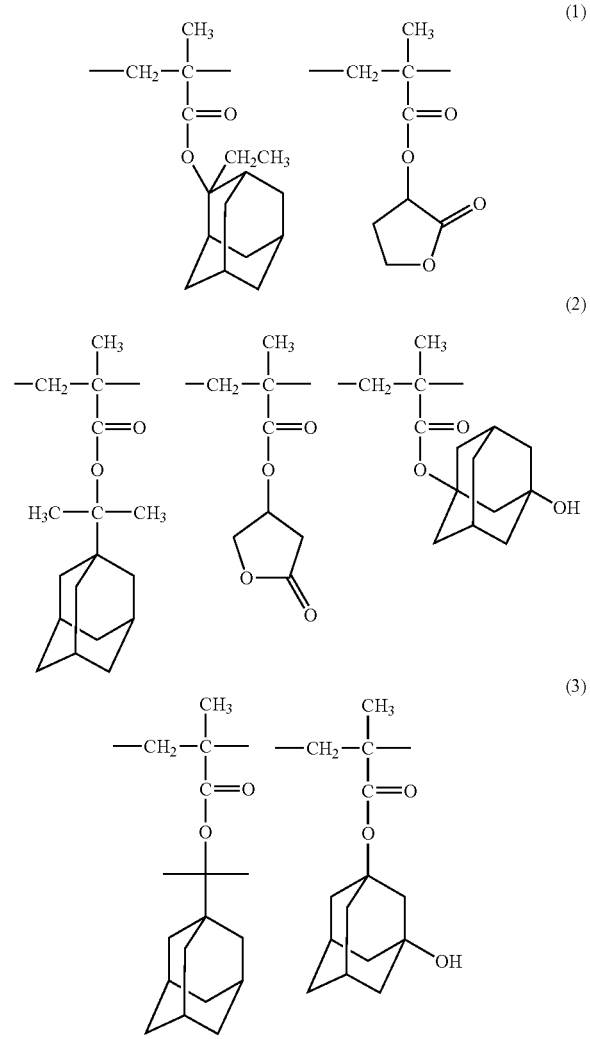

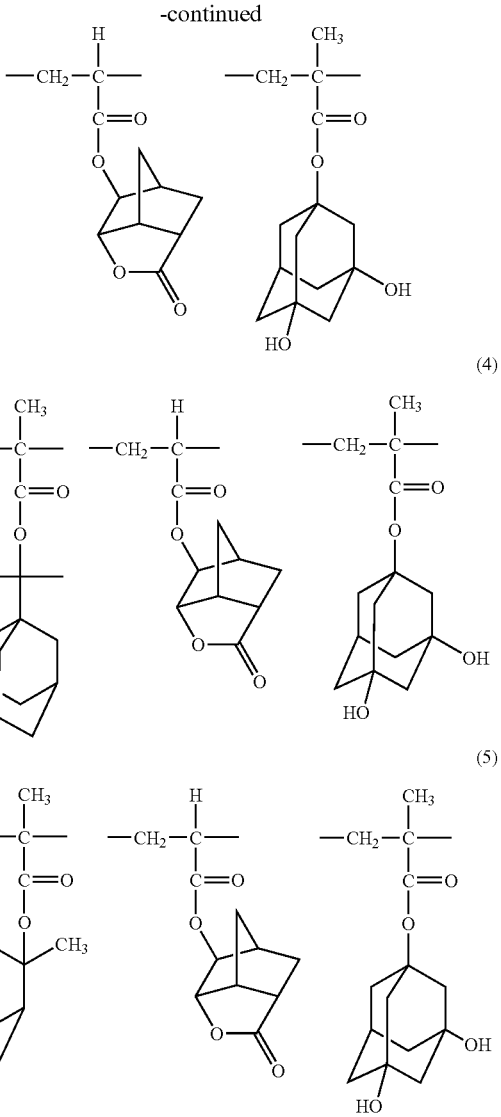

Synthesis Example 2

Synthesis of Resin (6) (Main Chain Type)

Into a separable flask were put tert-butyl ester of norbornenecarboxylic acid, butyrolactone ester of norbornenecarboxylic acid and maleic anhydride in a molar ratio of 40/10/50 and tetrahydrofuran in an amount necessary for forming a solution having a solid content of 60% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 12 hours, the resulting reaction mixture was diluted twice with tetrahydrofuran and poured into a solvent mixture of hexane and isopropyl alcohol (1/1 by weight) to deposit white powder. The powder was collected by filtration and dried to obtain Resin (6).

Resin (6) was subjected to molecular weight analysis by a GPC method and it was found that a weight average molecular weight thereof calculated in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resin (7) was synthesized in a similar manner to Synthesis Example (2). The polymer component ratio and weight average molecular weight of Resin (7) are shown in Table 2 below. In Table 2, Alicyclic Olefin Units 1, 2 and 3 denotes the repeating units of Resin (7) shown below in order from left to right, respectively.

TABLE 2

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 7 | 31 | 6 | 13 | 50 | 8,100 |

Structures of Resins (6) to (7) are shown below.

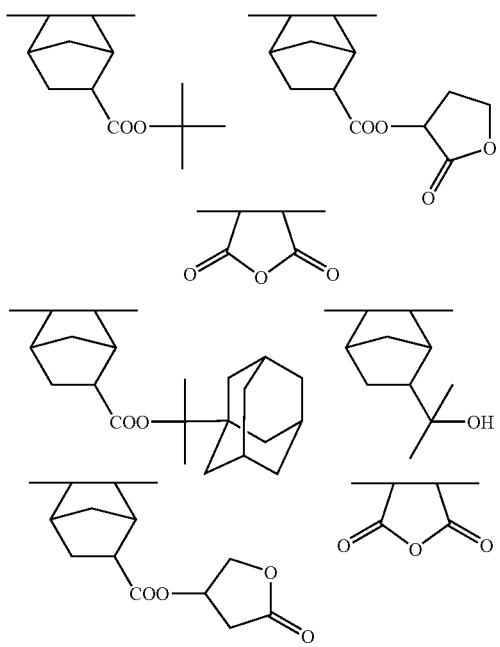

Synthesis Example 3

Synthesis of Resin (8) (Hybrid Type)

Into a reaction vessel were put norbornene, maleic anhydride, tert-butyl acrylate and 2-methylcyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1% by mole of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1 by weight) of five times in volume to reprecipitate. The white powder deposited was collected by filtration and dried to obtain Resin (8).

Resin (8) was subjected to molecular weight analysis by a GPC method and it was found that a weight average molecular weight thereof calculated in terms of polystyrene was 12,100. A molar ratio of repeating units corresponding to the norbornene, maleic anhydride, tert-butyl acrylate and 2-methylcyclohexyl-2-propyl acrylate determined from an NMR spectrum was 32/39/19/10.

Resin (9) was synthesized in a similar manner to Synthesis Example (3). The polymer component ratio and weight average molecular weight of Resin (9) are shown in Table 3 below.

TABLE 3

| Resin | Norbornene Unit (mol %) | Acid Anhydride Unit (mol %) | (Meth)acrylate Unit (mol %) | Weight Average Molecular Weight |
|---|---|---|---|---|
| 9 | 16 | 21 | 36/27 | 13,900 |

Structures of Resins (8) to (9) described above are shown below.

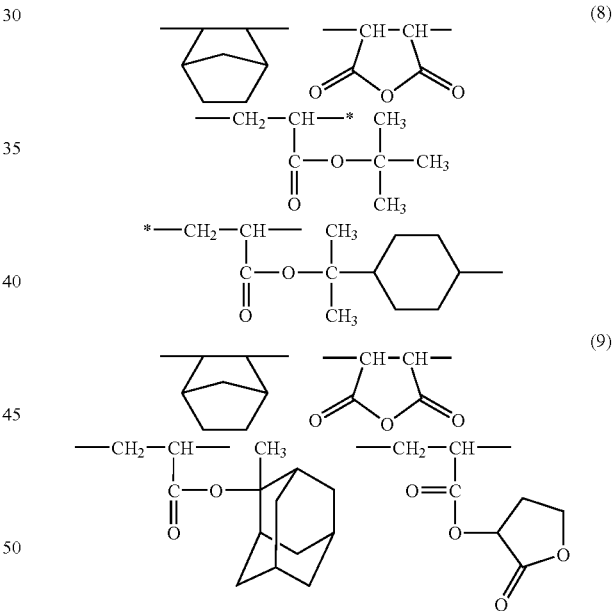

Synthesis Example (4)

Synthesis of Resin (10) (Hybrid Type)

Into a reaction vessel were put tert-butyl ester of norbornenecarboxylic acid, maleic anhydride, 2-methyl-2-adamanthyl acrylate and norbornenelactone acrylate in a molar ratio of 20/20/35/25 and dissolved in a mixed solvent of methyl ethyl ketone and tetrahydrofuran (1/1 by weight) to form a solution having a solid content of 60% by weight, and the solution was heated at 65° C. under a nitrogen gas stream.

After the reaction temperature was stabilized, 3% by mole of a radical initiator (V-601 manufactured by Wako Pure Chemical Industries, Ltd.) was added to initiate a reaction. After heating for 12 hours, the reaction mixture was poured into hexane of five times in volume to deposit white powder. The powder was collected by filtration and dissolved in a mixed solvent of methyl ethyl ketone and tetrahydrofuran (1/1 by weight) and the solution was poured into a mixed solvent of hexane and tert-butyl methyl ether (1/1 by weight) of five times in volume to deposit white powder. The white powder deposited was collected by filtration. The procedures were repeated again, followed by drying to obtain the desired Resin (10).

Resin (10) was subjected to molecular weight analysis (RI analysis) by a GPC method and it was found that a weight average molecular weight thereof calculated in terms of polystyrene was 11,600. An amount of the remaining monomer was 0.4%. A molar ratio of repeating units corresponding to the tert-butyl ester of norbornenecarboxylic acid, maleic anhydride, 2-methyl-2-adamanthyl acrylate and norbornenelactone acrylate determined from an NMR spectrum was 18/23/34/25.

Resin (11) was synthesized in a similar manner to Synthesis Example (4). The polymer component ratio and weight average molecular weight of Resin (11) are shown in Table 4 below.

TABLE 4

| Resin | Alicyclic Olefin Unit (mol %) | Acid Anhydride Unit (mol %) | Acrylate Unit (mol %) | Weight Average Molecular Weight |
|---|---|---|---|---|
| 11 | 22 | 27 | 28/23 | 11,300 |

Structures of Resins (10) to (11) described above are shown below.

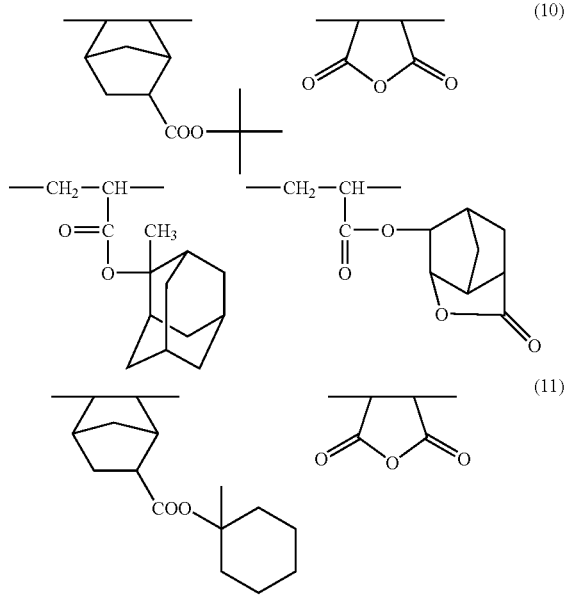

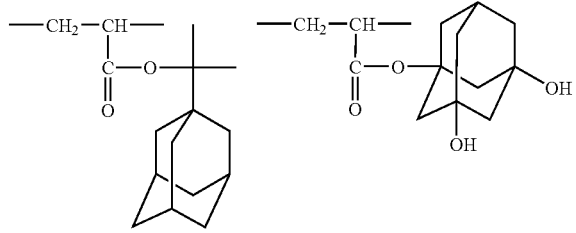

-continued

Synthesis Example (5)

Synthesis of Resin (F1)

In a one-liter autoclave was charged 150 ml of a 1,1,2-trichloro-trifluoroethane solution containing 9.4 g (0.10 mol) of norbornene and 19.4 g (0.10 mol) of tert-butyl ester of norbornene-2-carboxylic acid and the autoclave was pressurized with nitrogen gas at 200 psi. Then, 20 g (0.20 mol) of tetrafluoroethylene was charged and the mixture was heated at 50° C. with stirring. To the reaction solution was charged 15 ml of a 1,1,2-trichloro-trifluoroethane solution containing 1.2 g of di(4-tert-butylcyclohexyl)peroxydicarbonate over a period of 20 minutes, followed by continuing to stir for 20 hours. After the completion of the reaction, the reaction solution was poured into 2 liters of methanol with vigorously stirring to deposit a white resin. The resin deposited was collected by filtration and dried in vacuo to obtain 23.5 g of Resin (F1) according to the present invention.

The weight average molecular weight (Mw) of Resin (F1) measured by GPC was 6,200. As a result of examining the composition of Resin (F1) by means of $C^{13}$-NMR measurement, it was found that a molar ratio of structural units (F-1)/norbornene/tert-butyl ester of norbornene-2-carboxylic acid was 45/30/25.

Synthesis Example (6)

Synthesis of Resin (F2)

In 30 ml of 1-methoxy-2-propanol were dissolved 6.7 g (0.015 mol) of Monomer (b) shown below, 1.4 g (0.006 mol) of 2-methyl-2-adamanthane methacrylate and 1.8 g (0.009 mol) of mevalonic lactone methacrylate. To the solution were added dropwise 0.1 g of 2,2'-azobis(2,4-dimethylvaleronitrile) (V-65 manufactured by Wako Pure Chemical Industries, Ltd.) as a polymerization initiator and 70 ml of 1-methoxy-2-propanol solution containing 15.6 g (0.035 mol) of Monomer (b), 3.3 g (0.014 mol) of 2-methyl-2-adamanthane methacrylate and 4.2 g (0.021 mol) of mevalonic lactone methacrylate at 70° C. under nitrogen atmosphere with stirring over a period of 2 hours. After the reaction for 2 hours, 0.1 g of the polymerization initiator was further added, followed by reacting for 2 hours. The temperature of reaction solution was raised to 90° C., followed by continuing to stir for one hour. The reaction solution was allowed to cool and poured into one liter of a mixture of ion-exchanged water and methanol (1/1 by weight) with vigorously stirring to deposit a white resin. The resin deposited was collected by filtration and dried in vacuo to obtain 15.8 g of Resin (F2) according to the present invention.

The weight average molecular weight (Mw) of Resin (F2) measured by GPC was 10,200. As a result of examining the composition of Resin (F2) by means of $C^{13}$-NMR measurement, it was found that a molar ratio of structural units (F-24)/(B-5)/mevalonic lactone methacrylate was 48/21/31.

Monomer (b)

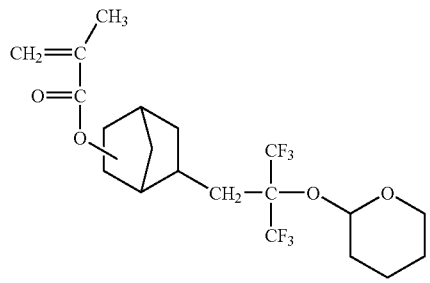

Synthesis Example (7)

Synthesis of Resin (F3)

In a one-liter autoclave was charged 150 ml of a 1,1,2-trichloro-trifluoroethane solution containing 9.4 g (0.10 mol) of norbornene and 35.8 g (0.10 mol) of Monomer (a) shown below and the autoclave was pressurized with nitrogen gas at 200 psi. Then, 20 g (0.20 mol) of tetrafluoroethylene was charged and the mixture was heated at 50° C. with stirring. To the reaction solution was charged 15 ml of a 1,1,2-trichloro-trifluoroethane solution containing 1.2 g of di(4-tert-butylcyclohexyl)peroxydicarbonate over a period of 20 minutes, followed by continuing to stir for 20 hours. After the completion of the reaction, the reaction solution was poured into 2 liters of methanol with vigorously stirring to deposit a white resin. The resin deposited was collected by filtration and dried in vacuo to obtain 37.4 g of Resin (F3) according to the present invention.

The weight average molecular weight (Mw) of Resin (F3) measured by GPC was 8,800. As a result of examining the composition of Resin (F3) by means of $C^{13}$-NMR measurement, it was found that a molar ratio of structural units (F-1)/(F-17)/norbornene was 48/30/22.

Monomer (a)

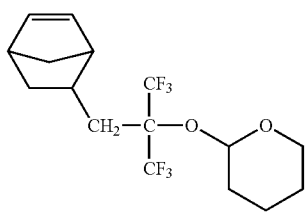

Synthesis Example (8)

Synthesis of Resin (F4)

In the same manner as in Synthesis Example 7 except for using 32.2 g (0.04 mol) of Monomer (c) shown below in place of Monomer (a) in Synthesis Example 7, 34.1 g of Resin (F4) according to the present invention was synthesized.

The weight average molecular weight (Mw) of Resin (F4) measured by GPC was 7,400. As a result of examining the composition of Resin (F4) by means of $C^{13}$-NMR measurement, it was found that a molar ratio of structural units (F-1)/(F-11)/norbornene was 49/25/26.

Monomer (c)

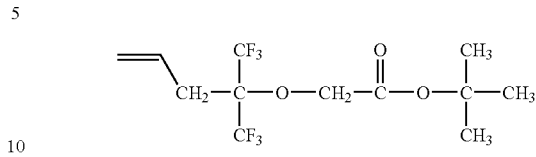

Synthesis Example (9)

Synthesis of Resin (F5)

In a 100-ml, three necked flask equipped with a reflux condenser and a nitrogen inlet pipe were charged 4-(2-hydroxyhexafluoroisopropyl)styrene (manufactured by Central Glass Co., Ltd.) and 4-(1-methoxyethoxy)styrene (manufactured by Tosoh Corp.) in a molar ratio of 50/50 and tetrahydrofuran was added thereto to prepare 30 g of a reaction solution having the monomer concentration of 30% by weight. The reaction solution was heated to 65° C. with stirring under nitrogen atmosphere. Then, an azo polymerization initiator (V-65 manufactured by Wako Pure Chemical Industries, Ltd.) was added thereto in an amount corresponding to 5.0% by mole based on the total molar amount of the above-described two kinds of monomers, followed by reacting with stirring under nitrogen atmosphere for 8 hours. To the resulting reaction solution was added 200 ml of hexane, the polymer synthesized was deposited in the solution to separate the unreacted monomer, thereby purifying the polymer. The composition of Resin (F5) determined by means of $C^{13}$-NMR measurement was 49/51 in a molar ratio.

As a result of analyzing the resin by GPC (using tetrahydrofuran (THF) as the solvent) and being calculated in terms of standard polystyrene, it was found that the weight average molecular weight was 10,200, the degree of dispersion was 2.20 and the ratio of component having the molecular weight of 1,000 or less in the resin was 15% by weight.

Synthesis Example (10)

Synthesis of Resin (k-1)

Poly-p-hydroxystyrene (VP-15000 manufactured by Nippon Soda Co., Ltd.) (100 g) and propylene glycol monomethyl ether acetate (PGMEA) (400 g) were dissolved in a flask and the solution was subjected to distillation under a reduced pressure to remove water and PGMEA by azeotropic distillation.

After confirming a sufficiently low water content, ethyl vinyl ether (25.0 g) and p-toluenesulfonic acid (0.02 g) were added to the solution, followed by stirring at room temperature for one hour. To the reaction solution was added triethylamine (0.03 g) to terminate the reaction. Water (400 ml) and ethyl acetate (800 ml) were added thereto, and subjected to separation. The ethyl acetate phase was washed with water and subjected to distillation under a reduced pressure to remove ethyl acetate, water and an azeotropic distillation amount of PGMEA, thereby obtaining Resin (k-1) having the substituent according to the invention as the 30% PGMEA solution.

Resins (k-2) to (k-15) shown in Table 5 below were synthesized in a similar manner to Synthesis Example (10), respectively.

The polymer component ratio and weight average molecular weight of each of Resins (k-1) to (k-15) are shown in Table 5.

TABLE 5

| Resin | Molecular Weight | Ratio of Repeating Unit Shown Hereinbefore |
|---|---|---|
| k-1 | 17,000 | 40/60 |
| k-2 | 17,000 | 27/73 |
| k-3 | 17,000 | 23/77 |
| k-4 | 17,000 | 35/65 |
| k-5 | 17,000 | 20/80 |
| k-6 | 17,000 | 35/55/10 |
| k-7 | 17,000 | 27/63/10 |
| k-8 | 17,000 | 18/72/10 |
| k-9 | 17,000 | 30/60/10 |
| k-10 | 17,000 | 20/75/5 |
| k-11 | 12,000 | 70/30 |
| k-12 | 13,000 | 10/60/30 |
| k-13 | 14,000 | 15/60/25 |
| k-14 | 17,000 | 35/65 |
| k-15 | 17,000 | 30/10/60 |

Examples 1 to 24 and Comparative Examples 1 to 4

(Preparation and Evaluation of Positive Resist Composition)

In each of Examples 1 to 24 and Comparative Examples 1 to 4, an acid generator (A) in an amount as shown in Table 6 below, 1.03 g of a resin (B), 0.03 g of Compound (C) according to the invention, 1.65 mg (in total) of a nitrogen-containing basic compound and a surfactant (100 ppm based on the total components) were blended as shown in Table 6 and dissolved in propylene glycol monomethyl ether acetate/propylene glycol monomethyl ether (7/3 by weight) to prepare a solution having a solid content of 11% by weight, then the resulting solution was filtered through a microfilter having a pore size of 0.1 μm, whereby a positive resist composition was prepared.

[Evaluation Test]

An anti-reflective coating (ARC-25 manufactured by Brewer Science, Inc.) was coated on a silicon wafer at a thickness of 30 nm by a spin coater and dried. Then, each of the positive resist compositions described above was coated thereon by a spin coater and dried at 115° C. for 90 seconds to form a positive resist film having a thickness of about 0.4 μm. The positive resist film was subjected to exposure with an ArF excimer laser beam (193 nm) in case of Examples 1 to 10 and Comparative Example 1, a KrF excimer laser beam (248 nm) in case of Examples 11 to 14 and Comparative Example 2, an EB irradiation apparatus (157 nm) in case of Examples 15 to 19 and Comparative Example 3, and a VUVES apparatus in case of Examples 20 to 24 and Comparative Example 4, respectively.

The exposed positive resist film was subjected to heat treatment after exposure at 115° C. for 90 seconds, developed with a 2.38% aqueous tetramethylammonium hydroxide solution, and rinsed with distilled water to obtain a resist pattern profile.

With respect to each resist pattern profile, line edge roughness and scum were evaluated in the following manner. The results of evaluation are shown in Table 6 below.

[Line Edge Roughness (LER)]:

The evaluation of line edge roughness was conducted by measuring the edge roughness of line and space (linewidth of 0.13 μm in case of Examples 1 to 10 and Comparative Example 1, linewidth of 0.15 μm in case of Examples 11 to 14 and Comparative Example 2, linewidth of 0.13 μm in case of Examples 15 to 19 and Comparative Example 3, and linewidth of 0.20 μm in case of Examples 20 to 24 and Comparative Example 4) using a critical dimension scanning electron microscope (CD-SEM). Specifically, the line pattern edge was detected in multiple positions in the measuring monitor and the dispersion ($3\sigma$) at the multiple positions of detection was used an index of the line edge roughness. As the value is smaller, the line edge roughness is better.

[Scum]:

The scum was evaluated by a degree of the development residue (scum) in the formation of resist pattern profile described above. The case wherein no development residue was observed is evaluated as "A", the case wherein the development residue was considerably observed is evaluated as "C" and the case of intermediate therebetween is evaluated as "B".

TABLE 6

| | Resin (B) | Acid Generator (A) | Compound (C) of Invention | Nitrogen-Containing Basic Compound (weight ratio) | Surfactant | LER (nm) | Scum |
|---|---|---|---|---|---|---|---|
| Example 1 | (1) | Z34 (16) | S-4 | N-1 | W-1 | 7.2 | A |
| Example 2 | (2) | Z34 (16) Z31 (32) | S-6 | N-2 | W-2 | 7.1 | A |
| Example 3 | (3) | Z33 (16) | S-9 | N-3 | W-3 | 6.9 | A |
| Example 4 | (4) | Z33 (20) | S-10 | N-4 | W-4 | 7.0 | A |
| Example 5 | (5) | Z34 (16) | S-12 | N-5 | W-1 | 6.8 | A |
| Example 6 | (6) | Z33 (16) Z40 (32) | S-14 | N-6 | W-2 | 7.0 | A |
| Example 7 | (7) | Z14 (20) | S-18 | N-7 | W-3 | 6.3 | A |
| Example 8 | (8) | Z33 (16) Z31 (32) | S-20 | N-8 | W-4 | 7.1 | A |
| Example 9 | (9) | Z33 (16) Z31 (32) | S-22 | N-9 | W-1 | 7.2 | A |
| Example 10 | (10) | Z33 (16) Z31 (32) | S-7 | N-10 | W-2 | 6.9 | A |
| Example 11 | K1 | Z33 (16) Z31 (32) | S-11 | N-1 | W-3 | 7.0 | A |
| Example 12 | K6 | Z33 (16) Z31 (32) | S-15 | N-2 | W-4 | 6.8 | A |

TABLE 6-continued

| | Resin (B) | Acid Generator (A) | Compound (C) of Invention | Nitrogen-Containing Basic Compound (weight ratio) | Surfactant | LER (nm) | Scum |
|---|---|---|---|---|---|---|---|
| Example 13 | K10 | Z33 (16) | S-18 | N-5 | W-2 | 7.1 | A |
| Example 14 | K15 | Z14 (20) | S-19 | N-7 | W-3 | 7.0 | A |
| Example 15 | K2 | Z34 (16) Z31 (32) | S-20 | N-5/N-9 (1/1) | W-1 | 7.1 | A |
| Example 16 | K7 | Z34 (25) Z26 (10) | S-21 | N-5/N-9 (1/1) | W-2 | 7.2 | A |
| Example 17 | K5 | Z1 (15) Z2 (15) | S-15 | N-5/N-9 (1/1) | W-3 | 7.0 | A |
| Example 18 | K3 | Z1 (15) Z2 (15) | S-17 | N-5/N-9 (1/1) | W-4 | 6.9 | A |
| Example 19 | K1 | Z1 (15) Z36 (20) | S-22 | N-2/N-7 (1/1) | W-1 | 7.0 | A |
| Example 20 | F1 | Z8 (15) Z29 (15) | S-20 | N-3/N-8 (1/1) | W-2 | 6.8 | A |
| Example 21 | F2 | Z34 (16) Z31 (32) | S-18 | N-5/N-11 (1/1) | W-3 | 7.0 | A |
| Example 22 | F3 | Z34 (25) Z26 (10) | S-16 | N-5/N-11 (1/1) | W-4 | 7.2 | A |
| Example 23 | F4 | Z1 (15) Z2 (15) | S-15 | N-5/N-11 (1/1) | W-1 | 7.2 | A |
| Example 24 | F5 | Z1 (15) Z2 (15) | S-17 | N-5/N-12 (1/1) | W-2 | 7.1 | A |
| Comparative Example 1 | (1) | Z34 (16) | J | N-1 | W-1 | 19.0 | C |
| Comparative Example 2 | K1 | Z34 (16) | J | N-1 | W-1 | 21.0 | C |
| Comparative Example 3 | K1 | Z34 (16) | J | N-1 | W-1 | 17.5 | C |
| Comparative Example 4 | F1 | Z34 (16) | J | N-1 | W-1 | 22.5 | C |

The ratio described in Table 6 means a ratio by weight.
The abbreviations shown in Table 6 are explained below.

Nitrogen-containing basic compound:
N-1: 1,5-Diazabicyclo[4.3.0]-5-nonene
N-2: 1,8-Diazabicyclo[5.4.0]-7-undecene
N-3: 4-Dimethylaminopyridine
N-4: Triphenylimidazole
N-5: Diisopropylaniline
N-6: Tributylamine
N-7: Trioctylamine
N-8: Tridecylamine
N-9: N,N-Bis(hydroxyethyl)aniline
N-10: 2,2,6,6,-Tetramethyl-4-hydroxypiperidine
N-11: Triphenylammonium nonaflate
N-12: Triphenylammonium triflate Surfactant:
W-1: Megafac F176 (manufactured by Dainippon Ink and Chemicals, Inc.) (fluorine-based)
W-2: Megafac R08 (manufactured by Dainippon Ink and Chemicals, Inc.) (fluorine-based and silicon-based)
W-3: Polysiloxane Polymer KP-341 (manufactured by Shin-Etsu Chemical Co., Ltd.)
W-4: Troysol S-366 (manufactured by Troy Chemical Co., Ltd.)
W-5: Megafac F-475 (manufactured by Dainippon Ink and Chemicals, Inc.)
W-6: Copolymer of acrylate having a $C_6F_{13}$ group, (poly (oxypropylene)) acrylate and (poly(oxyethylene)) methacrylate
W-7: Copolymer of acrylate having a $C_6F_{13}$ group and (poly (ethyleneoxy-propyleneoxy-ethyleneoxy block))acrylate AS the comparative compound relevant to Compound (C) according to the invention, the following compound was used.

Comparative Compound J

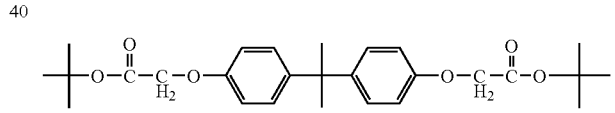

It is apparent from the results shown in Table 6 that the positive resist composition of the present invention is excellent in the line edge roughness and is improved in the occurrence of scum.

According to the present invention, a positive resist composition, which is excellent in the line edge roughness and is improved in the occurrence of scum, can be provided.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a compound that generates an acid upon irradiation of an actinic ray or radiation, (B) a resin that is insoluble or hardly soluble in an alkali developing solution but becomes soluble in the alkali developing solution by the action of an acid, and (C) a nonphenolic, non-polymeric compound having at least one group that is decomposed with an acid to generate a carboxylic acid and at least three groups selected from the group consisting of a hydroxy group and a substituted hydroxy group.

2. The positive resist composition as claimed in claim 1, wherein the resin (B) is a resin that is insoluble or hardly soluble in an alkali developing solution but becomes soluble in the alkali developing solution by the action of an acid and has at least one phenolic hydroxy group structure.

3. The positive resist composition as claimed in claim 1, wherein the resin (B) is a resin that is insoluble or hardly soluble in an alkali developing solution but becomes soluble in the alkali developing solution by the action of an acid and has a monocyclic or polycyclic alicyclic hydrocarbon structure.

4. The positive resist composition as claimed in claim 1, wherein the resin (B) is a resin that is insoluble or hardly soluble in an alkali developing solution but becomes soluble in the alkali developing solution by the action of an acid and has a structure substituted with a fluorine atom in the main chain and/or side chain of a polymer skeleton.

5. The positive resist composition as claimed in claim 1, wherein the positive resist composition further comprises (D) a fluorine-based and/or silicon-based surfactant.

6. The positive resist composition as claimed in claim 1, wherein the positive resist composition further comprises (E) a mixed solvent comprising a hydroxy group-containing solvent and a solvent free from a hydroxy group.

7. The positive resist composition as claimed in claim 1, wherein the compound (C) has as a skeleton a cyclic saccharide derivative or a linear saccharide derivative.

8. The positive resist composition as claimed in claim 1, wherein the compound (C) has at least one cyclic ketal structure or cyclic acetal structure.

* * * * *